(12) United States Patent
Teshima et al.

(10) Patent No.: US 7,474,986 B2
(45) Date of Patent: Jan. 6, 2009

(54) DEFECT ANALYZER

(75) Inventors: Janet Teshima, Hillsboro, OR (US);
Daniel E. Partin, Hillsboro, OR (US);
James E. Hudson, Portland, OR (US)

(73) Assignee: FEI Company, Hillsboro, OR (US)

(*) Notice: Subject to any disclaimer, the term of this patent is extended or adjusted under 35 U.S.C. 154(b) by 44 days.

(21) Appl. No.: 11/497,565

(22) Filed: Aug. 1, 2006

(65) Prior Publication Data

US 2007/0067131 A1 Mar. 22, 2007

Related U.S. Application Data

(63) Continuation of application No. 10/706,304, filed on Nov. 12, 2003, now Pat. No. 7,103,505.

(60) Provisional application No. 60/425,407, filed on Nov. 12, 2002.

(51) Int. Cl.
*G01R 27/28* (2006.01)

(52) U.S. Cl. ................... 702/183; 702/117; 702/118; 702/185; 700/121; 714/46

(58) Field of Classification Search ............ 702/183, 702/117, 118, 185; 700/121; 714/46
See application file for complete search history.

(56) References Cited

U.S. PATENT DOCUMENTS

| | | | | |
|---|---|---|---|---|
| 5,592,099 A | * | 1/1997 | Kuribara et al. | 324/751 |
| 5,592,100 A | * | 1/1997 | Shida et al. | 324/751 |
| 5,640,539 A | * | 6/1997 | Goishi et al. | 716/21 |
| 5,656,811 A | | 8/1997 | Itoh et al. | |
| 5,673,028 A | * | 9/1997 | Levy | 340/635 |
| 5,757,198 A | * | 5/1998 | Shida et al. | 324/751 |
| 5,852,793 A | * | 12/1998 | Board et al. | 702/56 |
| 6,337,533 B1 | * | 1/2002 | Hanashi et al. | 313/141 |
| 6,445,199 B1 | * | 9/2002 | Satya et al. | 324/753 |
| 6,466,895 B1 | * | 10/2002 | Harvey et al. | 702/181 |

(Continued)

FOREIGN PATENT DOCUMENTS

JP 3383574 12/2002

(Continued)

*Primary Examiner*—Carol S Tsai
(74) *Attorney, Agent, or Firm*—Scheinberg & Griner, L.L.P.; Michael O. Scheinberg; David Griner

(57) ABSTRACT

The present invention provides methods, devices, and systems for analyzing defects in an object such as a semiconductor wafer. In one embodiment, it provides a method of characterizing defects in semiconductor wafers during fabrication in a semiconductor fabrication facility. This method comprises the following actions. The semiconductor wafers are inspected to locate defects. Locations corresponding to the located defects are then stored in a defect file. A dual charged-particle beam system is automatically navigated to the vicinity defect location using information from the defect file. The defect is automatically identified and a charged particle beam image of the defect is then obtained. The charged particle beam image is then analyzed to characterize the defect. A recipe is then determined for further analysis of the defect. The recipe is then automatically executed to cut a portion of the defect using a charged particle beam. The position of the cut is based upon the analysis of the charged particle beam image. Ultimately, a surface exposed by the charged particle beam cut is imaged to obtain additional information about the defect.

18 Claims, 68 Drawing Sheets

U.S. PATENT DOCUMENTS

| | | | |
|---|---|---|---|
| 6,539,106 B1 * | 3/2003 | Gallarda et al. | 382/149 |
| 6,635,872 B2 * | 10/2003 | Davidson | 250/307 |
| 6,670,610 B2 * | 12/2003 | Shemesh et al. | 250/309 |
| 6,799,130 B2 * | 9/2004 | Okabe et al. | 702/82 |
| 6,864,955 B2 * | 3/2005 | Nishi et al. | 355/53 |
| 6,867,606 B2 * | 3/2005 | Pinto et al. | 324/751 |
| 6,882,745 B2 * | 4/2005 | Brankner et al. | 382/144 |
| 2002/0130262 A1 * | 9/2002 | Nakasuji et al. | 250/311 |
| 2002/0153916 A1 | 10/2002 | Lee et al. | |
| 2003/0028343 A1 * | 2/2003 | Velichko et al. | 702/122 |
| 2003/0102436 A1 | 6/2003 | Benas-Sayag et al. | |
| 2003/0205326 A1 | 11/2003 | Miya et al. | |
| 2003/0236586 A1 | 12/2003 | Tomimatsu et al. | |
| 2005/0033538 A1 * | 2/2005 | Okabe et al. | 702/82 |

FOREIGN PATENT DOCUMENTS

| | | |
|---|---|---|
| JP | 3677968 | 5/2005 |
| JP | 3709886 | 8/2005 |

* cited by examiner

| Item | Description |
|---|---|
| Job Builder: | |
| Build | Initiates building of new job |
| Save | Save the job information. |
| Save As | Functions conventionally |
| Open | Functions conventionally |
| Close | Functions conventionally |
| Job Information | Functions conventionally |
| Site Tools: | |
| Add Tool to Process | Inserts selected tool into process |
| Remove Tool from Process | removes selected tool from process |
| Available Tools | Displays tools available for processes |
| Tool Description | Brief description of tool |
| Site Process | Displays process (recipe) as it is being constructed by user |

*FIG. 3B*

| Interface Items | Description |
|---|---|
| Filter Name | Identifies the filter. |
| Filter Criteria | These check boxes and list boxes select the filter criteria |
| New | Creates a new filter file. |
| Open | Opens an existing filter. |
| Save | Saves the edited filter definition. It is available only is allowed by configuration. |
| Save As | Saves the edited filter definition to a new file name. It is available only if allowed by configuration. |
| Random Subset | Specifies the maximum number of random sites passing the filter. |
| Test Results | Tests and reports the effect of site filter changes. |
| Temporarily Disable Filter | Temporarily disables the active site filter. |
| Graph | Displays a histogram of the defect sites. |
| Class List | Opens the Edit Class List dialog box. |
| Undo | Undoes the last change. You cannot undo changes already saved to file. |
| Undo All+ | Undoes all changes made since dialog box opened. You cannot undo changes already saved to file. |
| Close | Close the dialog box. Applies the defined filter to the current review session but does not save the filter to file. |

*FIG. 3G*

| Criterion | Value Type | Description |
|---|---|---|
| Classification | Integer | Classification code assigned to the site |
| Size X (μm) | Real | X dimension of the site in microns |
| Size Y (μm) | Real | Y dimension of the site in microns |
| Die Column+n | Integer | Die column of the die containing the site |
| Die Row | Integer | Die row of the die containing the site |
| SLI | Integer | Scattered light intensity reported for the site |
| Visited | Yes/No | Site has or has not been visited during the review session |
| Modified | Yes/No | Site has or has not been classified or relocated during the review session |
| ADE Channel | Light/Dark | Site has or has not been visited during the review session |
| SP1 Channel | n/a | Site has selected attributes. This filter is active if the defect format is T7x00 and the defect file has more than one channel. |
| Has Image | Yes/No | Site has or does not have image data associated with it |

*FIG. 3H*

| Relational Operators | Meaning |
|---|---|
| = | Equal to |
| != | Not equal to |
| < | Less than |
| <= | Less than or equal to |
| > | Greater than |
| >= | Greater than or equal to |

*FIG. 3I*

```
┌─Random Subset────────────────┐
│                              │
│  ☑ Enable Random Subset      │
│                              │
│  ┌──┐  ┌─────────┬─┐         │
│  │50│  │Percent  │▽│         │
│  └──┘  ├─────────┴─┤         │
│        │Percent    │         │
│        ├───────────┤         │
│        │Maximum    │         │
│        └───────────┘         │
└──────────────────────────────┘
```

*FIG. 3J*

```
┌─Test Results──────────────┐
│                           │
│      ┌─────────┐          │
│      │Apply Now│◄──       │
│      └─────────┘          │
│                           │
│      Total Sites    68    │
│      Filtered Out    0    │
│      Remaining      68    │
└───────────────────────────┘
```

*FIG. 3K*

```
┌──────────────────────────────────┐
│  Defect File      fei2.001       │
│  Wafer ID         @05            │
│  Lot ID           K54148350      │
│  Process ID       814FC          │
│                                  │
│  68 Total Sites, 68 Passing Filter│
└──────────────────────────────────┘
```

*FIG. 3L*

☑ Temporarily Disable Filter

*FIG. 3M*

| Defect # | Size X | Size Y | Classification Recipe Name | Die Row |
|---|---|---|---|---|
|  |  |  |  |  |
|  |  |  |  |  |

*FIG. 3N*

| Control | Descriptions | Behavior |
|---|---|---|
| Product<br>Product<br>    Step<br>    Step<br>Product<br>Product<br>Product<br>    Step<br>    Step<br>Product<br>Product<br>Product<br>    Step<br>    Step<br>Product | Product/Step Tree: This is the interface through which specific Steps are created, edited, and deleted. | Sorting: Alphabetized by Product, then by Step.<br>Node Behavior: Expandable and Collapsible through a standard interface. Persist Expansions for the life of the dialogue.<br>Scroll Bars: Scrolling should be allowed. |
| [New Product] | New Product Button: This is used to add a New Product to the Database. | Click: This should launch a "New Product Wizard" which is described below. |
| [New Stop] | New Step Button: This is used to add a New Step to whichever product is selected in the Product/Step Tree View (above). | Enable/Disable: Enable if a Product has been selected. Disabled otherwise.<br>Click: This should launch the "New Step Wizard" which is described below. |
| [Delete] | Delete Button: This is used to remove products or steps from the database | Click: This should lauch a standard two-button dialogue with the message. "Permanently Delete [Product/Step] Information?". Then buttons are "Cancel" and "OK". |

*FIG. 3Q*

| Control | Descriptions | Behavior |
|---|---|---|
| Slice and View [list box] | Site Sequence List Tree View: This displays a list of Site Sequences which can be expanded to show the names of the tools. | Scrolling: Should be scrollable.<br>Node Behavior: Expanded nodes should stay expanded.<br>Alphabetized.<br>Click: This should highlight the site sequence.<br>Default selection: The first site sequence in the list should be highlighted by default.<br>Double-Click: This should expand the node to display the list of tools within the site sequence.<br>Mouse Over: This should display the Site Sequence Name followed by the text description of the site sequence (if any). |
| Edit | Edit Button: This loads the site sequence into the Recipe Builder page. | (Optionally) the page display should be switched to the Recipe Builder<br>Click: Load the selected site sequence into the recipe builder page |
| View Info | View Info Button: THIS BUTTON HAS BEEN REMOVED. | NOT APPLICABLE. (the tree view functionality eliminates the previously envisioned function of this button). |
| Delete | Delete Button: This button removes the site sequence from the database. | Click: This removes the site sequence from the database as far as the user is concerned. The actual implementation should include an "Is Deleted" flag to indicate that the site sequence should not be displayed. This will prevent previously configured process from being invalidated. |
| Five Random [list box] | Site Filter Text Box: This shows a list of all Site Filters available for the selected Product/Step in the Product/Step Tree View control (above). | Alphabetize.<br>Click: Highlight the site filter.<br>Default Selection: The first of the list should be highlighted by default.. |
| Edit | Edit Button: This is used to edit the highlighted site filter. | Click: Launch the site filter dialog for the highlighted site filter. |

*FIG. 3T*

| Control | Descriptions | Behavior |
|---|---|---|
|  | Alignment Data Tree View. This is a tree view showing the Alignment data in the following order. | Node coloring: The nodes should be colored red ir they or a child is untrained.<br><br>Data Structure: A preliminary data structure for this tree is shown and described in the following section. |
| Test | Test Button. If appropriate, this should test the selected alignment on the wafer loaded into the system. | Enable/Disable: This is dependent on the highlight node of the Alignment Data Tree View. For certain alignments test functionality will not be appropriate and should not, therefore, be applied.<br><br>Click: Run the alignment for the highlighted node and all child nodes in the Alignment Data Tree View. |
| Train | Train Button. If appropriate, this should initiate the portion of the Alignment Training Wizard for the selected node. | Enable/Disable: For some nodes this control may not make sense or may require functionality not provided by the software. In these situations the control should be either disabled or handled through a clear, concise error message. For example, training the zero degree alignments for a wafer loaded at 52 degrees might prompt the user to tilt to zero degrees and try the alignment again.<br><br>Click: Run the portion(s) of the alignment training wizard for the highlighted node and child nodes. Note that there may be unanticipated exceptions that need to be dealt with (such as no wafer is loaded) that will require increased robustness in handling of errors and exceptions. These will be ferreted out at a later time. |
| Delete | Delete Button: This permanently deletes alignment data from the database. | Click: This should launch a standard two button dialogue with the message "This will |

*FIG. 3V*

| Control | Descriptions | Behavior |
|---|---|---|
| HIDE RECIPE EXPLORER | | |
| Recipes | Recipe Tab. This should have the following fields.<br>○ Product<br>○ Step<br>○ Recipe Name<br>○ Creation Date | |
| Site Filters | Site Filter Tab. This should have the fields listed below. As an added feature, there could be a "view filter button" to allow a quick look at the data through a new window<br>○ Product<br>○ Step<br>○ Recipe Name<br>○ Creation Date | |
| Site Maps | Site Map Tab. This should have the fields listed below. As an added feature, there could be a "view filter button" to allow a quick look at the data in a new window (similar to above).<br>○ Product<br>○ Step<br>○ Recipe Name<br>○ Creation Date | |
| Alignment Data | Site Map Tab. This is a complex control, but the should have the fields listed below. Alignment Node should be path which indicates where the alignment data exists on a tree structure identical to that described above.<br>○ Product | |

*FIG. 3X*

- ◇ Alignment Name #1
  - ○ Wafer Alignment
    - Product Offset
    - Zero Degrees
      - Alignment Dies
      - Top-Down Electron Beam Image
      - Ion Beam Image
    - Fifty-Two Degrees
      - Alignment Dies
      - Ion Beam Image
      - Electron Beam Image
  - ○ System Calibrations
    - Height Probe Offset
      - Zero Degrees
      - Fifty-Two Degrees
- ◇ Alignment Name #2

*FIG. 3Y*

| Item | Description |
|---|---|
| Run | Loads the wafer and runs the selected job. |
| Pause | Pause job execution |
| Abort | Terminate job execution |
| Description | Comment text describing job if included in job |
| Site Process | Displays job process tools |

*FIG. 4B*

| Job Wafer Data Input |
|---|

| Job Wafer Data Input |
|---|

Operator ID: W. Bee ...

Defect File: fei.rff ...

Lot ID: 060265 ...

Wafer ID: 01 ...

Job File: TestJob.dar ...

Product: Train Align ...

☐ Unload Wafer when Job Complete

| Run | Cancel |

*FIG. 4D*

| Interface Items | Description |
| --- | --- |
| Operator ID | Required field where the user enters name. |
| Detect File | Defect file for the job. User opens an existing defect file. Clicking the select button opens the Select Defect dialog box. |
| Lot ID | Maximum of 15 characters. Value is read in from defect file or job file, selected from dialog box, or entered by the operator. |
| Wafer ID | Maximum of 5 characters. Value is read in from defect file or job file, selected from dialog box, or entered by the operator. |
| Job File | Selects a recipe or job file. The recipe contains no wafer information. the job file contains wafer information. They have different extensions, .daj and .dar. |
| Product | Identifies the alignment wizard for the wafer. If TRAIN ALIGN is selected, when the user clicks RUN, the Alignment Training wizard starts. |
| Cass A/B | Shows the slots that are occupied. |
| Inventory | Inventories the cassettes. |
| FlexiLock | Shows if wafer is in the cassette. |
| Unload wafer when job complete | Provides automated wafer unloading when a job is complete. |
| RUN | Dialog box closes and the Information dialog box displays. When user clicks OK in information dialog box the sequencer runs the job. This button is not active until information for at least one wafer is entered. |
| Cancel | Dialog box closes without saving the values. In job builder, the dialog box closes and the Add Tool interface displays. In sequencer, a warming box displays so that the user does not unintentional lose information. Then, the Sequencer page becomes active again. |
| Select button | Open dialog where predefined files, wafer, etc., can be selected. |

┌─ Defect File Contents ─────────────────────────────┐
│  | Wafer ID | Inspection | Site Count |            │
└────────────────────────────────────────────────────┘

*FIG. 4J*

| Column Header | Description |
|---|---|
| Wafer ID | The wafer ID as listed in the defect file. |
| Inspection | The date and time site list was created during inspection. |
| Wafer ID | The wafer ID as listed in the defect file. |

| Item | Description |
|---|---|
| Realign | |
| Beam | Specifies the beam to be used in the alignment. |
| Type | Specifies measurement or the type of alignment.<br>BEAM SHIFT specifies an alignment using beam shift<br>MEASURE instructs the system to measure the X, Y distance between the center of the images and the center of the fiducial mark, in pixels and microns. The result is written to the user-specified log file.<br>STAGE MOVE specifies an alignment using a stage move. |
| Assist Timeout | Number of seconds a dialog box remains on screen, prompting for user intervention. If this value is 0, no dialog box appears. |
| Display Match Dialog | Displays the Image Match dialog box (see Image Match). |
| Suppress Errors | When this option is selected, the system ignores image recognition errors. If ENABLE LOGGING is selected, image recognition errors are written to the user-specified log file. |
| Offsets: | |
| Field of View | Specifies a proportional shift of the field of view.<br>When this option is selected, the system shifts the field of view by the proportion of the field of view specified in X and Y.<br>When this option is not selected, the system shifts the field of view by the distance in microns specified in X and Y. |
| X,Y | Specify the distance by which the system shifts the field of view during alignment.<br>When FIELD OF VIEW is selected, the values specified in X and Y denote a portion of the field of view-e.g., a value of 0.1 equals 10% of the field of view. In one embodiment, acceptable values are 0-1.<br>When FIELD OF VIEW is not selected, the system shifts the field of view by the distance in microns specified in X and Y. |
| Logging: | |
| Enable Logging | When this option is selected and a log file is specified, the system logs the following information:<br>Name and path of the image file used for realignment<br>X location of the fiducial in pixels and microns<br>Y location of the fiducial in pixels and microns<br>When MEASURE is selected for TYPE, the X, Y distance between the center of the image and the center of the fiducial mark, in pixels and microns.<br>If the fiducial is not found, the system writes "Fail" to the log file. |
| Log File | Name and path of the specified log file. Use the adjacent Browse button to navigate to the desired directory. |

| Item | Description |
|---|---|
| Description | |
| Material File | Displays a dropdown menu for selecting a material file (.mtr). The list contains an entry for every material file available on the system. |
| Width | Width of the specified cross section (X), as a percentage of the field of view. |
| Height | Height of the specified cross section (Y), as a percentage of the field of view. The protective coat will be centered about the location of the cross-section target line. |
| Depth | Depth of the specified cross section, in microns. |
| Bulk Mill: | |
| Number of Cuts | Number of cuts to be made in the bulk mill. |
| Cross Section: | As in Deposition group, above. |
| Maximum Total Time | Sets the total pattern time for the bulk mill and cross-section patterning Defect Analyzer uses this value to select the apertures used for bulk milling and cross-sectioning, based on the specified pattern area, depth, and material file. |
| Y Offset | Displays a horizontal yellow line in the image quadrant, marking the desired upper boundary of the cross section. Click anywhere in the field of view to set the location of this yellow line, then click OK in the accompanying dialog box. For further information, see "Setting Y Offset" on page 4-14. |

*FIG. 9B*

Fidicial Tool Configuration

| | Low | Med | High |
|---|---|---|---|
| Fast | 0.028 | 0.091 | 0.362 |
| - | 0.045 | 0.181 | 0.724 |
| - | 0.136 | 0.543 | 2.173 |
| Slow | 0.396 | 1.584 | 6.337 |

Scan Speed Matrix

Bitmap: [ ] [...]

Integer [1 ▼]

Size (%FOV)
Defect: [40.000000]  Fiducial: [10.000000]

Size (%FOV)
X: [30.000000]  Y: [0.000000]

GIS: [None ▼]  Depth: [1.000000]

[ Configure EBeam Realign ]  [ Configure IBeam Realign ]
[ Config EBeam BMP Realign ]  [ Config IBeam BMP Realign ]
[ Apply ]  [ Cancel ]

*FIG. 10A*

| Item | Description |
|---|---|
| Scan speed matrix | Sets the frame time and resolution used in ion beam and electron beam images collected after milling of the fiducial mark. These images are used for subsequent image recognition. |
| Integrate | Sets the number of frames to be integrated to allow accumulative noise reduction. |
| Bitmap | Defect Analyzer converts the specified bitmap to a stream file, based on the grayscale levels of individual pixels in the bitmap. Pixels above the median brightness in the grayscale are omitted from the stream file: pixels below the median brightness are converted to points. |
| Size (%FOV) | |
| Defect | Proportion of the field of view to be occupied by the defect. |
| Fiducial | Size of the fiducial mark, as a percentage of the field of view. |
| Fiducial Offset From Center (%FOV) | Sets the offset between the center of the image and the center of the fiducial mark, in X and Y, as a percentage of the field of view. |
| GIS | Selects the GIS to be used in milling the fiducial. The List contains an entry for every beam chemistry available on the system. |
| Depth | Depth of the fiducial mark, in microns. |
| Configure EBeam Realign Configure IBeam Realign Configure IBeam BMP Realign, Configure EBeam BMP Realign | CONFIGURE EBEAM BMP REALIGN and CONFIGURE IBEAM BMP REALIGN configure the image recognition software for initial matches between a fiducial mark and the bitmap used as the milling pattern. |

*FIG. 10B*

| Electron Beam Realign Configuration | | | | | |
|---|---|---|---|---|---|
| Train Params | Train Region & Origin | Run Params | Search Region | Graphics | Results |

Algorithm: Best Trained

Approx no. to find: 1
Accept threshold: 0.5
☐ Timeout: 50000 ms

| | Angle | Nominal | | Low | High | Overlap |
|---|---|---|---|---|---|---|
| Angle | | 0 deg | ◀ | -45 deg | 45 deg | 360 deg |
| Scale | | 1 | ◀ | 0.8 | 1.2 | 1.4 |
| ScaleX | | 1 ms | ◀ | 0.0 | 1.2 | 1.4 |
| ScaleY | | 1 ms | ◀ | 0.8 | 1.2 | 1.4 |

☑ Use Pattern Grain Limits

Compare: 4
fine: 1

Contrast thresh: 10
XY overlap: 0.0

*No train image*

[ OK ]  [ Cancel ]

| Item | Description |
|---|---|
| Beam | Specifies the beam to be used in the alignment. |
| Realign Using Beam Shift | Specifies the type of alignment to be made.<br>YES specifies an alignment made using beam shift.<br>NO specifies an alignment made using a stage move.<br>For best results, realign the electron beam with stage moves and the ion beam with beam shift. |
| Enable Logging | When this option is selected, the system logs the following information:<br>Name and path of the image file used for realignment<br>X location of the fiducial in pixels and microns<br>Y location of the fiducial in pixels and microns<br>If the fiducial is not found, the system writes "Fail" to the log file. |
| Display Match Dialog | Displays the Image Match dialogue (see "Image Match" on page 4-10) |
| Assist Timeout(s) | Number of seconds before a dialog box appears, prompting for user intervention. If this value is 0, no dialog box appears. |
| FOV Offset | Specifies a proportional shift of the field of view.<br>When this option is selected, the system shifts the field of view by the proportion of the field of view specified in X and Y.<br>When this portion is not selected, the system shifts the field of view by the distance in microns specified in X and Y. |
| X Offset, Y Offset | Specify the distance by which the system shifts the field of view during alignment.<br>When FIELD OF VIEW is selected, the values specified in X and Y denote a portion of the field of view-e.g., a value of 0.1 equals 10% of the field of view. Acceptable values are 0-1.<br>When FIELD OF VIEW is not selected, the system shifts the field of view by the distance in microns specified in X and Y. |

*FIG. 11B*

| Item | Description |
|---|---|
| Auto CB | Performs automatic contrast and brightness |
| Spot Mode | Selects Spot as the scanning mode. |
| Voltage | Voltage to be used to acquire spectrum. |

| Interface items | Description |
|---|---|
| Resume | Associates the spectrum with the current site and continues automated processing. |
| Voltage | Does not put anything into the database and gives you the option to fail the site. |

| Get System Settings | Select All |
|---|---|

Set Settings Tool Identifier
- ● A  ○ B  ○ C
- ○ D  ○ E  ○ F

Stage
- □ X Y   □ Z
- □ R    □ T

Beam Settings
- □ Primary Beam    □ Detector    □ Scan Rotation

Electron Beam
- □ Focus
- □ Stig
- □ kV
- □ Spot
- □ Electron Beam Shift
- □ UHR/Search
- □ Magnification
- □ Contrast/Brightness

Ion Beam
- □ Focus
- □ Stig
- □ Ion Aperature
- □ Ion Beam Shift
- □ Magnification
- □ Contrast/Brightness

[Resume]  [Cancel]

*FIG. 13A*

| Item | Description |
|---|---|
| Select All/De-Select All | Selects or deselects every option in the Stage, Beam Settings, Electron Beam, and Ion Beam groups. |
| Set Settings Tool Identifier | Identifies a set of stored settings |
| Stage | Contains options for recording the positions of the five independent axes. |
| Beam Settings | Contains options for recording the following current beam settings. |
| Primary Beam | |
| Detector | |
| Scan Rotation | |
| Electron Beam | Contains options for recording the current electron beam parameters. Focus, Stigmation, Accelerating voltage (kV), Spot size, Beam shift, Mode (UHR or Search), Magnification, Contrast/Brightness |
| Ion Beam | Contains options for recording the current electron beam parameters. Focus, Stigmation, Apperatus, Beam shift, Magnification, Contrast/Brightness |

*FIG. 13B*

Grab Image Settings

⊙ E-Beam   ○ I-Beam

Detector
Voltage (kV) [1.0 ▽]   Spot Size [1.0 ▽]

Ion Settings
Aperature [10 ▽]

Detector
- ⊙ TLD-S
- ○ TLD-B
- ○ TLD-C
- ○ TLD-D
- ○ CDM-E
- ○ CEM-I

Mode
- ⊙ UHR
- ○ Search

Integrate
[1]

Resolution

|      | Low   | Med   | High  |
|------|-------|-------|-------|
| Fast | 0.028 | 0.091 | 0.362 |
| -    | 0.045 | 0.181 | 0.724 |
| -    | 0.136 | 0.543 | 2.173 |
| Slow | 0.396 | 1.584 | 6.337 |

Integer [1 ▽]

Magnification
- ○ FOV
- ⊙ Fixed [2500X ▽]

[Apply]   [Cancel]

*FIG. 13C*

| Item | Description |
|---|---|
| E-Beam | Use electron beam to grab an image. |
| I-Beam | Use ion beam to grab an image. |
| Electron Settings: | |
| Voltage (kV) | Active only for the electron beam. Specify the accelerating voltage. |
| Spot Size | Active only for the electron beam. Specify the spot size. |
| Detector | Select the detector used to collect the image. Available selections are dependent on the selected mode and beam. Refer to the xP DualBeam Workstation User's Guide (PN 25417) for information about detector types. |
| Mode | Active only for the electron beam. Select Search mode for low magnifications and UHR mode for higher magnifications. |
| Image: | |
| ACB | Automatically adjusts contrast and brightness using the stored values for comparison. |
| AutoFocus | Automatically corrects the focus, based on the system sharpness criteria. |
| AutoStig | Automatically corrects sigmatism, based on the system sharpness criteria. Available for the electron beam. |
| Data Bar | Save the databar as seen into the image. |
| Magnification | Specifies the magnification used to grab the image. Select either the field-of-view(determined by the Fiducial tool) or choose from a range of preset magnifications. |
| Ion Aperture | Active only for the ion beam. Sets the ion aperture. |
| Resolution | Selects the scan rate and resolution for grabbing a single frame. The values are those available for Grab Image. |
| Integrate | Specifies the number of collected images to be summed to generate the final image. |

*FIG. 13D*

Pattern Settings

☐ Use FOV%

Dimensions
X [0.00] μm
Y [0.00] μm
Z [0.00] μm

Center Position
X: [0.00] μm
Y: [0.00] μm

Overlap
[0.00] %

Dwell
[0.00] μs

Time
[00:00:00] μs

☐ Always Realign

Primary Beam
⦿ I-Beam   ○ E-Beam

Material File
[None ▾]

Material File
[CleaningCrossSection ▾]

Rotation
[0.00] Degrees

[ Show Pattern ]   [ Apply ]

*FIG. 14A*

| Item | Description |
|---|---|
| Use FOV% | Converts X and Y coordinates in Dimensions and Center Position to a percentage of the field of view When this option is selected X and Y coordinates in Dimensions and Center Position denote a percentage of the field of view. When this option is not selected, X and Y coordinates in Dimensions and Center Position are in microns. |
| Dimensions | Sets the X, Y, and Z pattern dimensions. When Pattern Type is set to Circle, X and Y are replaced by Rin (inner radius) and Rout (outer radius) |
| Center Position | Shows the stage X and Y coordinates of the center of the pattern relative to the center of the field of view. |
| Overlap | Beam overlap. Not available when a material file is selected. |
| Dwell | Dwell time per pixel. Not available when a material file is selected. |
| Time | Time for milling displayed as either hh:mm:ss or ss:ttt. |
| Always Realign | When this portion is selected, the system always realigns to the fiducial mark before milling the specified pattern. When this option is selected, the system only realigns to the fiducial mark when an aperture has changed or a GIS needle has been inserted. |
| Show Pattern/Remove Pattern | Displays the currently defined pattern. When a pattern is already on screen, removes that pattern |
| Primary Beam | Select I-Beam or E-BEAM as the beam that will be used for patterning |
| Material File | Select the material file for your application. Refer to the xP DualBeam Workstation User's Guide (PN 25417) for information about material files. |
| Pattern Type | Defines the pattern. Refer to the xP DualBeam Workstation User's Guide (PN 25417) for information about available patterns. |
| Rotation | Rotates the pattern about its center to the specified angle. |

*FIG. 14B*

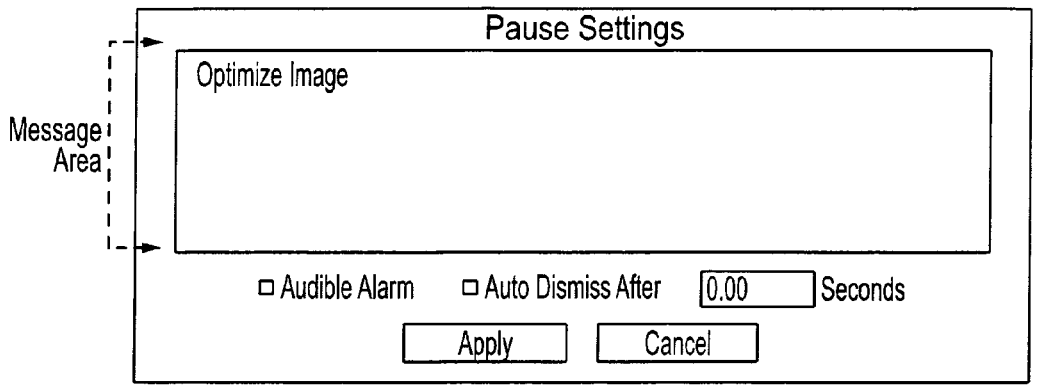

*FIG. 15A*

| Item | Description |
|---|---|
| Message area | Defines actions the user should take before continuing processing. |
| Audible alarm | Cause an alarm to sound when the Pause dialog box displays during a job. |
| Auto dismiss | Selects if the Pause dialog box should time out. Otherwise, the Pause dialog box must be manually dismissed.<br>The number of seconds specifies the fixed amount of time Pause dialog box is displayed during a job. |

*FIG. 15B*

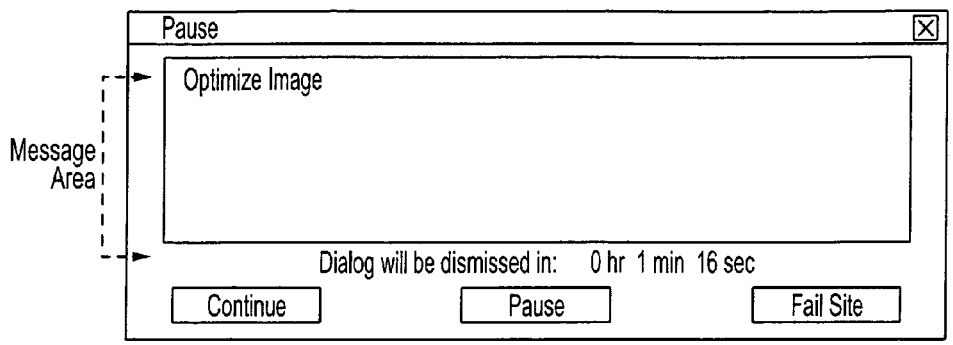

FIG. 15C

| Item | Description |
|---|---|
| Message area | Defines action operator should take before proceeding with the process. The text cannot be modified during runtime. |
| Timeout clock | The time the dialog box will be displayed during a job. If the operator does not interact with the tool, the Pause dialog box times out as specified and the process automatically continues. |
| Continue | Click to continue processing the current site. The site list grid will show that the site passed. |
| Pause/Resume | Stop/restarts the timer. (This button is inactive if AUTO DISMISS was not selected during configuration.) The process waits for the operator to click either CONTINUE or FAIL. |
| Fail Site | Click to fail the current site. Further processing at the site is aborted. Processing starts at the next site. The site list grid will show that the site failed. If the entire job is to be aborted, the operator can click ABORT in the Run Tool Sequence dialog box |

FIG. 15D

Get System Settings

Get Settings Identifier
- ⦿ A   ○ B   ○ C
- ○ D   ○ E   ○ F

[Resume]  [Cancel]

Slice and View Settings

Slice
- ○ Size of Slices [107.9] μm
  - ☐ Limit max# of slices to [50]
- ○ Number of Slices [1]
- Depth [0.50] μm   ☐ Hair Cut
- Material File [None ▽]
- Max Process Time [120.0] sec

Metal Deposition
- ☐ Add Protective Coating
- Material File [None ▽]
- Pattern Width [0.50] % of Defect
- Pattern Height [0.50] μm

[Apply]  [Cancel]

Image

|      | Low | Med | High |
|------|-----|-----|------|
| Fast | 0.028 | 0.091 | 0.362 |
| -    | 0.045 | 0.181 | 0.724 |
| -    | 0.136 | 0.543 | 2.173 |
| Slow | 0.396 | 1.584 | 6.337 |

Integrate [1 ▽]

☐ Data Bar   ☐ Track Image
☐ ACB       ☐ Auto Focus

Field of View: [125.0] % of X-section

Electron HV and Spot Size
[1.0 ▽] kV   Spot [1 ▽]

Mode
- ○ UHR
- ⦿ Search

Detector
- ⦿ TLD-S   ○ TLD-D
- ○ TLD-B   ○ CDM-E
- ○ TLD-C   ○ CEM-I

*FIG. 17A*

| Item | Description |
|---|---|
| Slice: | User selects either SIZE OF SLICES or NUMBER OF SLICES. |
| Size of Slices | Specifies the slice size in microns.<br>The number of slices to be milled will be calculated by dividing the size of the defect (determined by fiducial tool) by the size of the slices. |
| Limit max # of slices to | The Maximum number of slices to be made in the Slice and View area. |
| Number of Slices | Specifies the number of slices to be milled. The height of each slice is determined by the software dividing the value specified for height (y) by the number of slices. Where is height from?<br>A maximum of 100 individual patterns can be displayed. If the tool calls for more than 100 slices, an outline indicating the overall area to be sliced is displayed. |
| Depth | Specifies the pattern depth in microns. |
| Half Cut | Mills only half way through the defect selected (up to the center cross). |
| Material File | Displays a dropdown list of selecting a material file (.mtr). The list contains an entry for every material file available on the system. The default material file is si.mtr. |
| Max Process Time | The Maximum time process may occur |
| Metal Deposition: | |
| Add Protective Costing | If this option is selected, a protective layer will be centered about the Slice and View area. The scale will be set in the job builder configuration and based upon the size of the slice and view area. If protective coating is not selected, the fields associated with it should be inactive. |
| Material File | Displays a dropdown list for selecting a material file (.mtr). The list contains an entry for every material file available on the system. the default material file is either pt_high mtr. |
| Pattern Width | Specifies the pattern width, as a percentage of the defect size. |
| Pattern Height | Specifies the pattern height, in microns. |
| Image: | |
| Scan Speed Matrix | Sets the frame time and resolution used for the electron beam images of the cross-section face. These values correspond generally to the faster continuous scan rates available in xP. Refer to the xP DualBeam Workstation User's Guide for information about the available resolutions. |
| Integrate | Number of frames to integrate for accumulative noise reductions. |
| Data Bar | Includes the databar configured in xP in the image. |
| ACB | Selects automatically adjusting contrast and brightness, using the stored values for comparison. |
| Track Image | Adjusts the electron beam shaft to keep the face of the cross section centered in the field of view. |
| Auto Focus | Initiates automated focus before the system begins capturing electron beam images. |
| Field of View | Specifies the field of view used for electron beam images of the cross-section face, as a percentage of the cross-section. |
| Electron HV and Spotsize: | kV specifies the electron beam accelerating voltage, Select from the range of voltages available for the currently selected imaging mode. SPOTSIZE specifies the actual focused area of the electron beam on the sample. |
| Mode | Select UHR or Search as the imaging mode.. |
| Detector | Select the detector to be used for the electron beam images. Choices are determined by the currently selected imaging mode. |

*FIG. 17B*

| Item | Description |
|---|---|
| Script File Path | Name and path of the AutoScript file. |
| Browser | Accesses the Open dialog box so you can navigate to a script file. |
| Edit File | Opens the selected script file in the Windows Notepad text editor. |
| Log File Path | Name and path of the log file. |
| Browse | Accesses the Open dialog box so you can navigate to the log file. |

System Settings

Get Current System Settings

Stage
- ○ Absolute
- ⦿ Relative
- ☐ X [0.00]
- ☐ Y [0.00]
- ☐ Z [0.00]
- ☐ R [0.00]
- ☐ T [0.00]

Beam
- ☐ Primary Beam
  - ⦿ Electron
  - ○ Ion
- ☐ Magnification [10000.00]
- ☐ Scan Rotation [0.00]

Electron Beam
- ☐ kV [2.0]
- ☐ FWD [5.00]
- ☐ Spot [3]
- ☐ Mode
  - ○ UHR
  - ⦿ Search

Ion Beam
- ☐ Ion Aperture [30]

[Apply] [Cancel]

*FIG. 19A*

| Item | Description |
|---|---|
| Get Current System Setting | Gets the current system settings for all options. |
| Stage: | |
| Absolute | Chooses coordinates measured from the center of the stage. |
| Relative | Chooses coordinates measured from the current location on the stage |
| X,Y,Z,R,T | Sets the positions of the five independent axes. |
| Beam: | |
| Primary Beam | Sets the icon beam or electron beam as the primary beam. The selected beam sets the magnification and other image data of the current image window. |
| Magnification | Sets magnification to the specified value. |
| Scan Rotation | Sets scan rotation to the specified value. |
| Electron Beam: | Sets scan rotation to the specified value. |
| kV<br>FWD<br>Spot<br>Mode | Sets the accelerating voltage for the electron beam. Choose a value from the adjacent dropdown list.<br>Sets the electron beam focus to the free working distance specified in the adjacent edit box.<br>Sets the aperture size for the electron beam. Choose a value from the adjacent dropdown box.<br>Selects the mode for the electron beam. |
| Ion Beam: | |
| Ion Aperture | Sets the ion beam current to the aperture (inpA) specified in the adjacent dropdown list. |

*FIG. 19B*

```
┌─ ADR Parameters ─────────────────────────────  DThresh  Display:
│  Die Offset (x-axis) [5000]                    [12]     [3]
│  ☐ Center Defect    %FOV [Text2]               Noise Filter:
│  ☐ Probe Eucentric for Reference Image?        [Full        ▽]
└──────────────────────────────────────────────

☐ use system state                    ┌─ Electron HV and Spot Size ─
┌──────────────────────────┐          │  [1kV    ▽]  [3    ▽]
│   ◉ E-Beam   ○ I-Beam    │          └─────────────────────────────
└──────────────────────────┘
┌─ Magnification ──────────┐          ┌─ Ion Aperture ──────────────
│  ○ FOV                   │          │  [3              ▽]
│  ◉ Fixed  [2500X    ▽]   │          └─────────────────────────────
│                          │
└──────────────────────────┘
┌─ Detector ──┐ ┌─ Mode ──┐           ┌─────────────────────────────
│  ◉ TLD-S    │ │ ◉ UHR   │           │ Resolution  [Med-5.66   ▽]
│  ○ TLD-B    │ │ ○ Search│           │ ☑ Save Data Bar On Image
│  ○ TLD-C    │ └─────────┘           │ ☐ ACB
│  ○ TLD-D    │ ┌─ Integrate ─┐       │ ☐ AutoFocus
│  ○ CDM-E    │ │    [1]      │       │ ☐ AutoStig
│  ○ CEM-I    │ └─────────────┘       └─────────────────────────────
└─────────────┘
```

*FIG. 20A*

DEFECT ANALYZER

This application is a continuation of U.S. patent application Ser. No. 10/706,304, filed Nov. 12, 2003, now U.S. Pat. No. 7,103,505 which claims priority from U.S. Provisional Pat. App. No. 60/425,407, filed Nov. 12, 2002, both of which are hereby incorporated by reference.

TECHNICAL FIELD OF THE INVENTION

The present invention relates generally to micro-fabrication processes, and in particular, the invention relates to defect analysis systems.

BACKGROUND OF THE INVENTION

Engineers need to analyze defects and other failures during micro-fabrication to troubleshoot, adjust, and improve micro-fabrication processes. For example, defect analysis is useful in all aspects of semiconductor production including design verification diagnostics, production diagnostics, as well as other aspects of microcircuit research and development. As device geometries continue to shrink and new materials are introduced, the structural complexity of today's semiconductors grows exponentially. Many of the structures created with these new materials are re-entrant, penetrating back through previous layers. Thus, the defects and structural causes of device failure are often hidden well below the surface.

Accordingly, defect analysis often requires cross-sectioning and viewing defects on a three-dimensional basis. With the growing use of copper conductor devices on semiconductor wafers, better systems capable of performing three dimensional defect analyses are more important than ever. This is because there are more defects that are buried and/or smaller, and in addition, chemical analysis is needed in many cases. Moreover, structural diagnostics solutions for defect characterization and failure analysis need to deliver more reliable results in less time, allowing designers and manufacturers to confidently analyze complex structural failures, understand the material composition, and source of defects, and increase yields.

Unfortunately, the defect characterization provided by conventional systems (e.g., optical inspection tools) is typically inadequate. The defect analysis process is typically slow and manual, with a technician individually deciding upon and performing each of the steps in the analysis. Rather than being integrated into the fabrication process, the defect analysis process is more laboratory-oriented than production oriented. In fact, in many fabrication facilities, defect analysis is performed in a laboratory located outside of the "clean room" environment. The results can take too long in being returned to the fab and the delay in analysis results can result in producing more defects or shutting down production. When a wafer is taken for detailed defect analysis, in many cases, the wafer must be discarded after it has been analyzed for fear of contamination and the like, even though only a small part of the wafer is destroyed by the analysis. With ever increasing wafer sizes and material process complexities, such losses can result in significant financial hardships.

Accordingly, what is needed is an improved defect analysis method and system.

SUMMARY OF THE INVENTION

The present invention provides methods, devices, and systems for analyzing defects in an object such as a semiconductor wafer. In one embodiment, it provides a method of characterizing defects in semiconductor wafers during fabrication in a semiconductor fabrication facility. The process is partially or fully automated and can be done in the wafer fabrication facility to provide rapid feedback to process engineers to troubleshoot or improve processes.

A method of one embodiment comprises the following actions. The semiconductor wafers are inspected to locate defects. Locations corresponding to the located defects are then stored in a defect file. The work piece is aligned in a charged particle beam system and the system automatically navigated to the vicinity of the defect location using information from the defect file. The defect is identified in a charged particle beam image, and an image of the defect is obtained. The charged particle beam image is automatically or manually analyzed to characterize the defect. If the defect warrants further investigation, a recipe is determined, either by a user or automatically, for further analysis of the defect. The recipe is then automatically executed. The recipe will typically entail one or more charged particle beam operations to remove material and then to form an image the exposed surface. The position and orientation of the cut or cuts made by the charged particle beam can be automatically or manually determined based upon an analysis of the charged particle beam image. Ultimately, one or more surfaces exposed by the charged particle beam cuts are imaged to obtain additional information about the defect. Defect information can be uploaded to a yield management system and stored so that information from multiple defects can be analyzed to learn about the fabrication process that caused the defects.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes as the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, the following description is made with reference to the accompanying drawings, in which:

FIGS. 6A through 6C show exemplary screen interfaces for one embodiment of a defect explorer application of the present invention.

FIG. 8A shows an exemplary screen interface for a cal-align tool.

FIG. 8B is a table of command and field descriptions for the screen interface of FIG. 8A.

FIG. 9A shows an exemplary cross-section tool screen interface.

FIG. 9B is a table of command and field descriptions for the screen interface of FIG. 9A.

FIG. 10A shows one embodiment of a fiducial tool screen interface.

FIG. 10B is a table of command and field descriptions for the screen interface of FIG. 10A.

FIGS. 10E through 10H show various dialog boxes that may appear with the fiducial tool embodiment of FIGS. 10A through 10D.

FIG. 11A shows one embodiment of a screen interface for a re-align tool.

FIG. 11B shows a table of command and field descriptions for the screen interface of FIG. 11A.

FIG. 13A shows a screen interface for one embodiment of a get system settings tool.

FIG. 13B is a table of command and field descriptions for the screen interface of FIG. 13A.

FIG. 13C shows a screen interface for one embodiment of a grab image tool.

FIG. 13D is a table of command and field descriptions for the screen interface of FIG. 13C.

FIG. 14A shows a screen interface for one embodiment of a pattern tool.

FIG. 14B is a table of command and field descriptions for the screen interface of FIG. 14A.

FIG. 15A shows one embodiment of a pause tool screen interface.

FIG. 15B is a table of command and field descriptions for the screen interface of FIG. 15A.

FIG. 15C shows a run-time screen for the pause tool of FIGS. 15A and 15B.

FIG. 15D is a table of command and field descriptions for the screen interface of FIG. 15C.

FIG. 16 shows a screen interface for one embodiment of a set settings tool.

FIG. 17A shows a screen interface for one embodiment of a slice and view tool.

FIG. 17B is a table of command and field descriptions for the screen interface of FIG. 17A.

FIG. 19A shows a screen interface for one embodiment of a system settings tool.

FIG. 19B is a table of command and field descriptions for the screen interface of FIG. 19A.

FIG. 20A shows an exemplary screen interface for one embodiment of an ADR tool.

DETAILED DESCRIPTION OF THE PREFERRED EMBODIMENTS

A. Overview

Figure 1A:
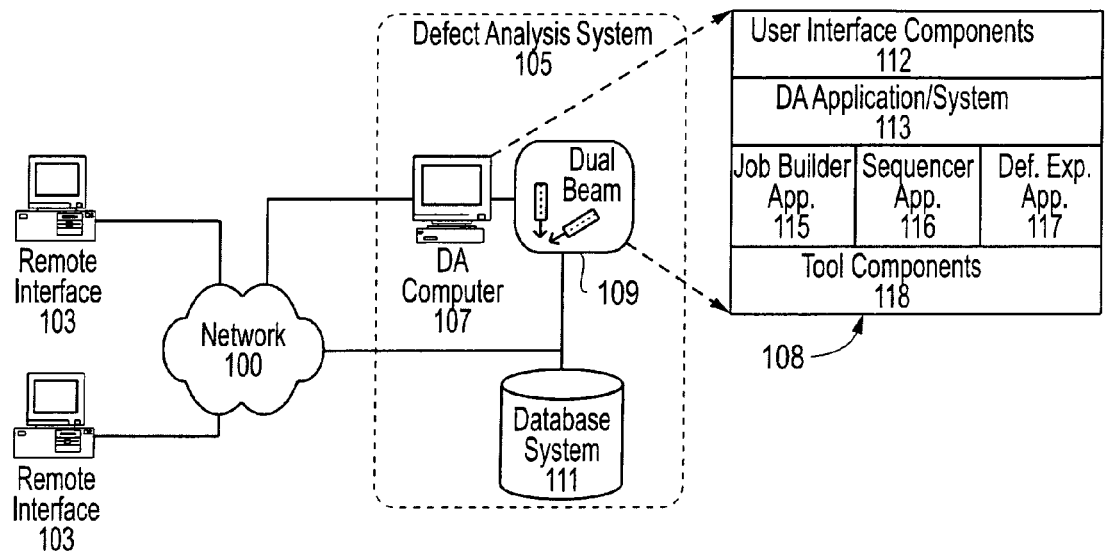
FIG. 1A shows a block diagram of one embodiment of a defect analyzer system of the present invention.

The present invention provides partly or fully automatic location and characterization of microscopic defects in items, such as integrated circuits or other structures fabricated on semiconductor wafer. The automatic characterization of the defect may include steps such as forming an image of the top surface, milling one or more cross sections, forming an image of the one or more cross-sections, performing an x-ray spectroscopy analysis (e.g., energy dispersive spectroscopy, "EDS") to determine the type of material present on the surface or in a cross section, and storing defect characterization data. By being partly or fully automated, the invention can provide rapid feedback to process engineers. Embodiments of the invention can change the defect analysis process from a labor intensive, time consuming process performed in a laboratory to a production process that provides timely feedback to process engineers for troubleshooting or improving production.

In one preferred embodiment, the present invention comprises a defect analyzer system particularly useful for automatically analyzing defects on semiconductor wafers at any point during the wafer fabrication. (A preferred system will be compliant with 200 mm and 300 mm industry standards and guidelines, including SECS-GEM, and is extendable for processes below 0.13 μm.) Defects are typically identified by a defect inspection system, which typically produces a defect list that includes the approximate position of detected defects. In an embodiment with a defect analyzer system comprising a "dual beam" charged particle beam system having a focused ion beam column and an electron microscope, the system can automatically align the wafer, and then automatically navigate to the defect locations specified by the inspection system and process the defects. In addition, the system can automatically identify the defects and produce and store images and additional data about the defects. Defects can be re-identified with more accurate locations and size/shape information determined. The images are typically formed using one of the system's charged particle beams. Having two beams permits different imaging techniques to be used, which can provide more information than a single beam technique. For example, information from one beam that is tilted with respect to the work piece will provide different size and shape information about the site than a beam that is approximately perpendicular to the work. In addition the information from the electron beam and ion beam can be significantly different, and provide information about materials and morphology of the work piece. Other embodiments could use a single beam, either an ion beam or an electron beam, with the single beam being either fixed or tiltable, or two electron beams. In many applications, an electron beam can be used with gases to perform milling or deposition and other operations often done with an ion beam.

In some embodiments, after images are automatically obtained for a group of defects, a user, such as a wafer fabrication process engineer, views the stored images of the defects off-line and assigns additional processes to be used to analyze some or all the defects. The process engineer may ignore familiar defects having known causes, but instruct the system to take a progressive series of cross sectional images of some other defects and determine the chemical composition at some of the cross sections. The wafers can then be re-loaded onto the system, which then automatically navigates to the defects again and automatically performs the prescribed processes to obtain additional information about the defects for the user.

The specified processes can include, for example, milling one or more cross sections, taking images of the exposed cross-section, removing one or more layers of material to expose and analyze a buried layer, taking physical measurements or performing chemical analyses (such as EDS) on surface or buried layers. In most cases, all the specified processes are preferably performed automatically, with little or no user intervention. The results of the analyses are stored and statistics can be automatically determined based on the multiple measurements. The results can also be uploaded into yield management software.

In another embodiment, the system navigates to defects on a defect list generated by an inspection tool and then automatically characterizes the defect and determines without operator intervention a set of processes to apply to each defect based upon the characterization. For example, the system may take a top-down image and then analyze the image to automatically characterize the defect. Characterization may include determining an outline and a center for each defect. For example, the system may determine that a long thin defect should be analyzed by having multiple cross sections cut and imaged perpendicular to its long axis. After the defect is automatically characterized, depending on the defect classification, the system may perform additional processes, such as cutting one or more cross sections and measuring or chemically analyzing the exposed material. For example, an engineer may specify that a certain percentage of a particular class of defects is to have multiple cross sections cut and imaged.

The simplicity of use of the invention makes it suitable for use within a wafer fabrication facility by process engineers or technicians that are specialist in the wafer fabrication process and not necessarily experts in the charged particle beam systems. Thus, the invention is capable of providing automated, rapid information to process engineers in the wafer fab.

A preferred embodiment provides a complete, 3-D defect automation package. This preferred embodiment contains integrated navigation, the ability to cross section, compositional analysis, advanced gas chemistry deposition and milling, and imaging. The creation and execution of the analysis processes, referred to as a "jobs," are reduced to simple tasks for engineers and technicians. The hands-off operation of a preferred embodiment allows the user to output consistent and reliable data, including accurate classification, high quality images, 3-D information of surface or buried features, and chemical data.

To provide the automatic functionality described above, applicants have developed, among other things, methods to accurately locate and re-locate the defect with sufficient accuracy to perform multiple operations using two beams without requiring user intervention. In some embodiments, coincidence of the electron beam and ion beam can automatically be maintained even when the position of the beams on the work piece is changed, when beam parameters, such as beam current, is adjusted to be appropriate to each defect, or when the environment, such as the presence or absence of a gas injection needle near the impact point, is changed. In some embodiments, the beam impact points are not coincident, but are separated by a known distance. When the system switches from using one beam to using the other, the work piece is automatically moved by the known distance so that the same point is impacted by both beams.

The system automatically relocates and determines the size and shape of the defect, adjusts the image magnification to an appropriate value, adjusts the beam parameters, and maintains alignment or realigns the two beams if required by a change in the beam parameters. For example, depending on the size and shape of the defect, an appropriate beam aperture can be automatically selected to control the beam size and current. More detailed defect characterization information is required than in prior art systems that did not use the characterization to direct focused ion beam operations.

One method of re-locating and aligning beams is by milling a fiducial that can be used to align the beam images, thereby reducing potential damages caused by aligning the beams on the defect or in cases when the defect is altered in the process. The beam alignment can be maintained when the impact point is moved away from the fiducial by a probe, such as a capacitive sensor, that maintains a constant distance from the beam columns to the top of the wafer, regardless of warp or thickness variation in the wafer. By providing such automatic beam adjustment and alignment, the system can automatically perform operations on different sizes and types of defects without operator intervention, thereby allowing an automated system to collect and analyze data for process engineers in a wafer fabrication facility.

By providing this to process engineers for rapidly analyzing defects without the need for an actual operator, the system will improve FAB reliability and due to the automatic nature of the data collection can dramatically improve the consistency and precision of the data.

B. System

With reference to FIG. 1A, in one embodiment, a defect analysis system 105 is shown connected to remote interface computers 103 through network 100. Defect Analysis system 105 generally includes defect analyzer computer ("DA computer") 107 operably connected to (or integrated with) a dual beam defect analyzer 109 and database system 111. The DA computer 107 and dual beam system 109 use software 108 for implementing defect analysis and characterization.

The depicted devices, remote interface computers 103, network 100, DA computer 107, dual beam system 109 and database system 111, can be implemented with any suitable combination of conventional (albeit possibly modified) equipment, and in many system embodiments, may not even be included. (For example, the network and network computers will not be utilized.) Network 100 may be any suitable network configuration, such as a virtual private network ("VPN"), local area network ("LAN"), wide area network ("WAN") or any combination thereof. Similarly, computers for performing remote interface 103 functions, DA computer 107 functions, and database system 111 functions may be any suitable computing devices such as desktop computers, laptop computers, PDAs, server systems, mainframes, processing systems made from discrete components, and/or combinations of one or more of the same. They can execute conventional operating systems such as Windows™, Unix™, Linux™, Solaris™ and/or customized, job-specific operating systems.

In one embodiment, the present invention utilizes a dual beam system 109 that uses an ion beam that is either normal or tilted by a few degrees to the plane of the work piece surface and an electron beam having an axis that is also tilted, e.g., 52 degrees from the axis of ion beam. In some embodiments, the ion beam and electron beam are capable of aligning so that the fields of view of both beams are coincident to within a few microns or less. The ion beam is typically used to image and machine the work piece, and the electron beam is used primarily for imaging but can also be used for some modification of the work piece. The electron beam will typically produce an image of a higher resolution than the ion beam image, and it will not damage the viewed surface like the ion beam. The image formed by the two beams can look different, and the two beams can therefore provide more information than a single beam. Such a dual beam system could be made from discrete components or alternatively, could be derived from a conventional device such as an Altura™ or an Expida™ system available from FEI Company of Hillsboro, Oreg.

In the depicted embodiment, software 108 includes user interface components 112, defect analyzer application/system 113, job builder application 115, sequencer application 116, defect explorer application 117, and tool components 118. User interface components 112 generate user interfaces (e.g. screen interfaces) for presenting to users controllable access to the functions provided by the defect analyzer, defect explorer, sequencer, and job builder applications, as well as the tool components. The defect analyzer application 113 controls the overall operation of the defect analyzer system 105. It controls access to the system and invokes the various other applications and tool components upon receiving requests from users.

The job builder application 115 allows users to create "jobs", which define the defect analysis and review tasks to be performed on defect sites within one or more wafers. A job can be executed by the sequencer application 116, which at least partially automatically causes the defect analysis system to perform the job tasks on the designated defect sites. In one embodiment, a software platform is utilized that supports Active-X™ and an xPLIB™ automation layer thereby allowing better communication between user interfaces and the electronics of the system. The defect explorer application 117 allows users to selectively review images and data obtained from defect analysis performed by the defect analyzer system. The defect explorer application 117 may be run from within defect analysis system 105, or it may be run from a separate interface, remote or otherwise. For example, the defect analyzer application 113 could be run on a DA computer 107, which functions as a central server (possibly located in a FAB, for example) for remote interface clients 103, which can access the defect explorer application 115 such as from a user's desktop for monitoring the results of the defect analysis.

Any suitable software (conventional and/or self-generated) applications, modules, and components may be used for implementing software 108. For example, in one embodiment, the defect analyzer application/system is implemented with xP™ defect analysis software, provided by FEI Co. in many of its defect analysis systems. In this embodiment, software is created for implementing the job builder, sequencer, defect explorer, tool components, and additional user interface components. Conventional software design techniques can be used to create such software based on the defect analysis and characterization principles discussed below.

Figure 1B:
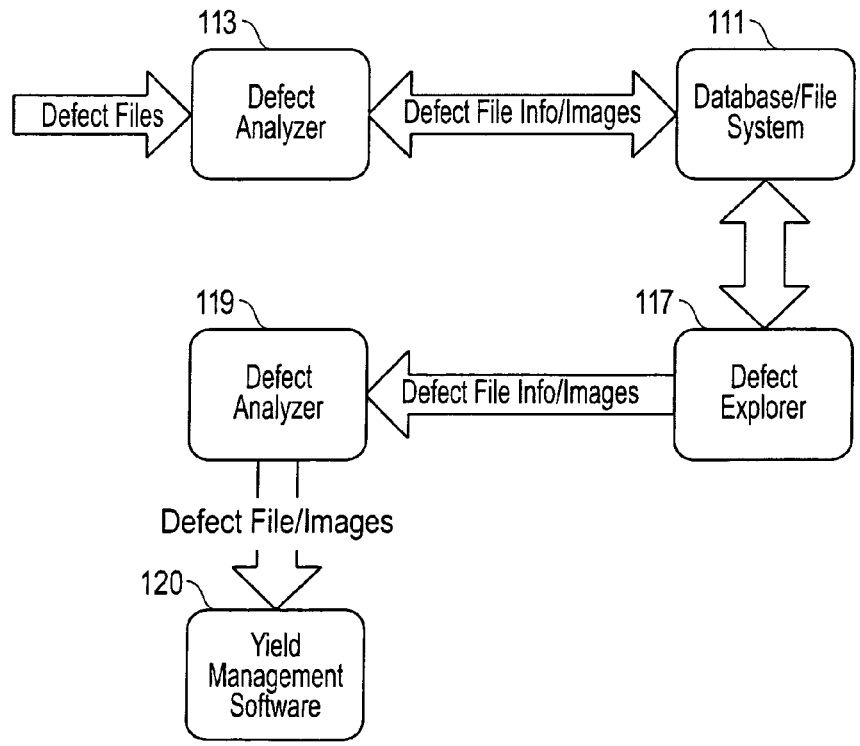
FIG. 1B shows a defect data flow for the defect analyzer system of FIG. 1A.

FIG. 1B shows data flow between the executing software applications. In this depiction, the job builder 115 and sequencer 116 applications are encompassed within the defect analyzer application 113. The defect analyzer application 113 receives defect files as input. It transfers the defect file information, along with a path to associated captured images, to the database system 111. The defect explorer 117 has an interface for searching and selectively viewing defect data and images from the database system 111. A set of the reviewed images and data can then be selectively exported to the yield management module 120 by placing the generated defect file and images through a configurable file folder/directory structure 119. In the following sections, the software modules will be discussed in greater detail.

1. Defect Analyzer Application

Figure 2:
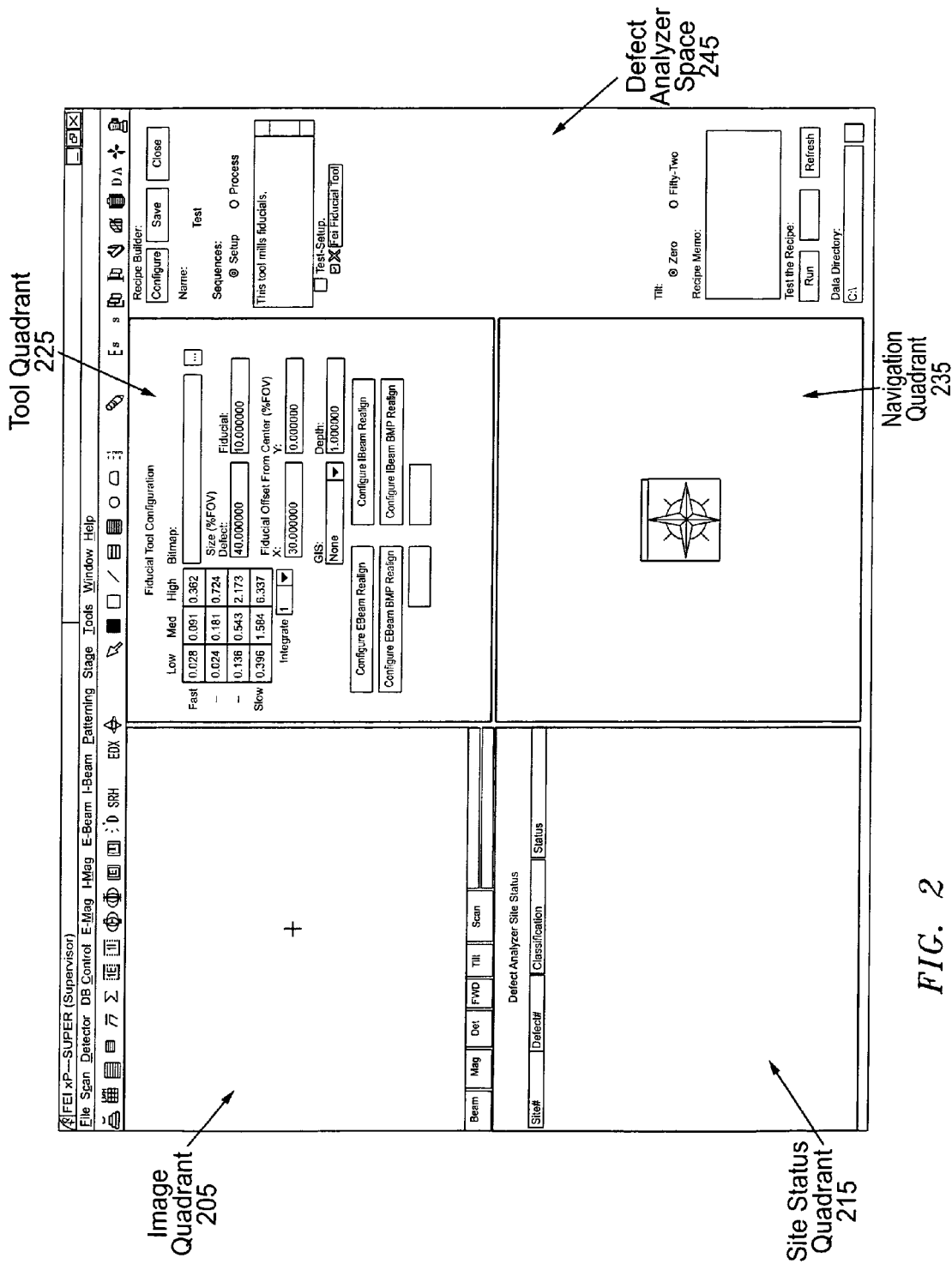
FIG. 2 shows one embodiment of a screen interface for a defect analyzer system of the present invention.

FIG. 2 shows a screen interface for implementing one embodiment of a defect analysis application. In this embodiment, the defect analyzer application 113, along with the job builder 115, sequencer 116, and defect explorer 117 applications, is incorporated into an xP™ based dual beam system provided by FEI Company. The defect analysis application is one functional portion of the system software, which provides a multi-sectioned display with an imaging section 205, a site status section 215, a tools section 225, a navigation section 235, and a dedicated defect analyzer section 245. The purpose and operation of each of these sections is described in more detail below. From the tool section 225 and defect analyzer section 245, users can display the job builder interface, the sequencer interface, or the defect explorer interface. (In the depicted figure, the job builder/recipe builder display is shown.) In one embodiment, an auto-alignment setup page for configuring the system for particular job types is also made available to users. Thus, in order to invoke the defect explorer, sequencer, job builder, or any of the tool components, a user can open the defect analyzer application 113 and access the desired module via a screen interface similar to the one shown in FIG. 2. Some or all of these modules (e.g., defect explorer) may additionally or separately be accessible in a stand-alone interface and/or through a different computer device.

2. Job Builder

The Job builder application 115 enables users to build "jobs" for analyzing defect sites. It also allows users to edit jobs, configure a site (e.g., if an auto-alignment setup application is not provided), and assign a process to a site. Jobs comprise one or more recipes, which define the work to be accomplish at a particular defect site. There are three basic job structures: (1) same site sequence at each site, (2) different site sequences at different sites, and (3) groups of sites having the same process. Such work may include, for example, marking the site with a fiducial, milling a cross section, or saving an image or combination. The user builds a job by stringing together and defining recipes and tools (including predefined system recipes/tools and user defined recipes/tools). The tools come out of the tool components 118 and are associated with (e.g., correspond to or invoke) software instructions that can be initiated and/or executed by the sequencer 116. The sequencer runs jobs created by the job builder. This includes writing analysis information and transferring stored images to/from a defect analysis file database, which is stored and managed in database system 111. The job builder also includes, in one embodiment, a stand-alone product manager module for managing data used by and created for jobs and recipes.

There are at least two types of recipes: a setup recipe involving manual or semi-automated tasks such as marking the site with a fiducial, and a process recipe, which involves automated tasks such as milling a cross section or grabbing an image. Recipes comprise tools, which are the building blocks in a recipe, i.e., the object used to accomplish a particular task at a defect site. There are tools for patterning, imaging, moving between die, and establishing beam coincidence, to name a few. A recipe can have any number of tools. Thus, a job, which may be partially or fully automated, generally has at least one recipe, and each recipe typically has one or more tools.

Figure 3A:
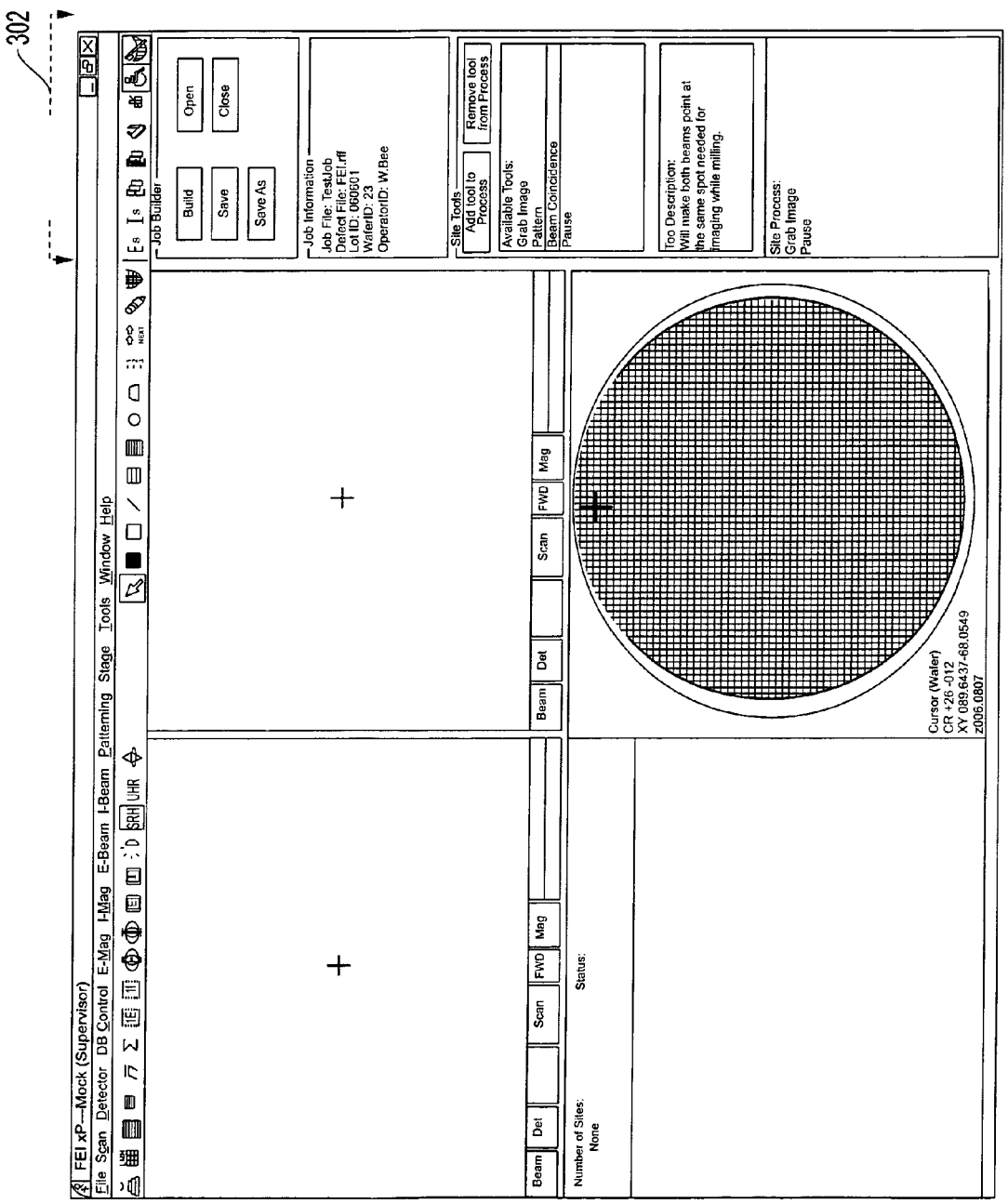
FIGS. 3A through 3N show interface screens and function definitions for one embodiment of a job builder application of the present invention.

With reference to FIGS. 3A through 3N, an exemplary job builder interface is depicted. FIG. 3A shows a defect analyzer screen interface with a job builder page 302 selected. The job builder application comprises a number of commands and functions for building jobs. The depicted command options are listed and described in the table of FIG. 3B. Job specific information includes lot number, wafer ID, site list, and site sequence (or sequences). This information is displayed on the Job page. From the job builder page, a user can select tools and enter data based on a given defect site, which in one embodiment, is coarsely described in a pre-entered defect file. A user can also invoke the product manager, which is addressed below.

In one embodiment, the job builder application has an integrated but separate recipe builder component. This allows users to build recipes from tools, including pre-configured tools, for future use. The recipes can then be used in the assembly of jobs or in use cases where all defect sites use the same recipe. Typically, recipes are configured so that the wafer and defect file are associated with the recipe in the sequencer at runtime. A user can build a recipe from either an existing recipe or by creating a new one. To build a new recipe, a user (1) opens a new recipe; (2) selects a tool to add to the recipe, (3) configures the tool; (4) repeats steps 2 and 3 if desired, and (5) saves the newly created recipe. Users may also similarly edit existing recipes. The user can build a library of recipes that can be then assigned to: (1) all sites in a defect file, and (2) specific defect sites. Any instance of a recipe assigned to a site can be modified. The user will be able to visit a site, and then decide on the process.

Figures 3C, 3D:
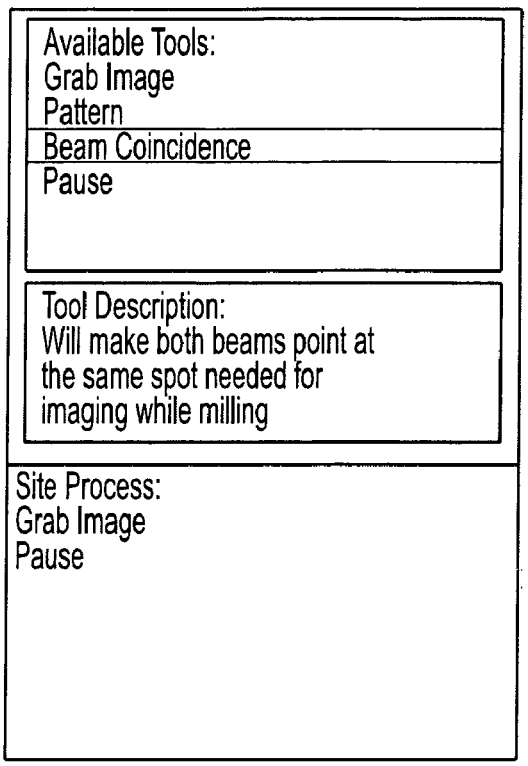
FIGS. 3O through 3X show exemplary screen interfaces, with tables listing controls and descriptions, for one embodiment of a product manager module.
FIG. 3Y shows an exemplary structure for alignment data tree view nodes of the product manager of FIGS. 3O through 3X.

FIG. 3C shows an insert tool interface. With this interface, the user adds and removes tools in a job sequence. Each instance of a tool can have a unique name. During job building, the pre-configured tools and combination tools can be added to sites individually or in groups. For each site, unique configurations can be defined.

FIG. 3D shows a job wafer data entry panel. The input data for the job builder is entered in a dialog box (which can also be used by the sequencer). The operator chooses the defect site filter in this dialog box. Data entered in the job builder includes, location data identifying where grabbed images will be saved, data defining image annotations, and name data for a particular site sequence. In one embodiment, the job builder inserts logic in jobs so that after analyzing a number of defects of a certain class, size, etc., it can stop or take some other action defined in the job.

Figures 3E, 3F:
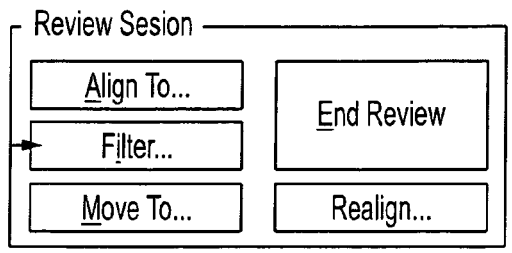
Figure 30:
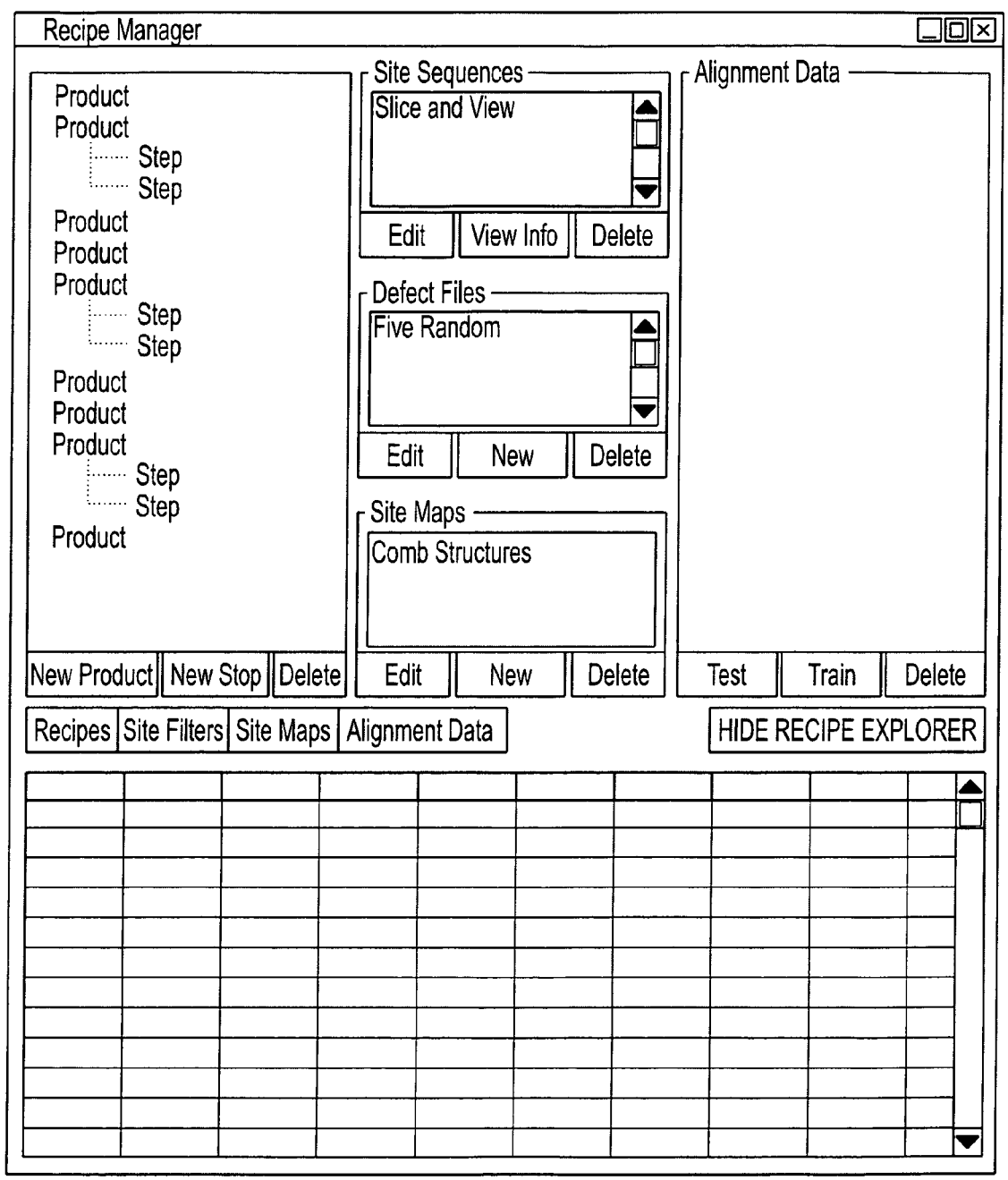

With reference to FIGS. 3E and 3F, the job builder application may also include a combination filtering feature. This enables users to limit a review session to certain types of defects and not others by attaching a filter to a job site list. (The term "review session" is used to mean the session for reviewing defects, and can include actions from receiving an initial defect file through locating the defects, characterizing the defects, and further analyzing the defects.) The user can attach a site filter at any time during a review session. The table in FIG. 3G lists and describes the various filter interface commands/functions. In the depicted-embodiment, to filter defect sites, a user can (1) click "NEW" in the filter dialog box of FIG. 3F to create a new filter file, or click "OPEN" to select an existing filter, and (2) define the new filter or make changes to the existing filter file. Depending on the configuration, only those sites meeting the defined criteria will be displayed in the wafer map and made available using the "NEXT" and "PREVIOUS" buttons in the "Review Site List" area and listed in the site list in the "Select Site" dialog box.

FIG. 3H shows a table with site filter criteria parameters that may be used for creating filters. A set of filter criteria parameters defines a filter. Defect sites not meeting the criteria of the active site filter are excluded from review.

To specify a filter value, a user can enter a site number, a range of site numbers (e.g., 3-7), or a relation to a site number indicated by a relational operator followed by a number (e.g., >10). In this latter example (>10), the site values 7 and 10 would fail, but 10.001 and 13 would pass. Possible relational operators are shown in the table of FIG. 3I.

With reference to FIG. 3J, a user may also cause a random subset of sites to be selected. By using the controls in the depicted dialog box, a user can specify that only a maximum number of sites or a given percentage of sites pass the filter. To specify a random subset, a user selects "ENABLE RANDOM SUBSET," Selects "Percent" or "Maximum" from the list box to indicate the type of random subset to be specified; types in the text box: either the percentage of sites if "Percent" is selected (the site filter would pass, on a random basis, the specified percentage of sites meeting the other filter criteria), or (b) the maximum number of sites if "Maximum" is selected (the site filter would pass, on a random basis, no more than the specified number of sites meeting the other filter criteria.

With reference to FIGS. 3K and 3L, the results of an edited active site filter may be tested. This allows users to test the results of the site filter without having to close the "Edit Active Site Filter" dialog box by clicking "APPLY NOW." This updates the site counts in the "Test Results" group and also updates the "Review Site List window.

With reference to FIG. 3M, an activated site filter may be temporarily disabled. To temporarily disable an active site filter, a user can select "TEMPORARILY DISABLE SITE FILTER," which causes the dialog box to appear. When a job has been created and saved, the information is exported to the database system 111, as configured at Defect Analyzer installation.

FIG. 3N shows an exemplary job builder site list format for storing site data. The site data can be made available from a spreadsheet, allowing data to be sorted, filtered, copied, pasted, etc. A user can decide what columns will be in the job builder site list. The benefits of this are ease of filtering, sorting, copying, and pasting information; and increased information visibility at one time than with other implementations. A user can also specify the path of stage travel. Users can also specify how dies are sorted. For example, users can specify that dies be sorted: (1) in a serpentine order, which reduces the total amount of stage travel during review; (2) by increasing row then column, which maintains the same general direction of stage motion in each row of dies.

Users can also control how sites are sorted. Sites are sorted separately in each die if the user makes the appropriate selection. For example, sites may be sorted by: (1) increasing y (axis) then x (axis), which reduces the total amount of stage travel during review; (2) increasing site ID, which maintains a generally increasing trend in site IDs during review; or (3) using the same order as in defect files, which maintains the sites in the same order as in the defect file.

With reference to FIGS. 3O through 3Y, one embodiment of a product manager interface is shown. The product manager interface serves as a control designed as a general purpose interface to the Recipe/Alignment Database, enabling versatile recipe and alignment review, training, and creation. It essentially comprises a stand-alone module, which can either be launched directly from the Recipe Builder interface or as an option in the Job Builder interface. In one embodiment, it has various attributes including manually selected die, compartmentalized alignment training, compartmentalized alignment testing, wizard interface support for creating new modules, defect explorer interface modification capability, convenient copying of existing recipe, filters, alignment data, and site maps through a drag and drop interface, easy editing/creation of site maps, easy editing/creation of site filters, and easy editing/creation of site sequences.

Figure 3P:
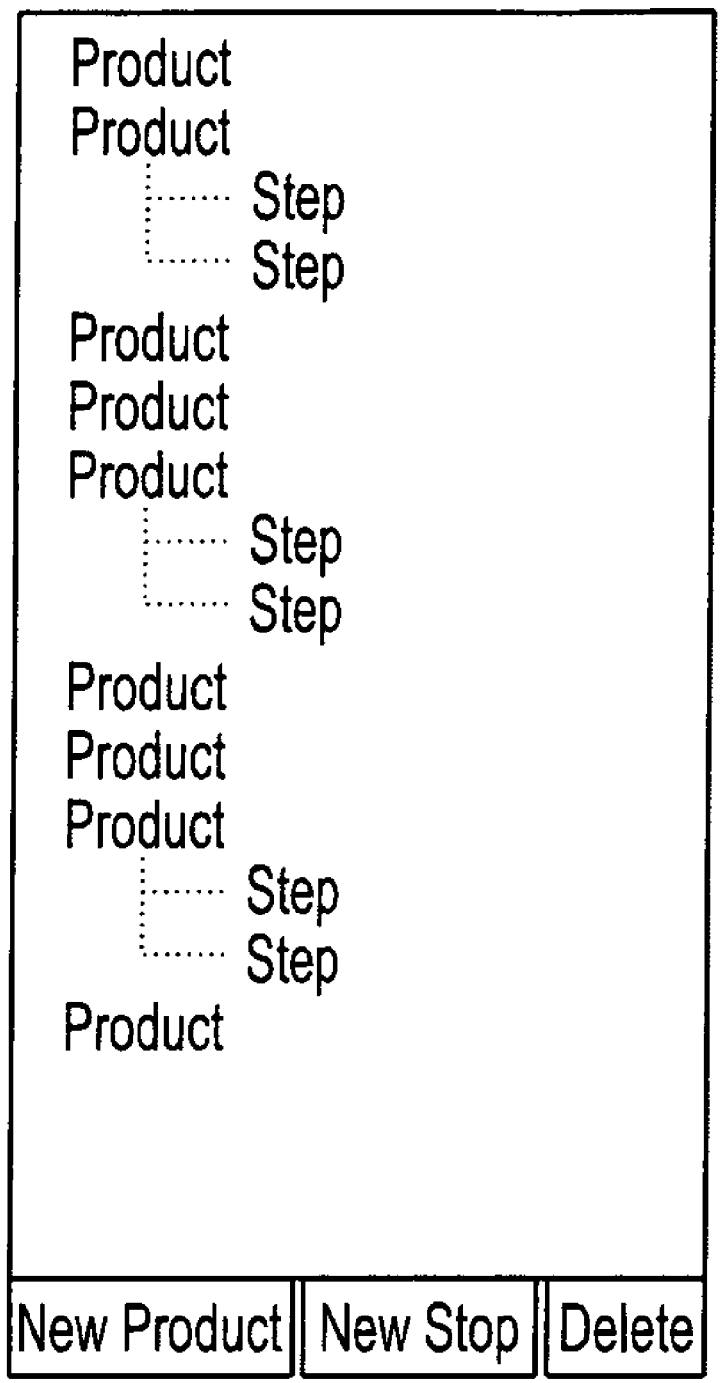
Figure 3R:
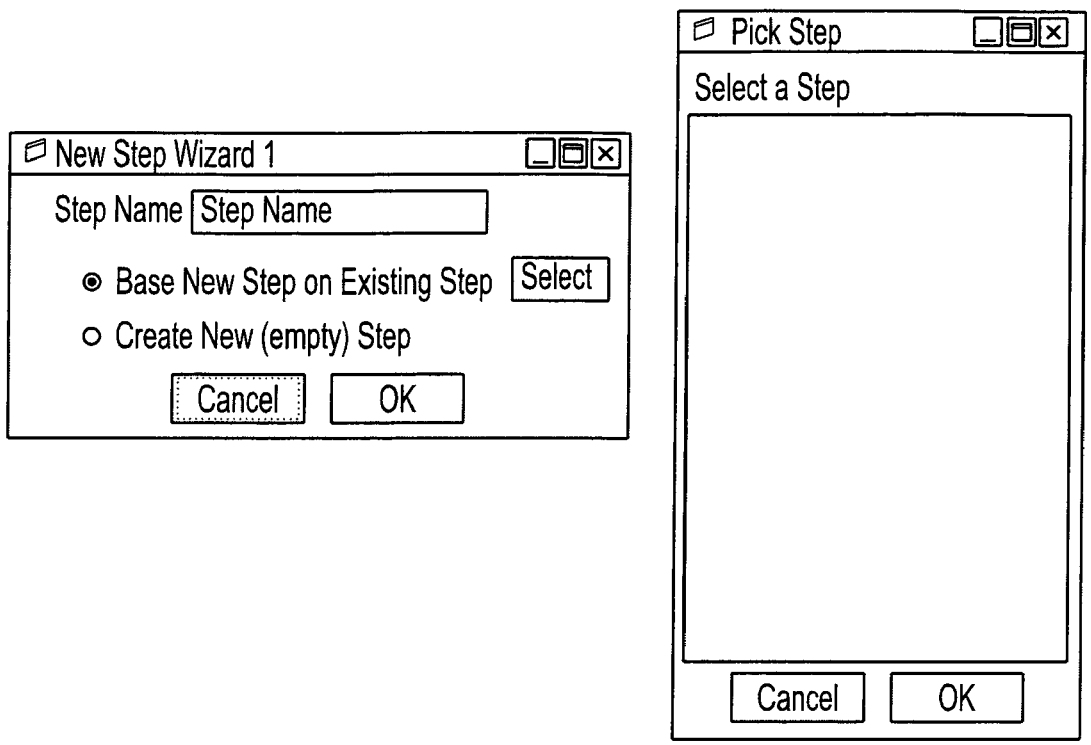
Figure 3S:
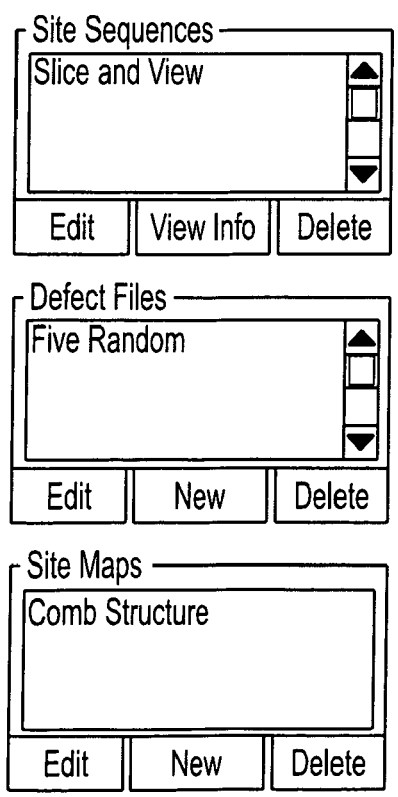
Figure 3U:
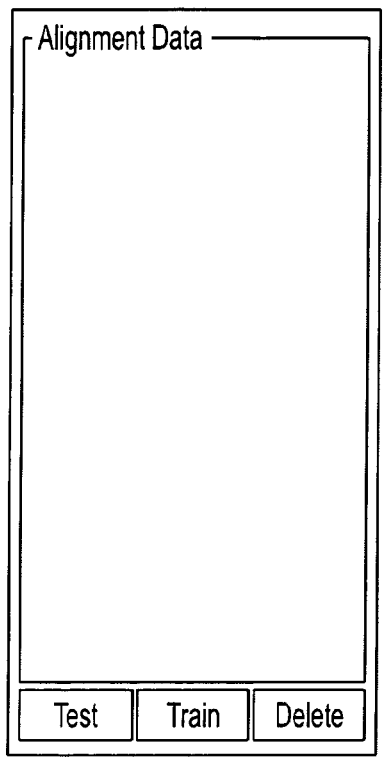
Figure 3W:
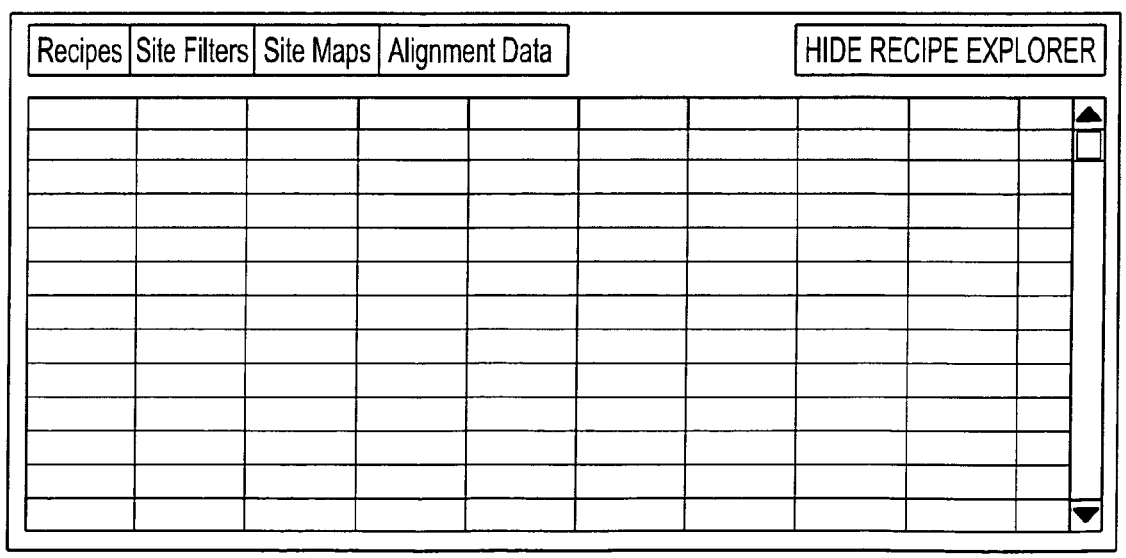

FIG. 3O shows a screen interface for a recipe manager, FIG. 3P shows a screen interface for a recipe tree, and FIG. 3Q is a table listing their controls with descriptions. FIG. 3R shows a screen interface for a new setup wizard, FIG. 3S shows an interface for component editors, and FIG. 3T is a table listing their controls with descriptions. FIG. 3U shows a screen interface for an alignment editor, and FIG. 3V is a table listing its controls with descriptions. FIG. 3W shows a screen interface for a recipe explorer, and FIG. 3X is a table listing its controls with descriptions. Finally, FIG. 3Y shows an exemplary structure for the alignment data tree view nodes.

The depicted product manager provides a more database style view of existing alignments, recipes, site lists, and site maps. Presented through the UI is a standard data grid control that can be sorted but does not need to be configurable. The primary purpose of this control is to allow the user access to a repository of alignment and recipe information that they can drag and drop into new or existing products.

3. Sequencer

A sequencer performs actions and tool tasks defined in a job on designated sites, e.g., according to a designated site/task sequence. In essence, it provides coordination and communication between sites and the tools that are being executed upon them. A sequencer within a defect analyzer may support any combination of the following behaviors: (1) it can run a job with multiple sites designated; (2) it can run the same site list and site sequence on different wafers; (3) it can keep data associated with a wafer and sites even if multiple jobs have been executed; (4) it can sequentially run different jobs on wafers in a cassette; and (5) it can run different site sequences at different sites. In addition, with some systems, the defect file can be manually filtered or every site designated in a defect file can be processed.

Figure 4A:
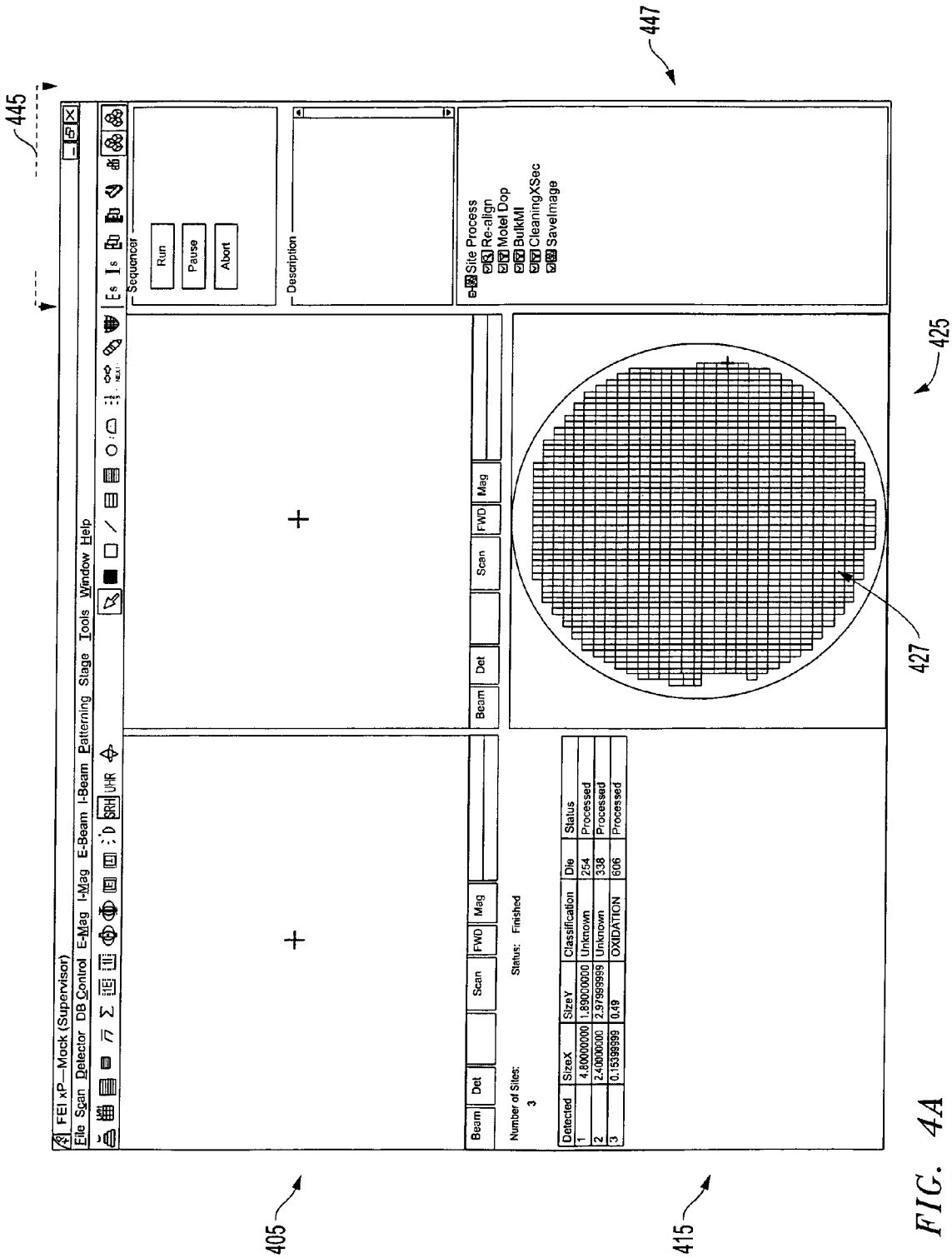
FIG. 4A through 4N show exemplary interface screens and displays for one embodiment of a sequencer application of the present invention.
Figure 4C:
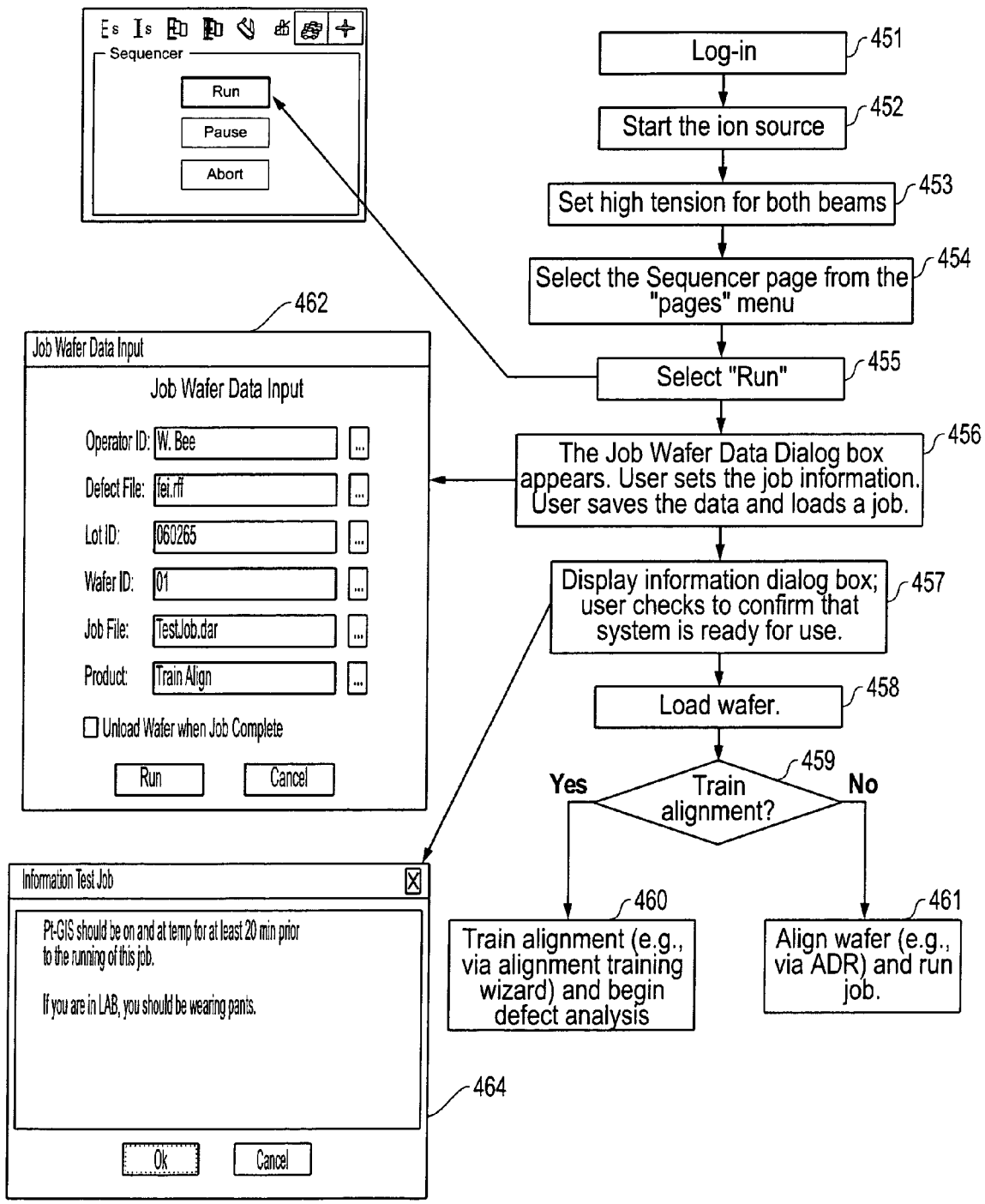
Figure 4F:
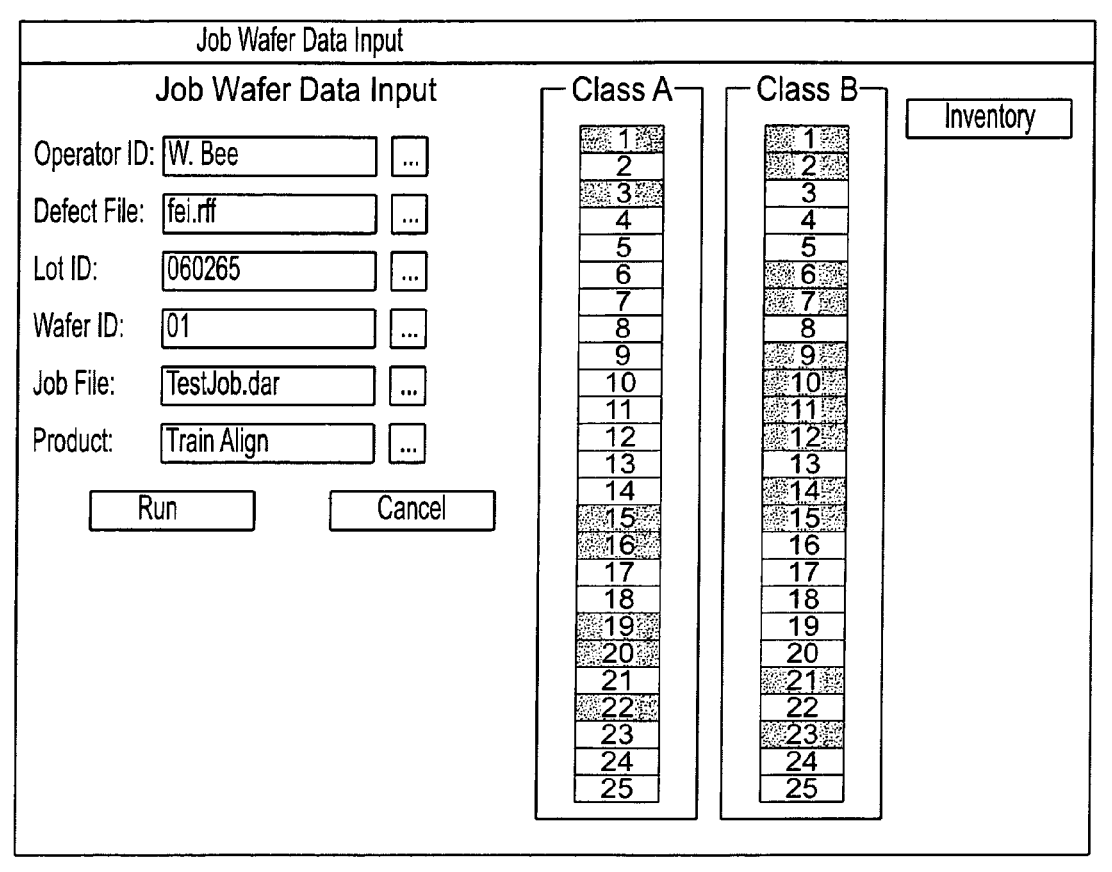
Figure 4G:
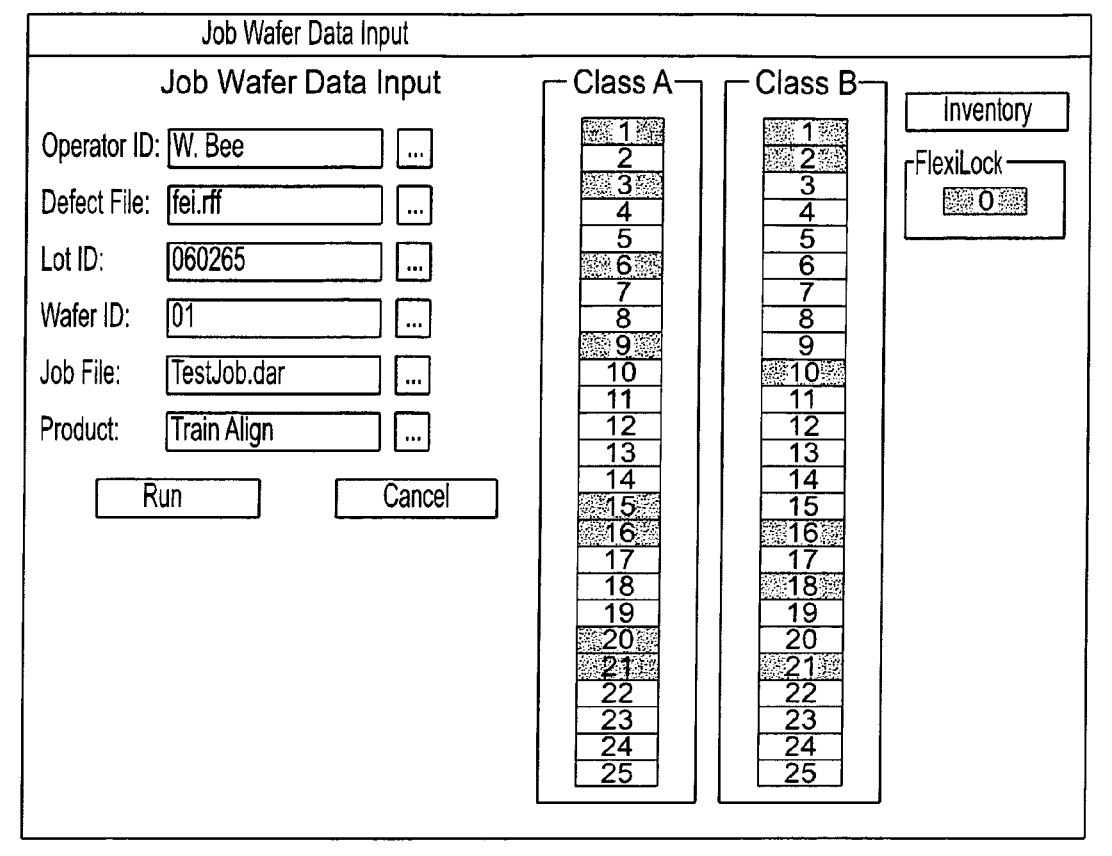
Figure 4H:
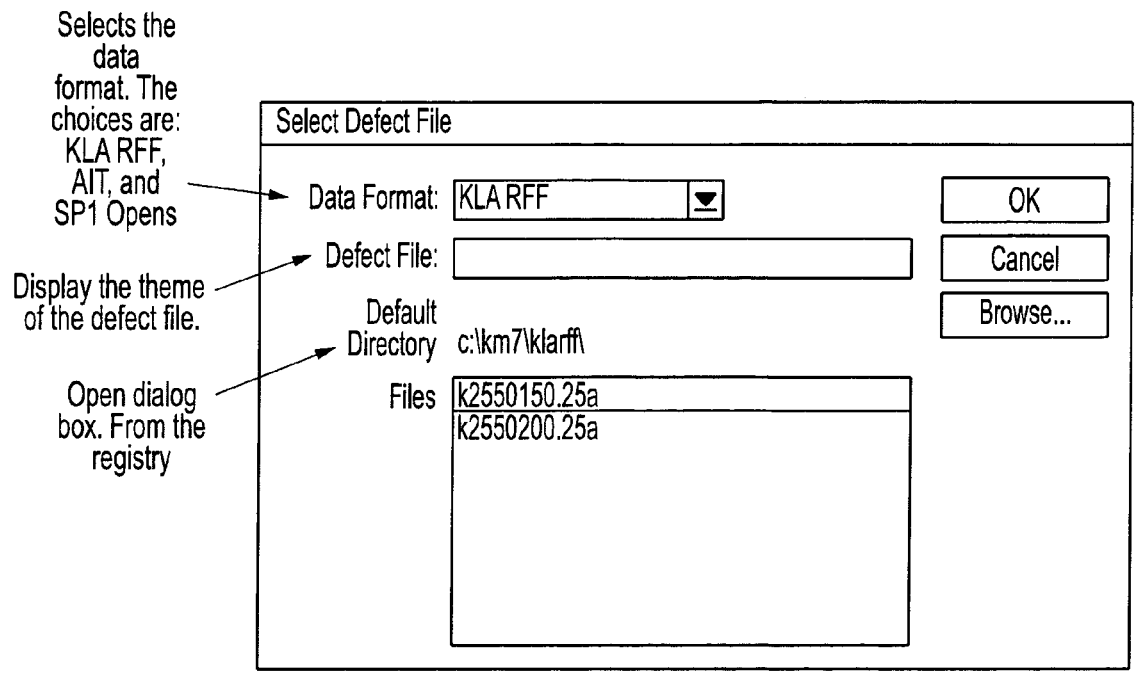
Figure 4I:
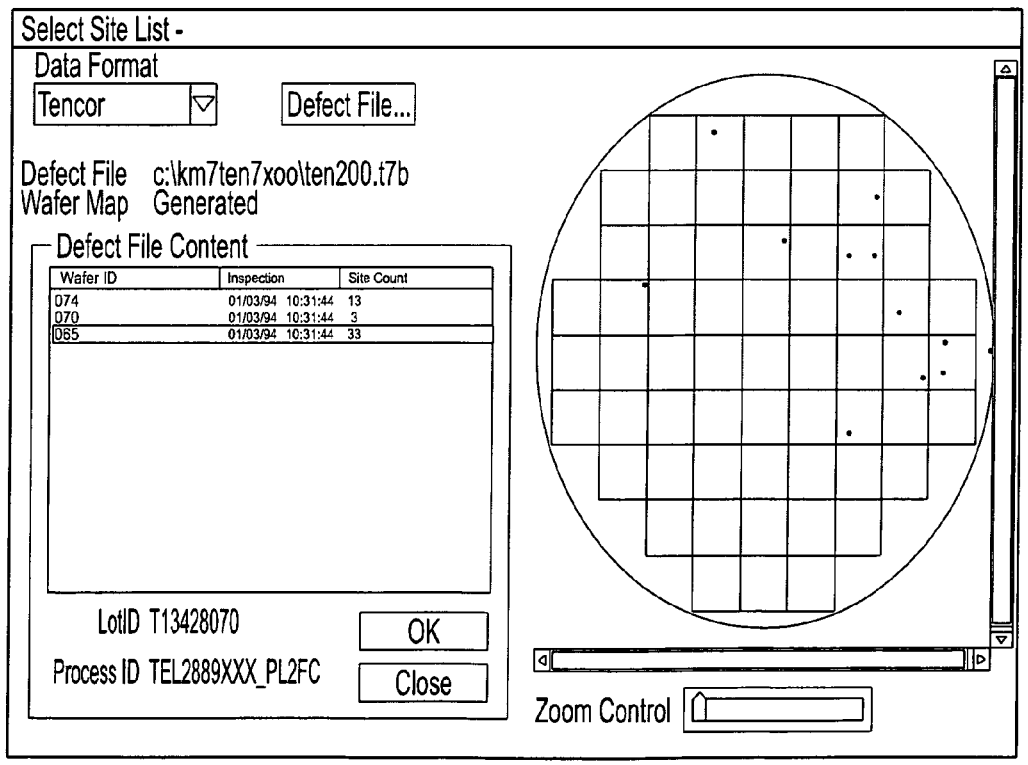
Figure 4L:
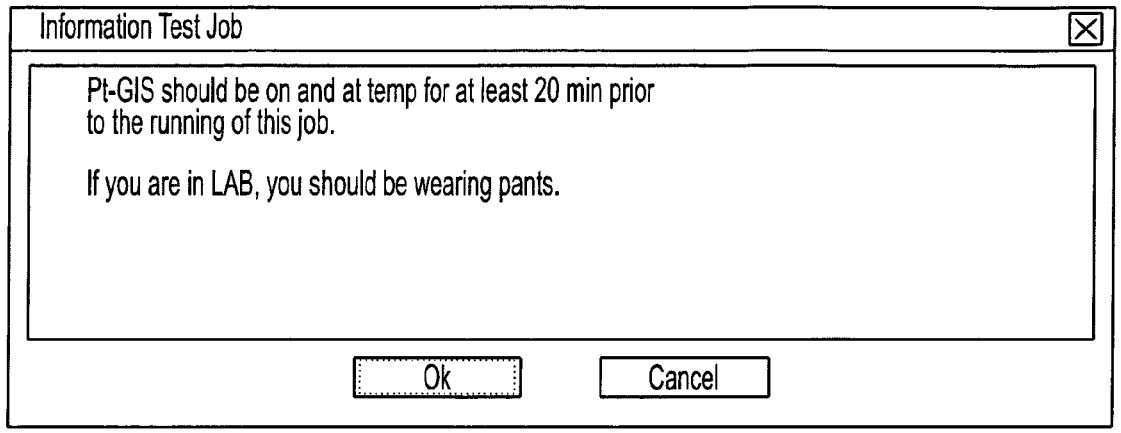
Figure 4M:
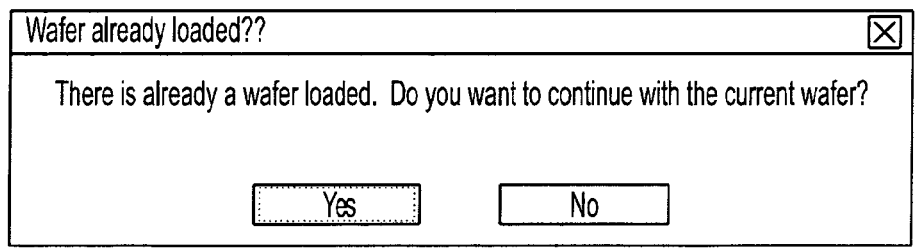
Figure 4N:
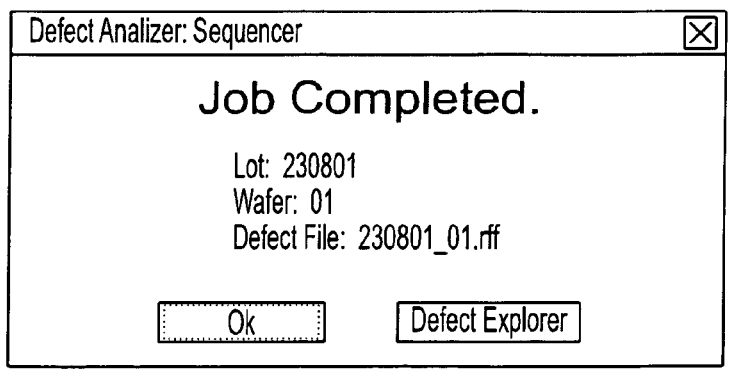

FIGS. 4A through 4N show screen views of one embodiment of a screen interface for a sequencer application. FIG. 4A shows a defect analyzer screen interface with the sequencer page 445 displayed, and FIG. 4B shows a table of command options with associated descriptions. The sequencer page 445 can be accessed through either a toolbar button or the "Pages" menu, a dropdown menu located on the upper right of the screen and allowing a user to select any of several "Pages," such as a Sequencer page or a Job Builder page, for accomplishing a specific task. The user can run a job from the sequencer by clicking the "RUN" button. When the defect analyzer is running, the system may display the live defect site image in the image quadrant at 405, runtime status information in the status quadrant 415, and navigation wafer map in the navigation quadrant 425.

In the depicted figure, the sequencer page 445 has a run time display 447 that appears during sequencer run time. It shows job progress, status, and results (pass/processing/fail) of the sites in the job. The user is able to configure which items from the site list are to appear in the display, which scrolls if necessary. The status of a site can be: touched (e.g., visited, processing may or may not have begun, but not finished), untouched (e.g., unvisited, unprocessed), completed/done/processed (e.g., visited and processing completed). Knowing such site status may be important to users for "hot lots" and when a user processes multiple wafers in multi-pass sequences that are aborted or partially completed.

When the sequencer is activated, a wafer map display 425 is shown in the navigation quadrant 425. The current position of the cursor is displayed in the lower left corner of the wafer map. The wafer map can use colors to convey information about a wafer being processed. For example, it could use gray for areas outside the wafer (the part of the display area not covered by the wafer), black for the wafer background, green for the die outlines on a patterned wafer, and red for the zero column and row (the die outlines in column zero and row zero of the die pattern). On the wafer map display 427, sites that have a process associated with them can be visually flagged. Sites meeting the criteria of the active site filter may be shown on the wafer map. In addition, there can be dynamic color changes for the sites to indicate different site sequences, current site (the depicted cross indicates the site that is currently active), and pass/fail.

With reference to FIG. 4C, one embodiment of a sequencer set-up process is depicted. After a user logs into the defect analysis system 451, starts the ion source 452, and sets the tension for both the ion and electron beams 453, it selects the sequencer page at 454 from the "pages" menu. The user next selects the Run command 455, which causes the "Job Wafer Data Dialog" box 462 to appear at step 456. The job wafer data is entered in this dialog box prior to wafer loading.

FIG. 4D shows one embodiment of a job wafer data input box along side FIG. 4E, which depicts a table of its command options and data fields with associated descriptions. In this embodiment, all fields are typically editable and generally have a list of commonly used values. (This data could also be defined in the job builder.) FIGS. 4F and 4G show alternative examples of job wafer data input dialog boxes. With the system of FIG. 4G, inventory is performed either automatically by the defect analyzer, in which case the inventory button is not necessary, or manually by clicking the INVENTORY button. In some embodiments, the inventory operation checks to see whether a cassette of wafers is loaded onto the defect characterization system. As is made shown by FIGS. 4F and 4G, this embodiment allows a user to specify automatic processing for multiple wafers in multiple cassettes. After the inventory has been performed, the user selects individual wafers. One click on a populated slot selects it, changing its display color from blue to active red. The user inputs the wafer and lot information. Then the user selects another slot. This slot becomes active red and the user inputs its information. The previously selected slot changes to red (not active). Clicking on a red (not active) slot changes it to active. If the user clicks on an active slot, it is deselected and its display color changes from red to blue. Its information is kept. After information for at least one wafer is entered, the RUN button is active. When the user clicks RUN, the information for non-selected wafers is purged and Defect Analyzer will proceed with the job. The Information dialog is displayed. If the user clicks CANCEL, all information is purged and the system returns to the previous step.

Returning to the sequence process diagram of FIG. 4C at step 456, the user sets the job information, saves the data, and loads a job. The sequencer operates in both cassette-to-cassette systems with and without optical character recognition ("OCR"). In cassette-to-cassette systems with OCR, the system can read wafer ID and automatically set the defect file. The user will typically enter the job file and operator ID, but only for the first wafer. Additional information can include slot number and cassette number. If the user does not select a slot, then the top filled slot is selected. In systems without OCR, the user will normally enter most if not all of the information. Each wafer is loaded individually. The user can associate slot numbers with wafer Ids before running a job. All wafers are usually prescanned. That is, there is a defect file for each wafer, and the files are on the system. When the job is completed, the sequencer unloads the wafer and loads the next wafer. The system normally loads the first wafer. The user may then select the job file, enter operator ID, and select particular slots. He/she then clicks RUN. In contrast, OCR systems may read lot ID and wafer ID. The system then finds the associated defect file from the database system, and the sequencer runs the job.

FIG. 4H shows a "Defect File" dialog box for selecting the data format and a defect file. This dialog box appears when the user clicks DEFECT FILE select button in the in Job Wafer Data Input dialog box. Before opening the defect file, a user selects the data format from the list box on either the Selected Defect File dialog box or the Select Site List window, which is depicted in FIG. 4I. In selecting a data format, a user deselects any previously selected defect file and removes its contents from the Select Site List (FIG. 4I) window. The user then deselects the active wafer map. The most recently selected data format is usually the default. Therefore, it is normally unnecessary to reselect the data format. Selecting the Defect File Initially, the defect file is the previously selected file. A different defect file may be selected in any of the following ways: (1) by typing the name of the defect file in the Defect File text box and then click OK; or (2) by selecting the defect file from the list of files and then clicking OK (or, double-clicking the defect file name). The list contains the names of defect files contained in the default source directory for the selected data format.

When a defect file is selected, any previously selected defect file is deselected and its contents are removed from the Select Site List window, which displays the contents of the newly selected defect file. The first site list is automatically selected in the defect file.

FIG. 4I shows a Select Site List window. From this window, a user can select the data format if not already chosen, select a defect file to review if not already chosen, view the defect site lists available for review in the defect file, preview the contents of a defect site list in a Wafer Map area, and click OK.

When a defect file is selected, the Select Site List window displays the site lists associated with the selected defect file. The Lot ID and Process ID for the selected defect file also displays.

There are three columns of information in the site list display (FIG. 4J). These columns include wafer ID, Inspection, and Site Count. A user can select a desired site list. Descriptions of these columns are listed in the table of FIG. 4K.

Returning back to the Sequencer process diagram in FIG. 4C at step 457, the sequencer next causes an information dialog box 464 to be displayed, and the user checks to confirm that the system is ready for use. The wafer is then loaded (e.g., from a cassette) at step 458. At decision step 459, the sequencer determines whether alignment training is to occur. This could be done automatically based on job parameters, system, and/or system configuration, or alternatively, it could be based on user input. If alignment training is to occur, then at step 460, the sequencer initiates alignment training (e.g., via an alignment training wizard) and executes the job recipe(s) to perform defect analysis. Conversely, if training is not to occur, then at step 461, the wafer is aligned (e.g., with pattern recognition) and the job is run.

With reference to FIG. 4L, an Information dialog box displays when the user clicks RUN on the Job Wafer Data Input dialog box. The user defines the information displayed in this dialog box in the job-builder. This warning box tells the user the initialization steps needed (e.g., gas injection system heating, source on, etc.) before running the job. When the user clicks OK, the dialog box closes and the sequencer runs the job. The first step is loading a wafer. If a wafer is already loaded, the dialog box of FIG. 4M with its included message appears. When the job completes, a Job Complete box such as that shown in FIG. 4N is displayed.

4. Defect Explorer

Figure 5:
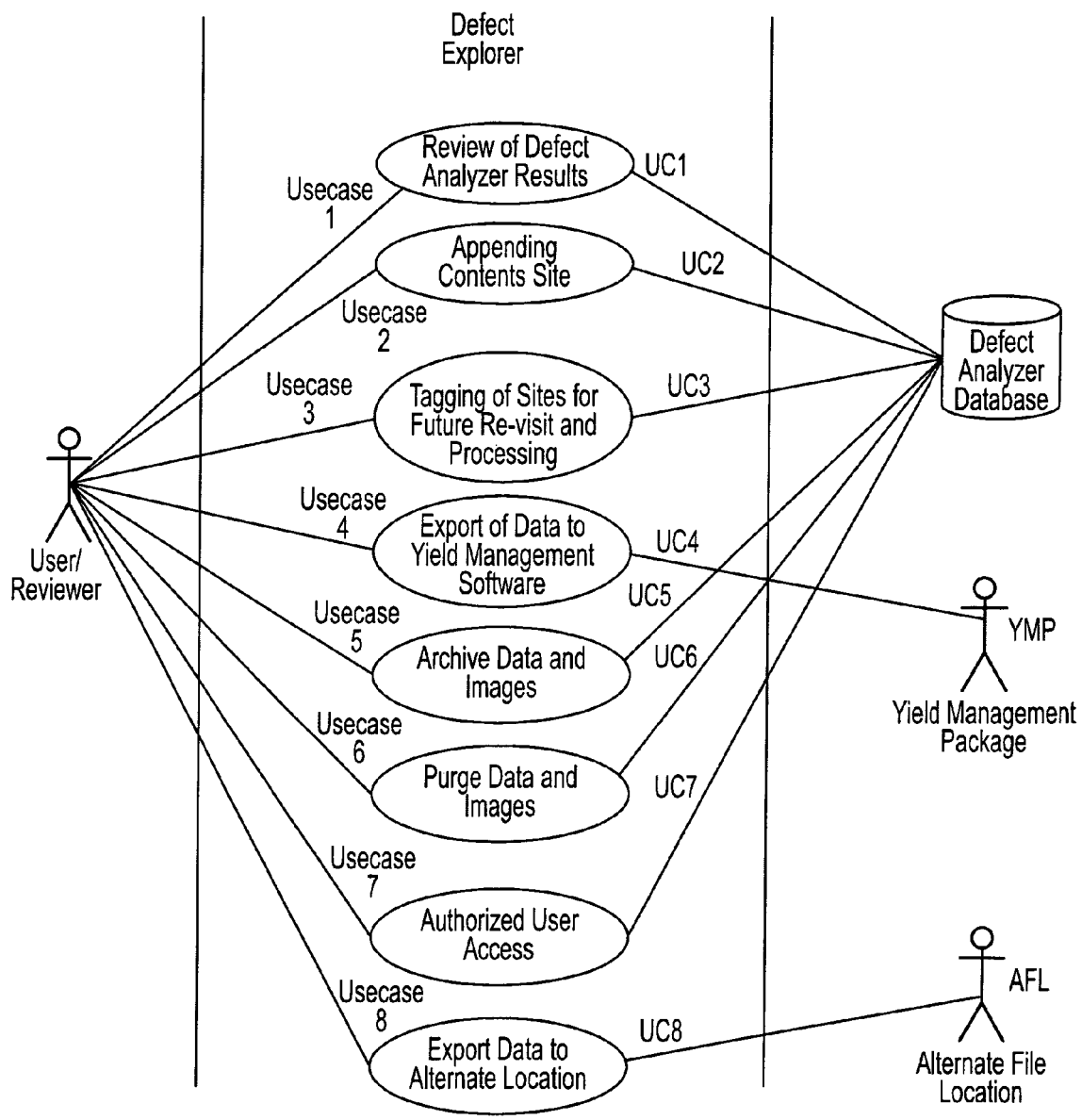
FIG. 5 shows a block diagram illustrating different use cases that can be implemented with one embodiment of a defect explorer.

With reference to FIG. 5, the defect explorer allows users to perform various tasks in different use cases including reviewing stored images, reviewing modified defect files, setting tags for revisiting physical defect sites for processing, and automatic defect relocation validation. It also provides a user interface to database system 111 for reviewing data and Images of a defect. It helps user/reviewers navigate the database system, thereby facilitating convenient review, as well as the filtering and exporting of relevant site data to, e.g., yield management systems. In addition, it serves as a tool for reviewing the results of jobs performed by the defect analyzer.

The defect explorer can be used by users to export selected annotated images (single image or multi image file), defect files, and their corresponding site information to external systems such as yield management systems. Images and defect files can be grouped and uploaded, and the database system can be updated with information, e.g., the images and site details of a wafer that have been exported. A defect file my also be created having information of the sites selected with links to the images of the sites that are associated with it. The exported data (which can be in any suitable format such as KLARFF) could relate to a single wafer or multiple wafers. Defect files may be generated per wafer-job combination, and the files can be exported to configurable directories. Within the screen interfaces, users could then view all the details that are ready to be exported. In this way, the user is able to purge data that may not reveal much information about the defect at a particular site. The user can purge the results of DA with data and corresponding images deleted at job level. Another use of the defect explorer is for implementing ADR validation, which is addressed below in the ADR section.

Figure 6A:
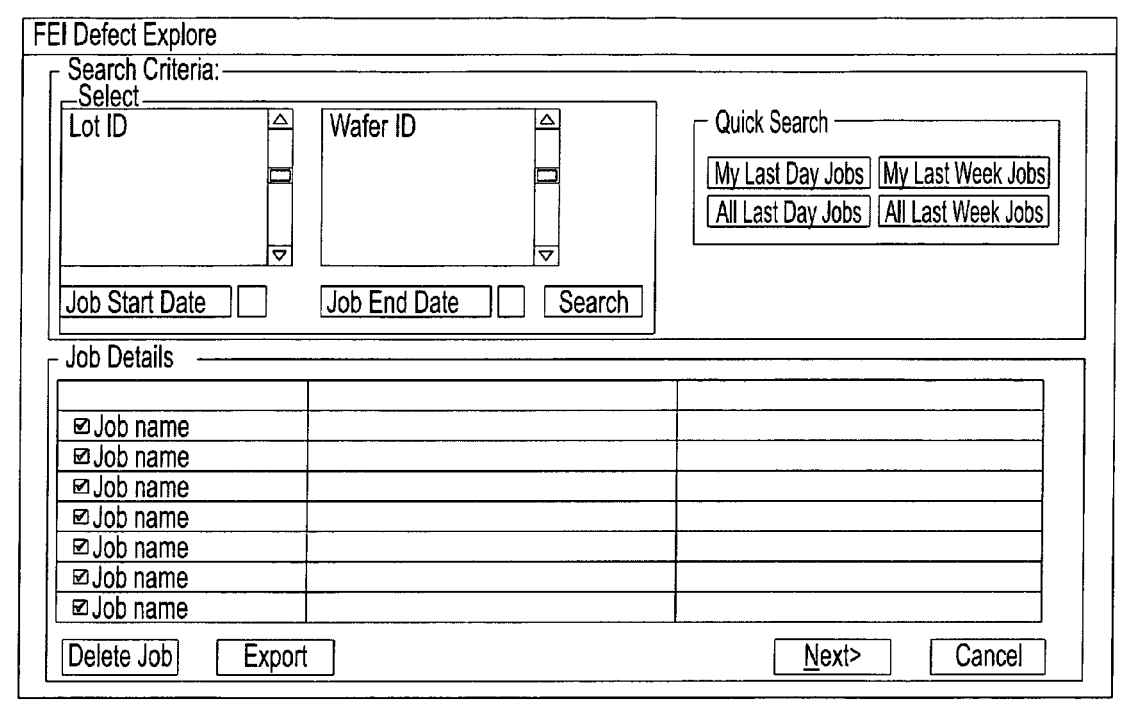
Figure 6B:
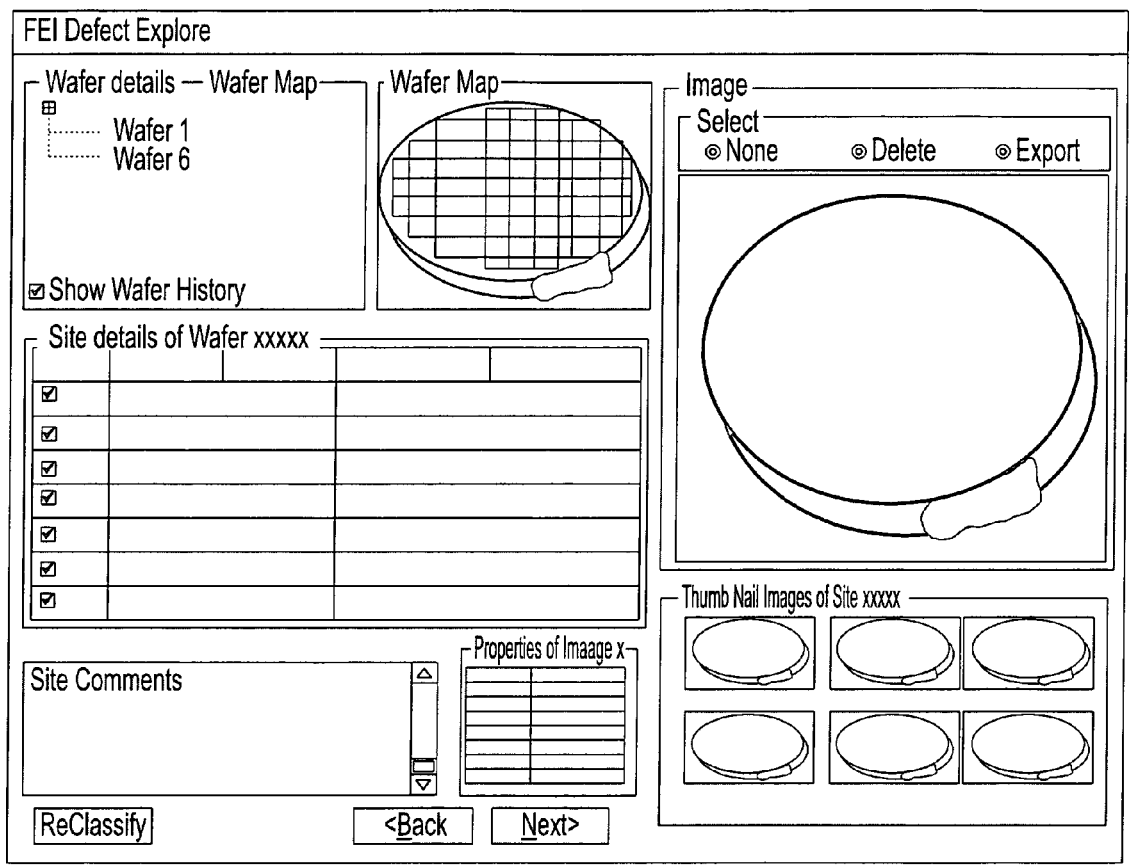
Figure 6C:
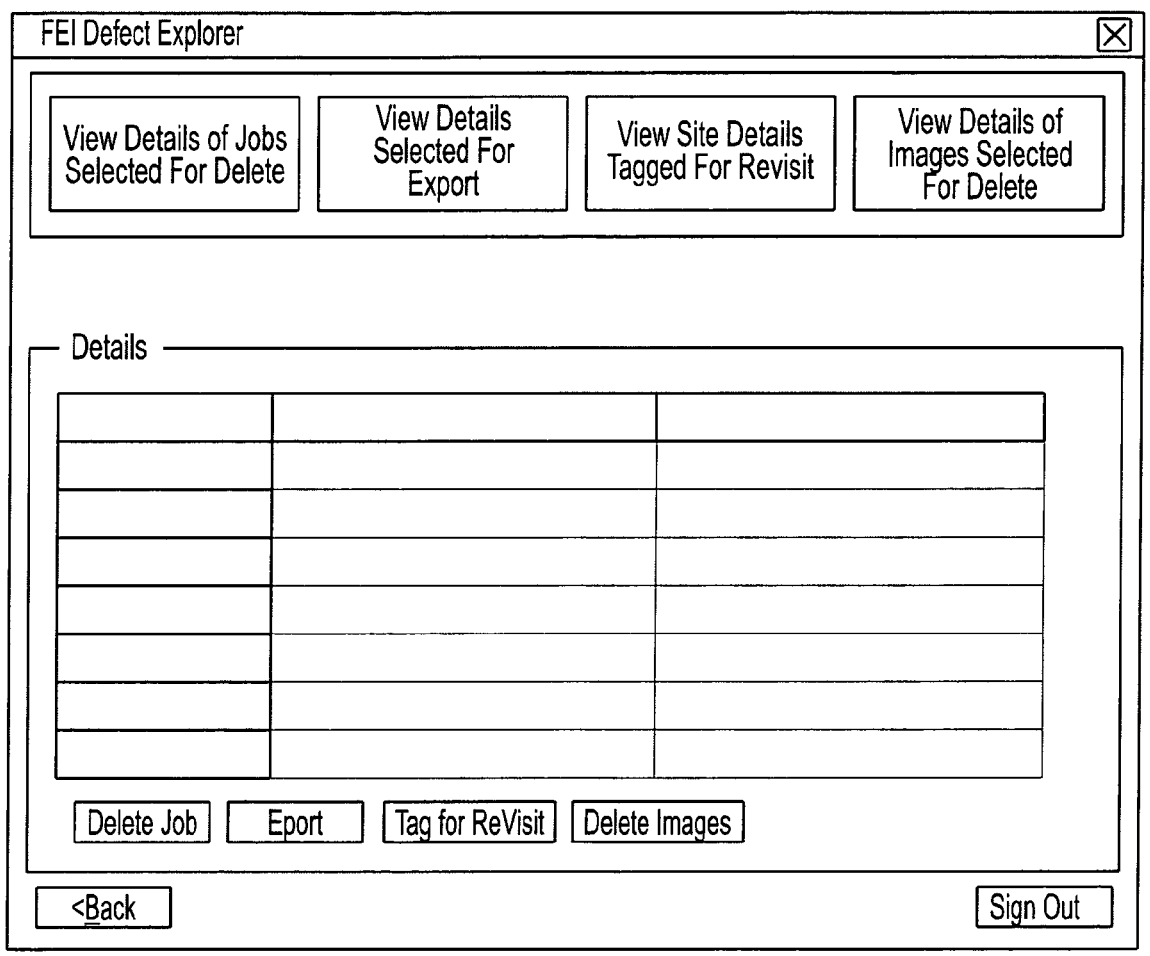

FIGS. 6A through 6C show screen interfaces for one embodiment of a defect explorer. In the depicted embodiment, the defect explorer interface is separate from that of the defect analyzer application. In this way, it can readily be run on a remote interface, as well as from the defect analyzer system. The defect explorer user interface allows users to navigate through the contents of the defect analyzer and database system, and authentication of user credentials is provided.

With reference to FIG. 6A, users can select a job for review based on any one or combination of search criteria including Lot ID, Wafer ID, and Date. A user can select multiple jobs, and jobs run between certain dates for review. For jobs searched or selected based on certain criteria, corresponding wafer information can be displayed. The information may include Wafer ID, Lot ID, Slot, and Defect file name information. On selection of wafer history, information of the sites in the selected wafer can also be displayed. Information regarding all the sites on the selected wafer in a job may also be displayed. For example, images corresponding to the selected (single) site can be displayed as thumbnails with appropriate names and in the order in which they are grabbed by the microscope. The user is able to change the classification of the defect, and the selected site for review is highlighted.

Images displayed as thumbnails can be electron beam images, ion beam images, or they can also be from Slice & View, EDS Spectra, EDS Spectrum and EDS Spot map. Slice and view images of a particular site can be displayed like a movie in the order in which they were taken. The images can be of any format (e.g. TIF, JPEG, BMP). The selected thumbnail image can be displayed in full size with annotation, and the user may be able to save/download one or more slice and view images to the local machine.

Users can also add comments for the site based on images. The added comments are saved into the database (e.g., in the defect file) corresponding to the site. Comments can be to reclassify the defect, changing the X, Y positions and to relocate the defect. Identity and comments of the reviewer can also be saved. Users are also able to modify the comments for a site.

FIG. 6B shows a wafer site map interface screen from a defect explorer interface. The wafer map page has all the information about the sites of a selected wafer in a job. This information can be gathered from a defect file or database. Based on the site selected on a wafer, the wafer map section can highlight the corresponding site in a different color. Users can tag (mark or list) sites for revisiting or for future processing. The updated images are to be stored along with the current images along with comments if any. Tagging can also be used to define which recipes need to be run on the site for further processing. Tagging comments of a site may be written into a text file or into database. A new defect file can be generated having site details that are marked for revisiting. The database system 111 can also be updated to indicate that site details of a wafer are marked for revisiting. FIG. 6C shows an interface that allows the user to view various details and to delete a job, export, tag for revisit, or delete images.

5. Tools

Some exemplary tool components will now be described. Tool components comprise software for providing a suitable user interface to a user for controlling the particular tool. They also include code objects or object calls for controlling the relevant hardware devices (e.g., E-beam, I-beam, stage, gas injection probe) for performing the function(s) assigned to the tool.

a) AutoDieCoincidence

Because in one embodiment, the electron beam and the ion beam are in the same vertical plane but the one beam is approximately vertical and the other beam is tilted, there is a point at which the two beams will intersect. By raising or lowering the stage so that the point of intersection is at the surface of the wafers, the two beams can be made coincident. Because wafers typically have warp and thickness variations, when the stage is moved in the X or Y direction, the top surface of the wafer will be at a different height from the beam optical columns, and the beams will no longer be coincident. In a preferred embodiment, a sensor, such as a capacitive sensor, measures the distance from the stage to the ion or electron beam column and raises or lowers the stage to maintain a constant difference so that the beams remain coincident.

The AutoDieCoincidence tool helps a defect analyzer find beam coincidence at a defect site by reusing coincidence data established for other nearby sites. It is typically used in job builder configuration and sequencer run modes. If a user examines multiple defects within a small area, processing can be streamlined by instructing the defect analyzer to reuse the coincidence information at all sites within that area.

Figure 7A:
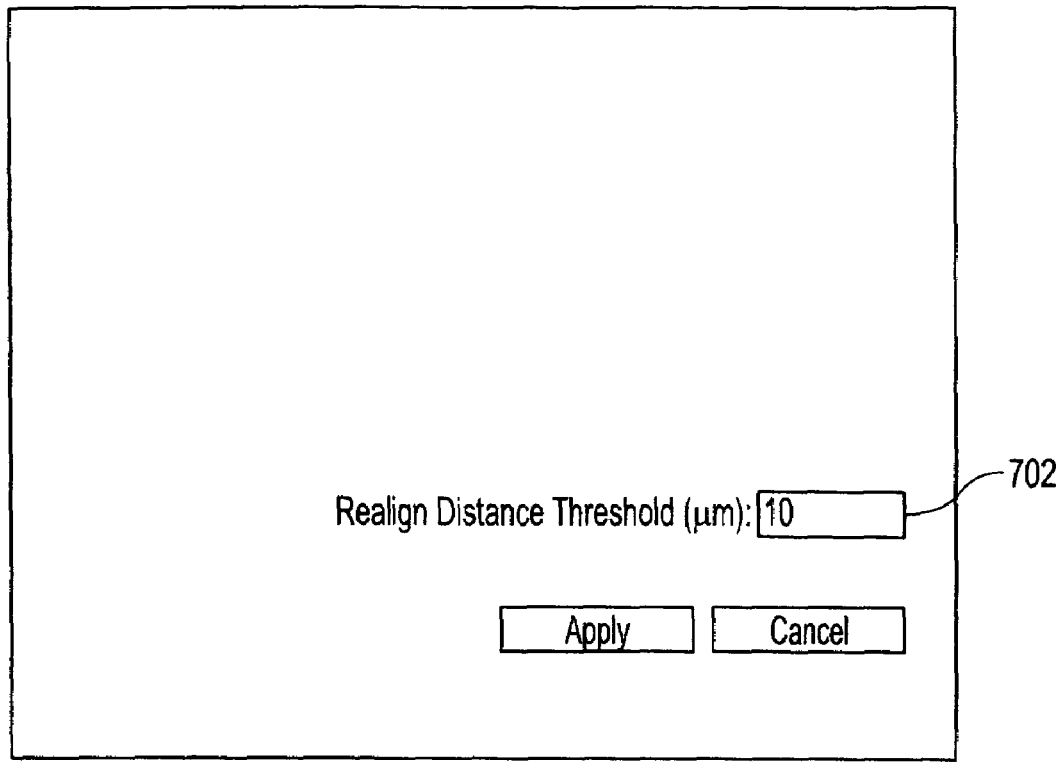
FIG. 7A shows an exemplary window for an auto-die coincidence tool.

FIG. 7A shows an exemplary window that appears when the AutoDieCoincidence tool is selected. It has a Realign Distance Threshold field 702, which indicates Radius of a circle within which the defect analyzer reuses coincidence information. In one embodiment, for desired results, a number equal to or greater than the diagonal of one die should be used. The following formula describes this condition:

$$\text{Threshold} \geq \text{DiePitch}X^2 + \text{DiePitch}Y^2$$

Figure 7B:
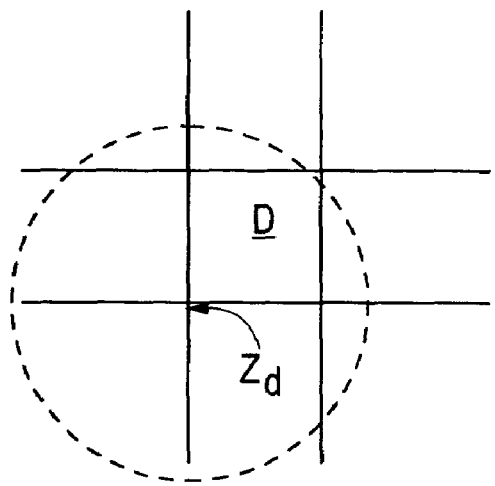
FIG. 7B is a graphical drawing of a die showing an exemplary auto-die coincidence threshold region.

With reference to FIG. 7B, the defect analyzer ordinarily establishes coincidence at the lower left corner, Zd, of a die, D, and records the X, Y, and Z coordinates for the point where the beam contacts the wafer surface. For most wafers, the Z value set at this point can be used to establish coincidence at all sites within the specified radius, or realign distance threshold. When the auto-die coincidence tool is being used, the defect analyzer uses the measured Z value at this point for establishing coincidence on other sites within the circle having a radius corresponding to this threshold and positioned within the die proximal to the measured Zd point. For example, in one embodiment, when the auto-die coincidence tool is active, the system would use the measured Z (height) for establishing coincidence at all points within the depicted hashed circle, which has a radius that corresponds to the diagonal length of the die, D. The auto-die coincidence tool is useful whenever processing multiple sites within a single die or equivalent area.

In the depicted embodiment, the auto-die coincidence tool should be run before the fiducial tool. In addition, in some systems, for the auto-die coincidence tool to function correctly, an image may initially be trained. The image for both beams can be trained using a navigation tilt function.

b) CalAlign Tool

Figure 8A:
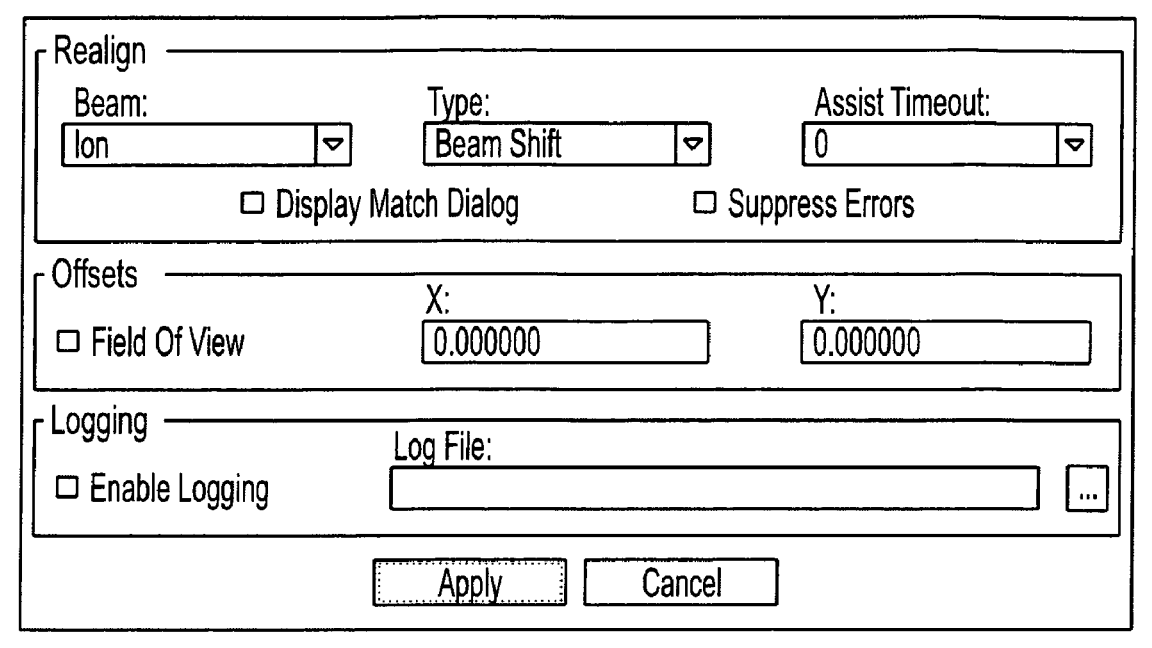

FIG. 8A shows an exemplary screen interface that appears when the Cal Align tool is selected, and FIG. 8B is a table of its command and field descriptions. The CalAlign tool realigns a region of interest after fiducials are milled, using a stage move or beam shift. The region of interest is typically aligned in the center of the field of view, which is at an appropriate magnification. For calibration purposes, an additional option may be available for measuring the offset between the center of the image and the center of a fiducial.

In the depicted embodiment, the CalAlign tool operates in concert with a Fiducial tool. That is, a fiducial (or equivalent) should be milled before the CalAlign tool can be used. When used, the pattern recognition parameters set in the Fiducial tool may affect how well the CalAlign tool finds the fiducial.

The CalAlign tool can be coupled with the Auto Script Tool in order to gather calibration data. For example, the ion beam may be set to an aperture of 50 pA. The CalAlign tool would measure the location of the fiducial. The Auto Script tool changes the aperture and performs an ACB (Automatic Contrast and Brightness adjustment). The CalAlign tool now measures the distance between the image center and the fiducial, whose location will change due to the misalignment of the apertures. This process is repeated, and the collected data can be used to align the apertures. In addition the alignment process is used with accelerating voltage changes, GIS shift, resolution and field of view shift (between Ultra High resolution for defect characterization and lower resolution for searching), and electron beam spot size shift calibrations can be performed in a similar manner. A recipe to find the eucentric height automatically could also be created.

Figure 8C:
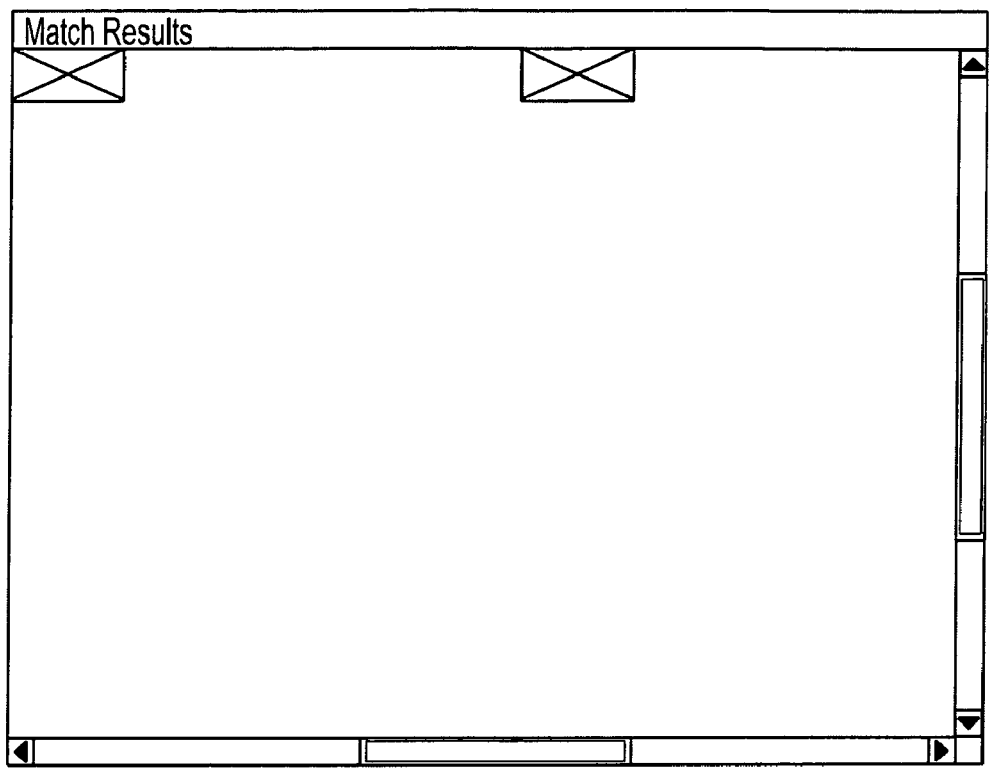
FIG. 8C shows match results from the cal-align tool.
Figure 8D:
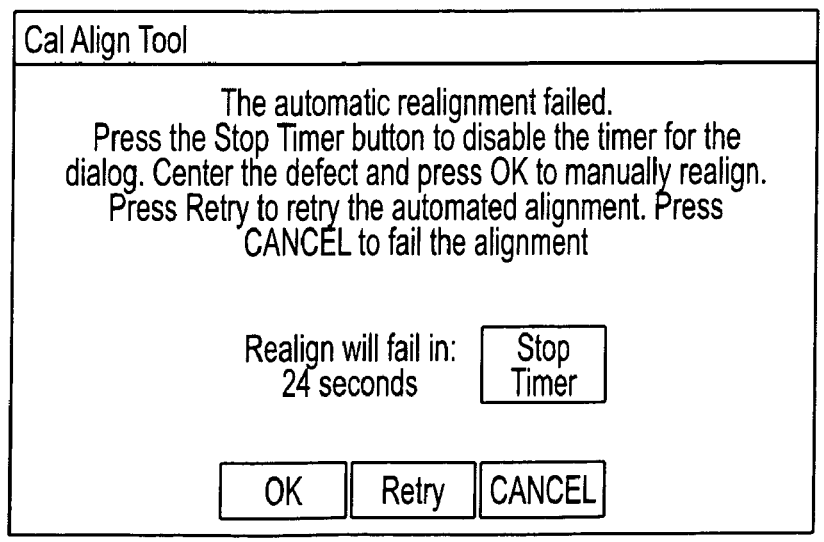
FIG. 8D shows an exemplary screen interface returned when no matches were found.

When DISPLAY MATCH DIALOG is selected, the system displays a match results in an Image Match window, which is shown in FIG. 8C. When a number other than 0 is entered in the in the ASSIST TIMEOUT field, a dialog box (such as that shown in FIG. 8D) appears when image recognition fails. The dialog box remains on screen for the number of seconds specified in ASSIST TIMEOUT. When this dialog box appears, three options are available: (1) a user can try automatic alignment again by clicking RETRY; (2) if the user desires additional time to realign manually, it can select STOP TIMER, then center the defect in the field of view and click OK.; and (3) if the user desires to terminate alignment, it can click CANCEL.

c) Cross-Section Tool

Figure 9A:
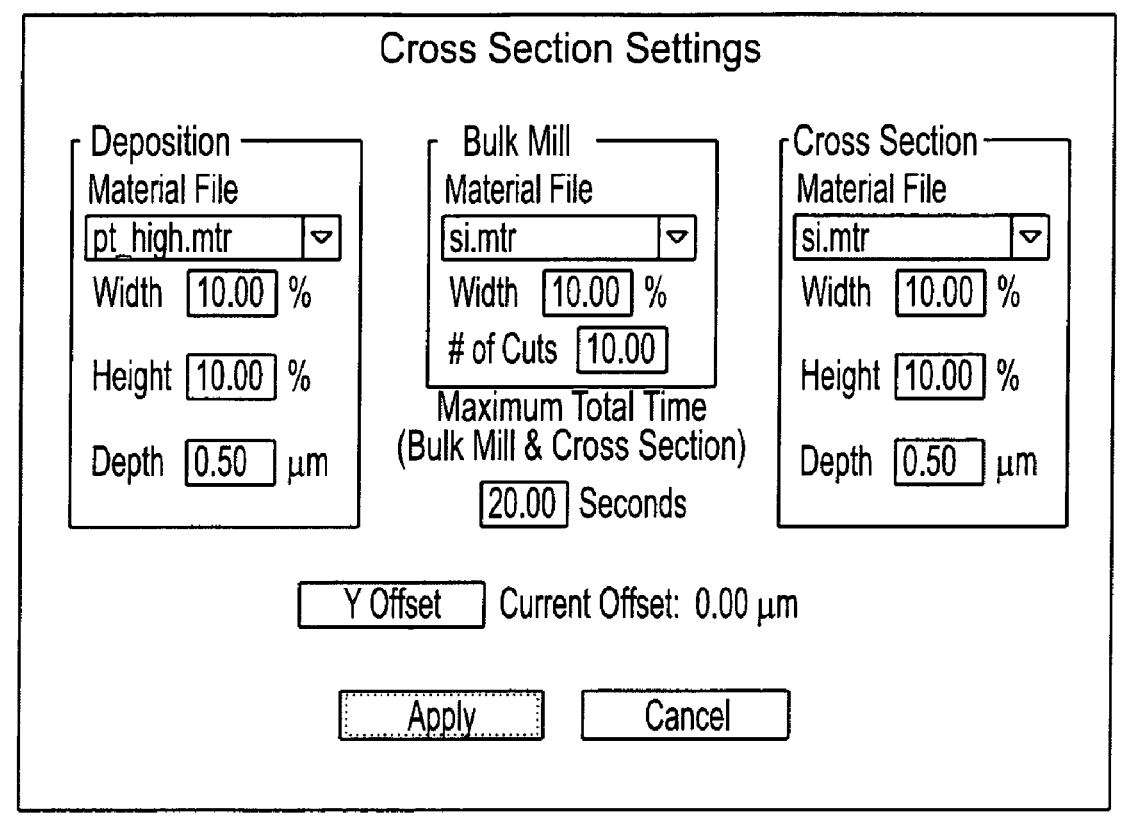

FIG. 9A shows a cross-section tool screen interface, and FIG. 9B is a table of its command and field descriptions. Controls common to each group are listed first, followed by those unique to a particular group. Using the field of view set by the Fiducial tool, the cross-section tool controls the dual beam apparatus for creating complete cross sections for various processes including metal deposition, bulk milling, and cross-sectional cleaning. One feature of this tool is that it automatically determines appropriate beam settings based on relevant task parameters. In the depicted embodiment for the deposition and cross-section patterns, X and Y dimensions are user-specified as a percentage of the field of view, and the depth is specified in microns. For the bulk mill, the width is user-specified as a percentage of the field of view, with the height and depth (Y and Z) calculated by the defect analyzer system.

The Cross Sectional tool steps through patterns selected in the cross-section tool user interface. Each time an aperture changes or a GIS needle is inserted, the system automatically realigns to the fiducial mark.

The Y offset is the upper boundary of the cross section. The default location for Y offset is 0 μm, or the vertical center of the field of view. To redefine the upper boundary of the cross section, a user clicks the Y OFFSET option. The system displays a yellow line in the image quadrant, which marks the cross-section target line, and the following dialog box.

To redefine the cross-section target, users can click in the image quadrant at the point where the cross section is to end. The system displays the bulk mill and cross-section patterns in the image quadrant and updates CURRENT OFFSET in the cross-section tool interface.

The bulk cut is a combination of the stair-step pattern and a cleanup cut. The stair-step pattern comprises small strips (rectangular boxes). The cleanup cut is performed to remove any re-deposition and to reshape the front edge to facilitate a better cleaning cross-section.

In the depicted embodiment, in order to properly operate the cross-section tool, the Fiducial tool should be run prior to the Cross-section tool. The Fiducial tool determines the size and location of the defect and sets the field of view. The sizing of the milling patterns is based on this field d) Fiducial Tool After the defect is initially located, it is useful to provide one or more a reference marks so that the defect can be readily found again for subsequent processing. A reference mark or "fiducial" is preferably milled using the ion beam after the defect is initially located. In one aspect of the invention, fiducials containing defect identification information are implemented. For example, the fiducial can be made of a size that varies with the size of the defect, that is, a large defect may be marked by a large fiducial. In addition, the fiducial can be made of a shape that is readily distinguishable with image recognition software and may vary so as to stand out from the surrounding features. The fiducial is preferably not rotationally symmetric so that the orientation of the fiducial can be determined upon subsequent inspection. To be practical, the shape of a fiducial should be millable by an ion beam. Multiple fiducials may be milled if more accurate orientation alignment is desired.

The fiducial allows the user to return to a defect site so, for example, all defects on a wafer can be characterized using surface imaging and after that information is analyzed, a user could return to defects of interest for additional processing. For example, all defects on a die or on a wafer can be located, their outlines determined, and a fiducial milled by each defect. An engineer can review the statistics of the defects and identify specific defects or classes or defects for additional analysis. The system can then readily relocate the defect by locating the fiducial and knowing that the defect itself is positioned at a fixed offset from the fiducial. The size of the defect also allows the system to automatically set an appropriate magnification value for images when the defect is subsequently revisited. (This is desirable because changing magnification can change the alignment.) By producing fiducials of different sizes, with the fiducial size corresponding to the defect size, the beams can be readily aligned at the desired magnification when a defect is re-located.

The fiducial is also useful even if the system does not leave and return to the defect site, for example, if the user mills a cross section immediately after located the defect. The fiducial can be used to align the ion beam and the electron beam with each adjustment of beam parameters and to adjust the beams for drift. Some of the events that can cause a realignment to be desired are described above with respect to the CalAlign tool. Using the defect itself to repeatedly align the beams would damage the defect making the subsequent characterization less accurate.

In many applications aligning the beam is required, for example, when a gas injection needle is inserted or removed. It is common to use ion beam deposition to deposit a pad of a protective material, such as platinum, before milling a cross section. To deposit a material using an ion beam, it is necessary to position a gas injection needle close to the beam impact point on the work piece, so that the precursor gas deposits on the work piece surface. Inserting and removing the metallic gas injection needle can affect the electric fields near the sample and can alter the positions of the beams. By providing a fiducial near the defect, the beams can be aligned on the fiducial before and after the gas injection needle is inserted so that the position of the beams remain unchanged and the beams remain aligned regardless of the needle position.

Figure 10C:
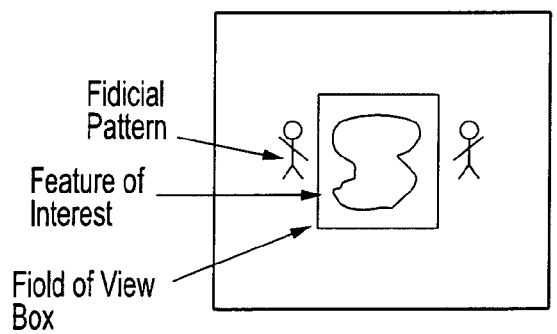
FIG. 10C shows an exemplary fiducial tool icon in an image quadrant of a defect analysis screen interface.
Figure 10D:
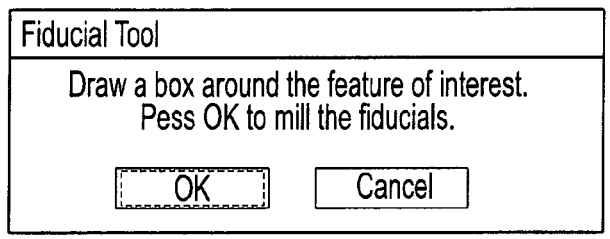
FIG. 10D shows an exemplary information dialog box for one embodiment of a fiducial tool.
Figure 10E:
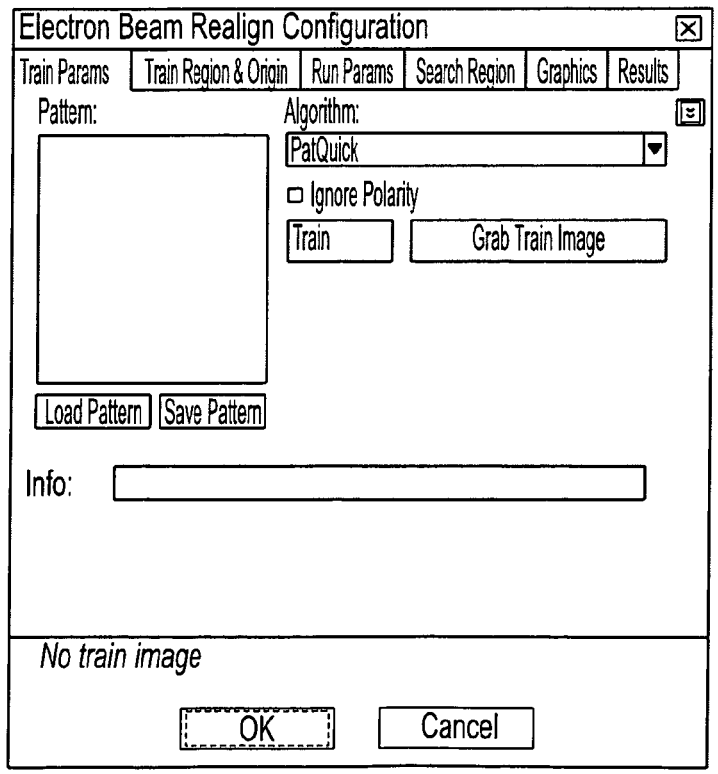
Figure 10F:
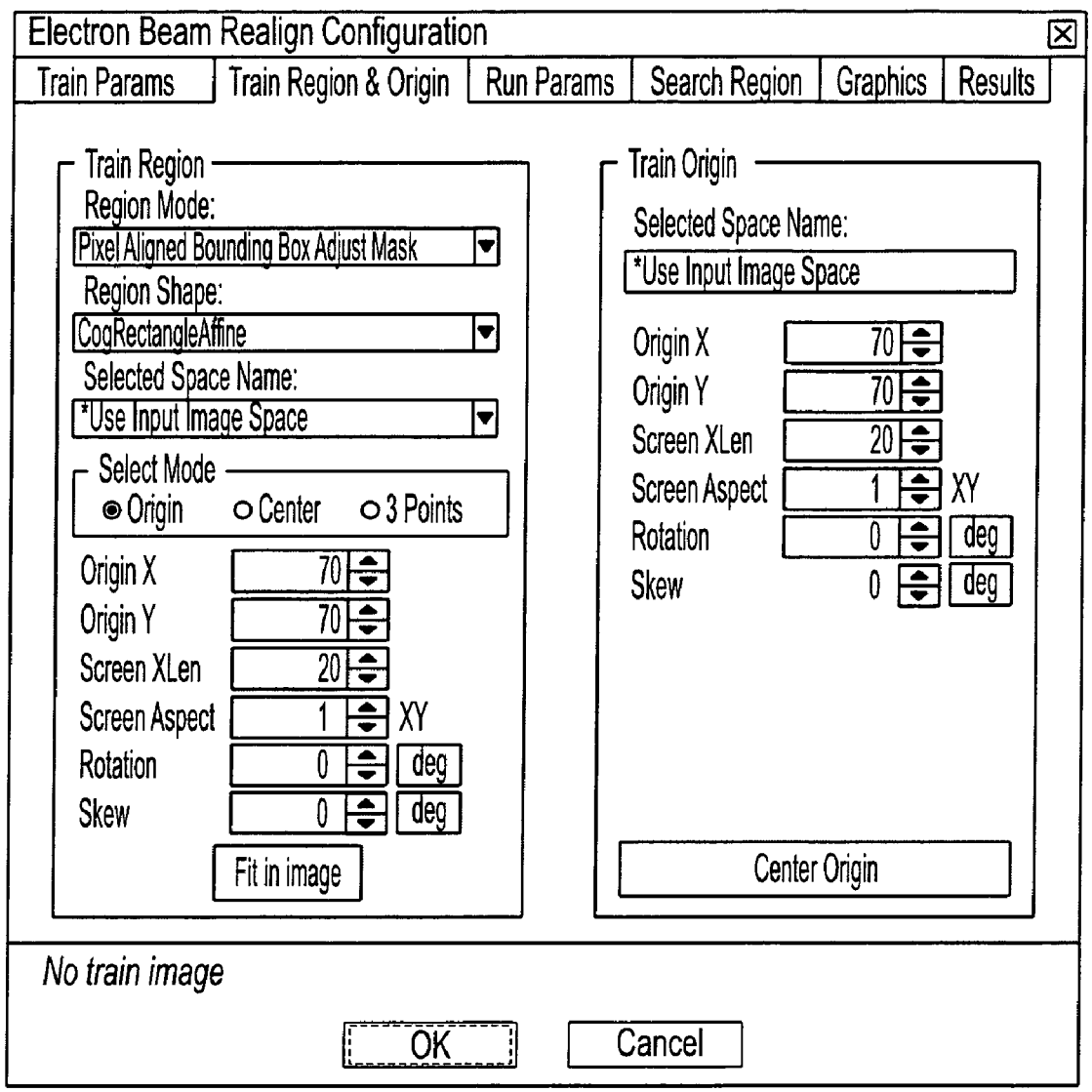
Figure 10H:
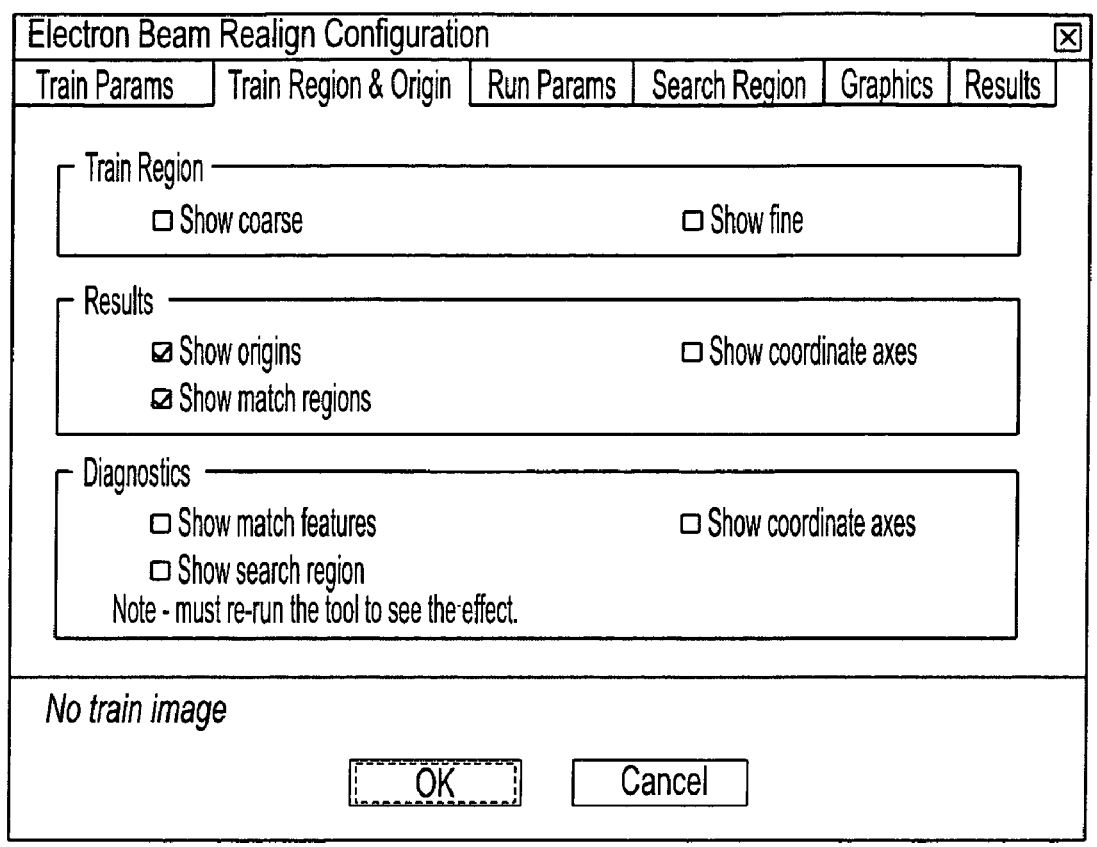

FIG. 10A shows one embodiment of a fiducial tool window that appears when the fiducial tool is selected, and FIG. 10B is a table listing its command and field descriptions. The Fiducial tool sets the field of view and mills fiducials for realignment, using a user-specified bitmap as the milling pattern. When the Fiducial tool is run, the defect analyzer displays the fiducial pattern in the image quadrant, such as the one shown in FIG. 10C. At the same time, the system displays an information dialog box, such as the one shown in FIG. 10D, which instructs the user to draw a box around the feature of interest. With the arrow tool, a user can draw a box around the feature of interest and then click OK in the dialog box. Once the area is selected, the system recenters the site and sets the magnification as specified. If the combined parameters for defect size, fiducial size, and fiducial offset are such that the fiducial will overlap the defect or extend beyond the field of view, the system warns the user and allows it to correct the situation. The tool then mills the fiducial, grabs one image with each beam, and reestablishes beam coincidence.

The field of view established by the Fiducial tool, along with images captured after milling, may subsequently be used by other tools run on that site, such as the Realign tool or the cross-section tool.

When the user clicks "Configure EBeam Realign," "Configure IBeam Realign," "Configure EBeam BMP Realign," or "Configure IBeam BMP Realign," a Realignment dialog box (FIG. 10E, FIG. 10F, FIG. 10G, FIG. 10H) appears. (FIGS. 10E through 10H show the different dialog box displays, depending upon the selected tab.)

The Realignment dialog box (FIG. 10E, FIG. 10F, FIG. 10G, FIG. 10H) contains different panel tabs including a "Train Params" tab, a "Train Region & Origin" tab, a "Run Params" tab, a "Search Region" tab, a "Graphics" tab, and a "Results" tab.

e) Realign Tool

Figure 11A:
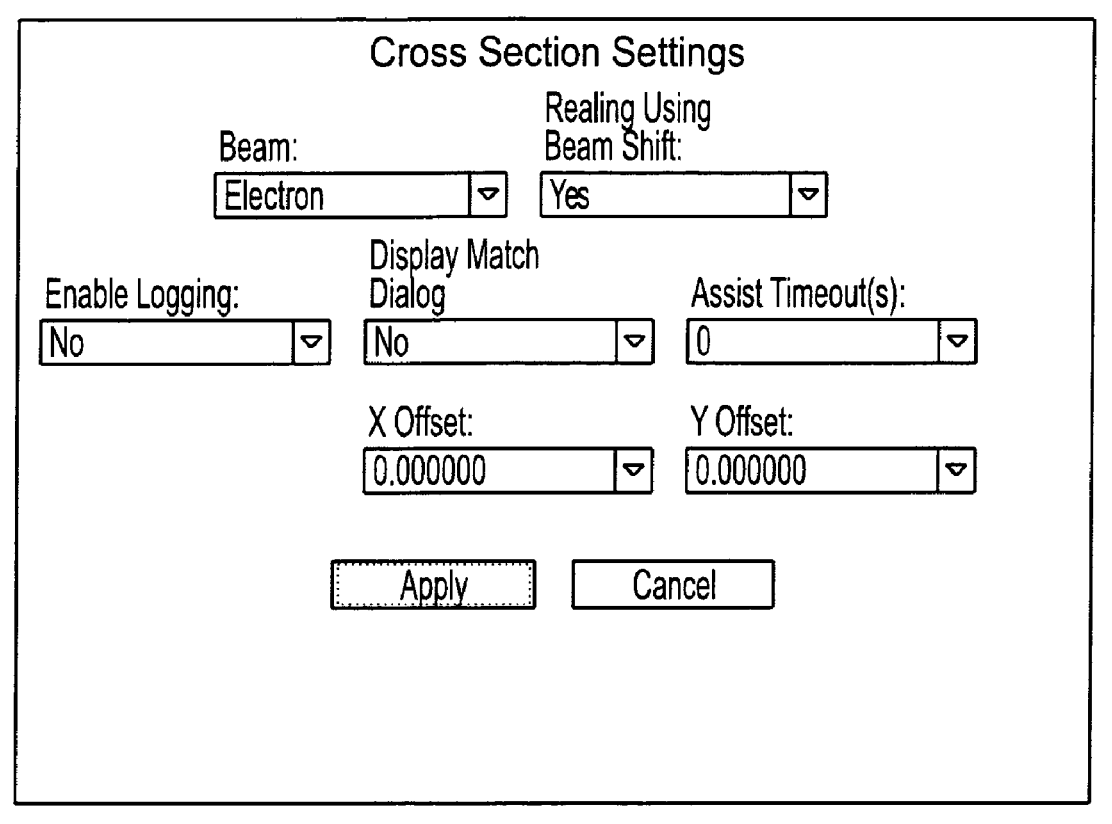

FIG. 11A shows an exemplary screen interface for a Realign tool, and FIG. 11B shows a table of its command and field descriptions. The Realign tool recenters the region of interest after the fiducial(s) is/are milled. This tool can be used to establish beam coincidence and center the defect in the field of view. A user can run the Realign tool prior to running any pattern tool to ensure that patterns are precisely located in relation to the fiducial mark(s). When the apertures are changed or whenever it is believed that the fiducial mark may have drifted, for example, when a GIS needle is be inserted or retracted, the realign tool can also be used to realign the electron beam with stage moves and realign the ion beam with beam shift.

f) EDS Tool

The EDS tool gives the user a method to manually (or automatically) collect an EDS spectrum, associate that spectrum with the current site, and add it to the database. (This is an extension of the pause tool.) During run mode, the EDS Tool dialog box provides the user with specific information to collect an EDS spectrum before continuing automated processing. The EDS tool will typically be used to characterize defects where the materials are unknown. In one implementation, a default directory is configured for saving the images from the EDS software. The EDS tool then grabs the spectrum images from this directory and puts them into the database.

Figures 12A, 12B:
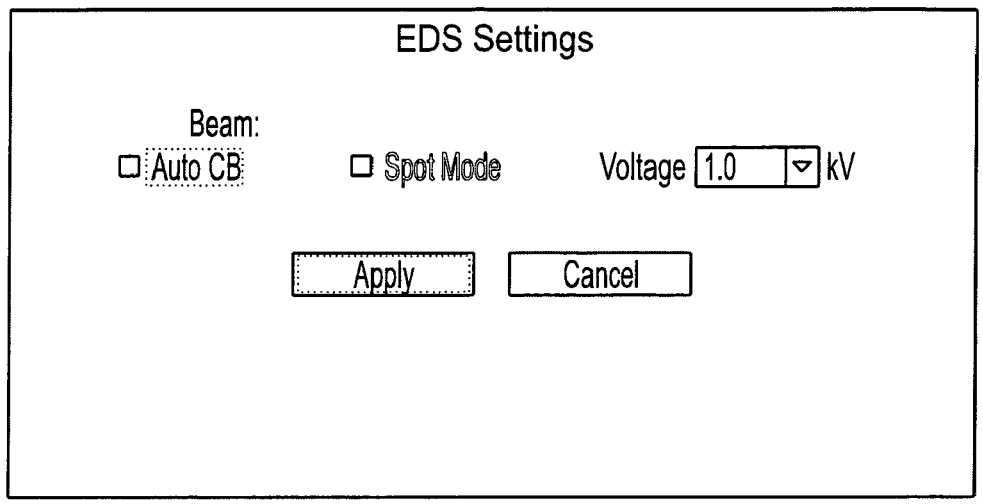
FIG. 12A shows a screen interface for one embodiment of an EDS tool in a job builder configuration.
FIG. 12B is a table of command and field descriptions for the screen interface of FIG. 12A.
Figures 12C, 12D:
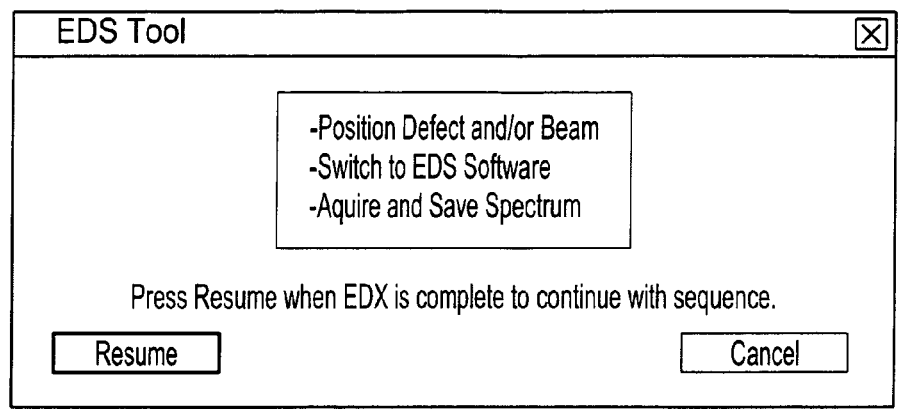
FIG. 12C shows a screen interface for one embodiment of an EDS tool in a run-time (sequencer) configuration.
FIG. 12D is a table of command and field descriptions for the screen interface of FIG. 12D.

FIGS. 12A and 12C show exemplary screen interfaces for an EDS tool in job configuration and run-time (sequencer) configurations, respectively, and FIGS. 12B and 12D are tables listing their command and field descriptions. The job builder interface (FIG. 12A) allows the user to set up the conditions under which the EDS spectrum will be acquired. The user is able to configure ACB, spot/scanning mode, and accelerating voltage. The runtime interface (FIG. 12C) is simply a dialog box with instructions and buttons to continue processing. The text is typically not modifiable during runtime. If the user selects cancel, they will be presented with another dialog asking if they want to fail the site. If yes is selected, the site will fail. If no is selected, the user will return to the EDS tool runtime interface.

During runtime, at the prescribed point in the sequence the EDS tool runtime interface is displayed. In this way, the user can switch to the EDS system, acquire a spectrum, and then continue processing. A spectrum can then be collected, or the site may be failed, which would show in the grid that the site failed, and abort further processing at that specific site and move to the next site. If the entire job is to be aborted the user can use the "abort" button in the sequencer.

g) Get System Settings

FIG. 13A shows a screen interface for a "Get System Settings" tool, and FIG. 13B is a table listing its command and field descriptions. The Get System Settings tool lets users save a "snapshot" of system settings. The "Set Settings" tool can then be used to restore the settings that have been defined. This tool can be used in conjunction with the Set Settings tool to define, then restore, a snapshot of system settings. These tools can be used before and after any event that is likely to change system settings, such as another tool or a manual change of settings.

h) Grab Image Tool

FIG. 13C shows an exemplary screen interface for a "Grab Image" tool, and FIG. 13D is a table listing its command and field descriptions. The Grab Image tool is used to collect and save images. The tool sets the appropriate system settings, grabs an image, and saves it. The images can be saved in a predefined folder with a standard naming convention file name.

i) MoveDie Tool

The MoveDie tool moves the stage one die closer to the wafer center, using the shortest axis of travel. The tool can be used, e.g., in conjunction with the Get System Settings tool and Set Settings tool to move to an adjacent die, perform a process on that site, then return to the previous location.

j) Pattern Tool

FIG. 14A shows an exemplary screen interface for a "Pattern" tool, and FIG. 14B is a table listing Pattern tool command/filed options with descriptions. The Pattern tool creates a pattern outside of the tools such as cross-sectioning patterns. It can be used for milling, depositing material, or etching.

When the pattern tool is run, the system automatically realigns to the fiducial mark. When run on a site, the system records the beam shift; realigns the system after a GIS needle is inserted and before patterning starts; and returns beam shift to the pre-patterning setting after patterning is completed and the needle is removed. With typical embodiments, the fiducial tool should be run on the site before the Pattern tool is run. The appropriate GIS should also be heated.

k) Pause Tool

FIG. 15A shows a set-up phase "Pause" tool screen interface, and FIG. 15B shows a list of its command/field options and associated descriptions. FIG. 15C shows a run-time phase "Pause" tool screen, and FIG. 15D is a table listing its command/field options with associated descriptions. The Pause tool lets users manually specify actions outside of the defect analyzer user interface. Even when a recipe is automated, users can use the Pause tool to allow operator interaction. Users can also add text to the Pause tool message area to tell the user running a job to perform an action before continuing automated processing. Users can define as many Pause dialog boxes as desired. During a job run, the dialog box (FIG. 15c) displays the message defined by the user (e.g., supervisor user) during setup. The operator user action for the Pause tool is limited to dismissing the pause, either by continuing the sequence or failing the site.

During a job, the Pause tool dialog box appears at the specified point in the recipe. If the supervisor configured the Pause tool to time out during the recipe, the timer will begin the count down. If the operator user does not stop the count, then the defect analyzer automatically dismisses the tool, and the job continues.

The "Pause" tool may be used in conjunction with the Get System Settings and Set Settings tools to record, then restore, desired system settings. To do this, the System Settings tool can be used to get the system state, the Pause tool is launched for manual adjustments. When the task requiring manual adjustments is completed, the user can restore the named set of system settings using the Set Settings tool.

l) Set Settings Tool

FIG. 16 shows an exemplary screen interface for a "Set Settings" tool. The Set Settings tool restores a snapshot of system settings previously defined with the Get System Settings tool. The Set Settings screen interface has a Get Settings Identifier that indicates the set of system settings to be restored.

m) Slice and View Tool

FIG. 17A shows an exemplary screen interface for a "Slice and View" tool, and FIG. 17B is a table listing its command/field options with associated descriptions. The Slice and View tool is an advanced milling and imaging tool. It mills small box patterns and collects images, then repeats the process over a selected area to gather three-dimensional information about subsurface structures. This tool can be used for, cross sectioning, locating and reconstructing a feature in three dimensions, and looking at buried features.

The Slice and View tool can be used for a variety of applications including for depositing a protective coating and for milling a bulk pattern, e.g., to remove material that obscures a feature of interest. It can then grab an image with the electron beam, mill a small box pattern with the ion beam, and grab an electron beam image of the resulting cross-section face. This process of milling and imaging can continue until the entire slice area is processed.

In one embodiment, the slice and view tool can be used once the fiducial tool has been run. The slice and view area is determined by the size of the defect as defined by the Fiducial tool and indicated by the fiducial itself. Slice and view operations are generally centered on the field of view that is used by the fiducial tool with the slice depth being specified with the slice and view tool. The fiducial mark is also used for drift control (re-positioning) and mill location realignment.

Images can be saved in a desired format (e.g., JPEG) in a predefined folder. When the Slice and View tool is run on a site, the system displays milling patterns over the image to indicate where deposition and milling will actually occur. The pattern outlines appear sequentially, just as the patterning for that step is about to begin. With this tool, beam settings are determined automatically and conditionally on the fly based upon FOV/defect size and shape.

n) Auto Script Tool

Figures 18A, 18B:
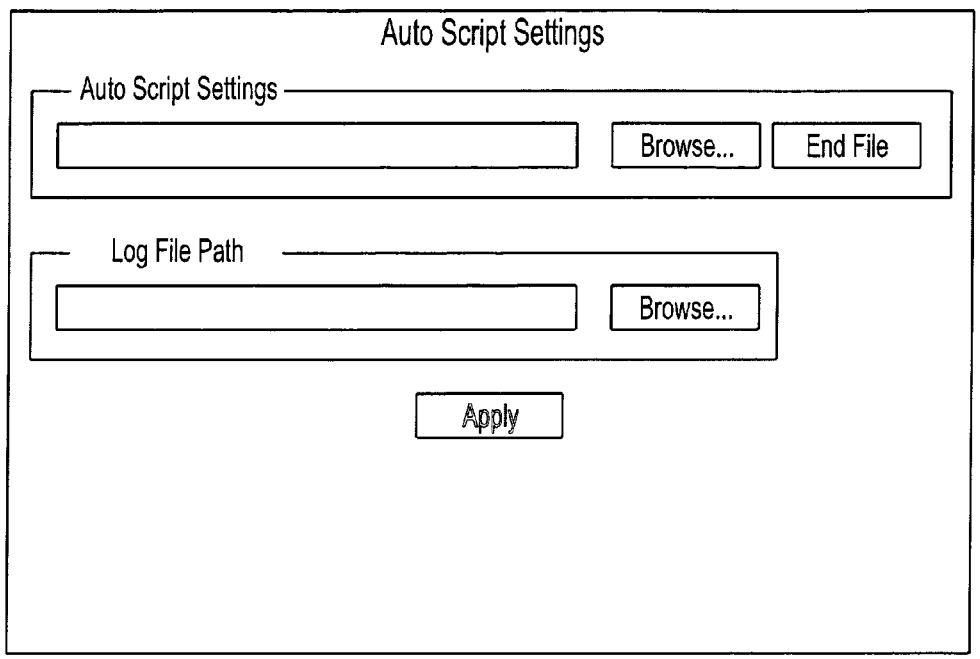
FIG. 18A shows a screen interface for one embodiment of an auto script tool.
FIG. 18B is a table of command and field descriptions for the screen interface of FIG. 18A.

FIG. 18A shows an exemplary screen interface for an "Auto Script" tool, and FIG. 18B is a table listing its command/field options with associated descriptions. The Auto-Script tool provides a general scripting/prototyping tool for quick and easy development of new and unique tools; it also can be used for automating many functions of the defect analyzer system by allowing users to specify scripts and log files. For example, by using this tool, users can write scripts to control milling, scanning, image recognition, stage movement, ion beam current, gas injection, and many other functions.

o) System Settings Tool

FIG. 19A shows an exemplary screen interface for a "System Settings" tool, and FIG. 19B is a table listing its command/field options with associated descriptions. The System Settings tool lets users specify system settings at a specific point in a recipe. The tool can be used to set up the system prior to running any other tool.

p) AutoSlice and EDS Tool

This tool is similar to a combination of the "slice and view" tool and the EDS tool. It provides three-dimensional information about the elemental composition of the defect. At a site where the two beams are aligned, a buried feature is repeatedly sectioned with the ion beam to expose fresh surfaces. After each section is cut, the electron beam is used to gather EDS elemental data from the exposed surface. This data can be assembled to provide three-dimensional compositional information about the buried feature. The size of the cross section, the beam conditions and the EDS collection parameters can be automatically set based upon the size and shape of the defect.

6. Automatic Defect Relocation

With reference to FIGS. 20 through 23, one embodiment of an automatic defect relocation ("ADR") tool with characterization and recommendation will now be discussed. The ADR tool locates and verifies a defect based on its location reported in a defect file and determines the defect size. It then updates system parameters to allow other tools to more efficiently and accurately locates the defect for subsequent operations. For example, it may re-center the defect in a configurable percentage of the field of view ("FOV"), which can enable other automated relocation and processing jobs.

a) Automatic Defect Identification

FIG. 20A shows an exemplary screen interface for an ADR tool. In brief, the depicted ADR tool gathers a reference image (in a die neighboring the die with the defect) and defect image, compares the images to identify (or isolate) the defect, and centers the detected defect, e.g., in a definable percentage of the image prior to exiting.

The ADR tool can store a report of its results for access by the next tool that uses it (e.g., in a job recipe sequence). The ADR tool will typically not execute any stage moves in order to avoid compromising the accuracy of the relocation. Even a beam shift correction might introduce an unacceptable amount of error. In addition, it is desirable to minimize imaging and thus, additional realigns are avoided. Regardless of how the measured defect position is communicated, additional tools such as the mill pattern tools can exploit information about size and orientation prior to attempting a cross section.

Figure 20B:
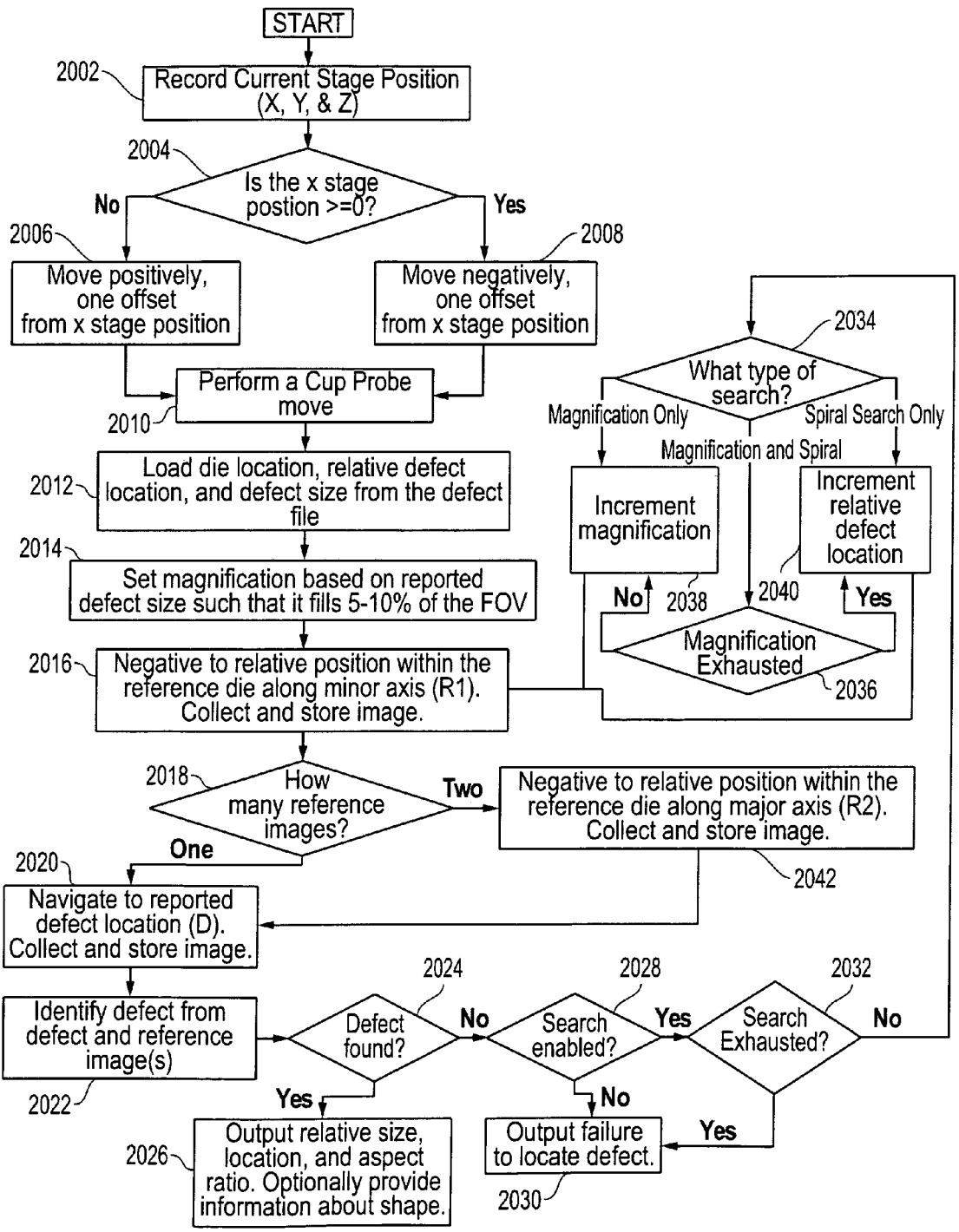
FIG. 20B illustrates one embodiment of a routine for implementing the ADR tool of FIG. 20A.

FIG. 20B illustrates one embodiment of an ADR tool routine of the present invention. Initially at 2002, the tool records the X, Y, Z stage position. It next calibrates the stage position in steps 2004-2010. At 2004, it determines whether the X stage position is greater or equal to 0. If so, then at 2008, it moves the stage one offset position in the negative direction. conversely, if it is less than 0, it moves the stage in the X direction one positive offset position. At step 2010, it performs a capacitor probe move.

Figure 21:
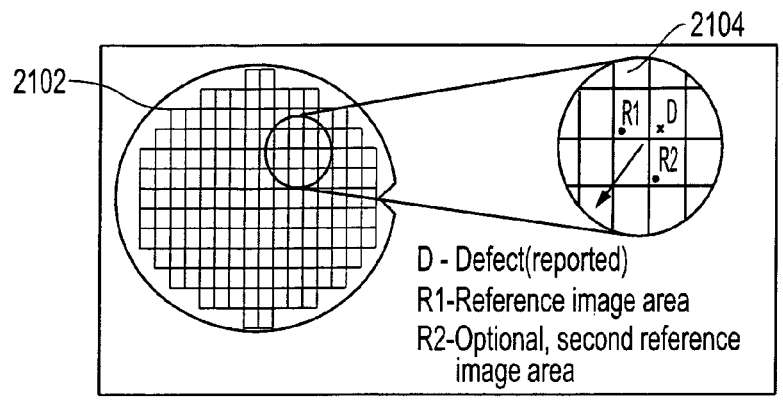
FIG. 21 graphically illustrates a wafer with a plurality of dies including a die having a defect.

Next, at 2012, the tool loads (receives from a defect file) the die location, defect location, and defect size. At step 2014, it sets magnification based on the reported defect image size from the defect file such that the image would be 5 to 10 percent of the FOV. At 2016, the system navigates to a die neighboring that of the defect image and collects a first reference image, R1. (FIG. 21 shows an exemplary defective wafer 2102, along with a magnified image site area 2104.) At determination step 2018, if only one reference image is required, the system proceeds to step 2020 and moves to the reported defect site to take and store a collected defect image, D. On the other hand, if two (or more) references are to be used, the system navigates to a second reference site, R2, (which as can be seen is in another neighboring die to the defect die) to collect and store the second reference image. It then proceeds to step 2020 and moves to the defect site, D, to collect and store a collected defect image.

Next, at 2022, it attempts to identify the actual defect from the collected defect image using the reference image(s). In one embodiment, pattern recognition algorithms may be used in connection with techniques of the present invention to identify the actual defect. (Methods for identifying defects will be discussed in greater detail later in connection with FIGS. 22, 23A, and 23B.) If the defect is successfully identified, then at step 2026, the tool saves and outputs suitable descriptive information about the defect, and the routine is terminated. For example, it may provide the defect's relative size, location and aspect ratio, along with information about its shape. Conversely, if at step 2024, it is determined that the defect was not successfully identified, then the routine proceeds to search and identify the defect. This may involve such techniques as using a configurable field of view search using magnification changes and/or stage moves. Ultimately the ADR tool either outputs suitable descriptive information about the defect, or it outputs an appropriate status message, e.g., that the defect was not found. One embodiment of a suitable search/identification routine will now be described with regard to steps 2028 through 2040.

Initially, at step 2028, the routine determines if a search is enabled. If not enabled, at step 2030, it outputs an appropriate status message (e.g., that "the defect was not found"). If the identification method is enabled, however, then the routine proceeds to step 2032 to determine if a search may be executed (e.g., if it is not exhausted). If it cannot be executed, then the tool outputs an appropriate message at step 2030. Otherwise, it proceeds to step 2034 to initiate an appropriate search. For example, it could implement a magnification search, a spiral search or a combination magnification/spiral search. (The particular search method may be determined automatically based on predefined criteria, or it could be determined via selection by a user through a user interface.) If a magnification search is selected, the routine proceeds to step 2038 and increments the magnification. If a spiral search is selected, then the routine proceeds to step 2040 and increments the relative reported defect location in accordance with a spiral pattern. If a magnification/spiral search is selected, then the routine determines if magnification change options have been exhausted at step 2036. (In this embodiment, if a magnification/spiral search is selected, the routine, in essence, initially performs a magnification search and then performs the spiral search if necessary.) If magnification is not exhausted, then the routine increments the magnification at step 2038. Alternatively, if magnification adjustments have been exhausted, the routine spirally increments the reported defect location at step 2040. Whether or not magnification or reported defect location are incremented, the routine loops back into the initial section at step 2016, and the system proceeds as previously described except with a different magnification and/or reported defect location. This continues until either the actual defect is identified and outputted or until the search is exhausted without the defect being located.

b) Automatic Characterization

After the defect is located, it is automatically characterized. Characterization can include forming "top down" images of the surface of the defect by using the ion beam. The electron beam can also be used for forming surface images, but the electron beam is typically oriented at an angle to the surface and so the image will be skewed unless corrected in software. Characterization also includes processing the image to determine the default outline and center. In one embodiment, the outline of the defect is characterized as a step in characterizing the defect and determining how to cross section the defect. In some embodiments, the outline can be simplified by inflating it to remove edge effects and edge shapes that would overly complicate subsequent calculations. Alternatively, the defect could simply be bounded by a box to determine an outline. In other embodiments, the actual defect outline can be used. The outline data is used to provide information including the size, location, shape, orientation, aspect ratio, etc. of the defect.

Defects can be sorted based on the outline. For example, a feature having an aspect ratio greater than a specified value, for example, 20:1, is unlikely to be a defect, so a user can program the system to not process those features further. Because the system characterizes the defect for automated processing by the ion beam, more detailed characterization is required that would be required to merely identify the type of defect.

After the outline of the defect is characterized, the center of the defect is located. The center can be located, for example, using a center of mass calculation over the defect outline, a nodal method as shown in the attached figures, or simply the center of a bounding rectangle. Image contrast can be used a weighing factor in determining the center of mass, that is, areas that deviate more in darkness or lightness from the background can be weighted more heavily in determining the center of the defect. After the outline and center are determined, the defect can be classified and further processing, such as whether to mill a cross section and the cross-sectioning strategy can be determined.

The present invention uses the automatic defect characterization to provide instructions to a focused ion beam for further processing. For example, a cross section may be cut through the calculated center of the defect and extend to the edges of the outline or past the edge of the outline by a prescribed amount. The cross-section may be cut, for example, along the x axis, the y axis, or at a prescribed angle. If the outline defect indicates that the defect is large, for example, longer than one micron, a relatively large beam current, such as 5 nA to 10 nA, is used for the creating the cross section and then a smaller beam current, such as 1 nA is used for a fine cut to smooth the cross section surface before viewing. On the other hand, if the defect outline indicates that the defect is small, such as a defective via, a smaller beam current, such as 350 pA is used, with a correspondingly smaller current used for a polishing cut. A skilled person will readily be able to determine an appropriate beam current for defects of various sizes.

The cross-sectioning strategy can be to cut a single cross section or to cut a series of cross sections, with a scanning electron microscope image formed after each cross section, thereby providing three-dimensional data as a series of slices of the defect. For example, 100 cross sections and images can be taken through a defective area to characterize the defect. Multiple cross sections are also useful, for example, when voltage contrast imaging shows that a defect exists along a conductor, but the location of the defect in unclear. Multiple cross sections can uncover and locate the defect. Each slice can include not only an image but also other information, such as an EDS analysis of the exposed section.

Figure 22:
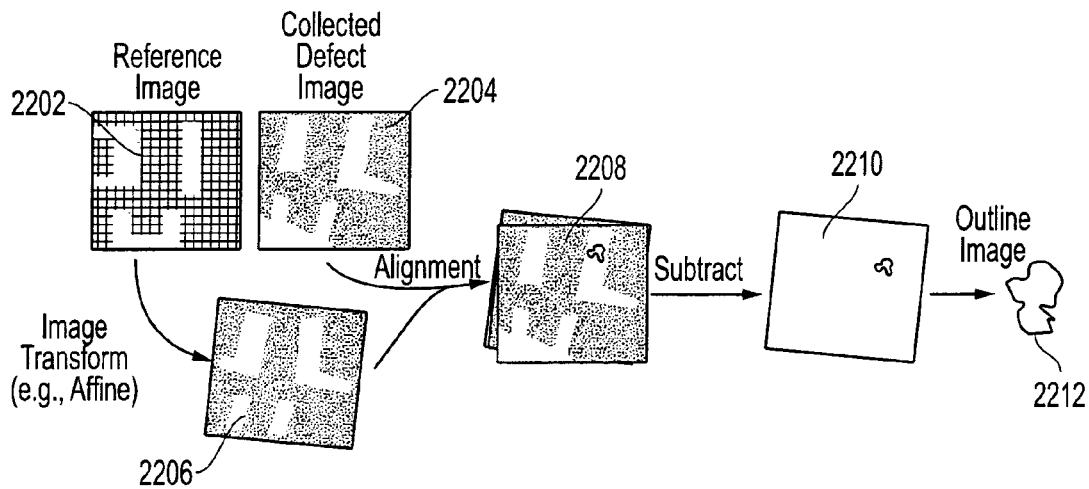
FIG. 22 is a graphical flow diagram showing one embodiment of an automatic defect identification process.
Figure 23A:
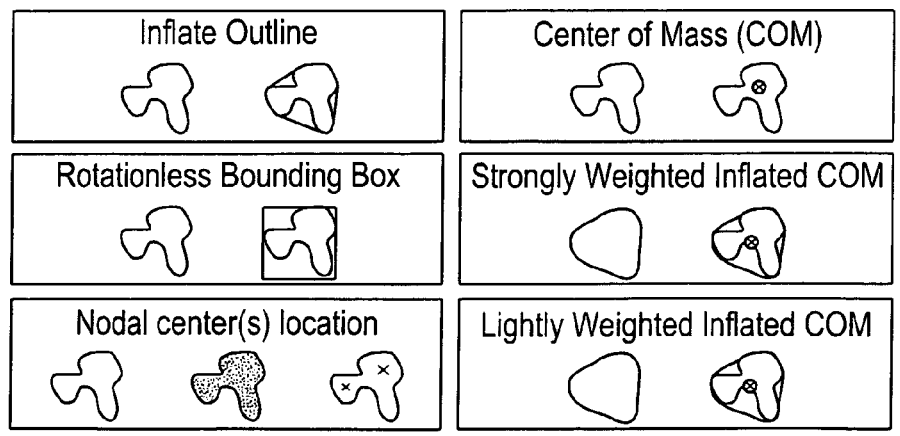
FIG. 23A illustrates different outline refinement methods.
Figure 23B:
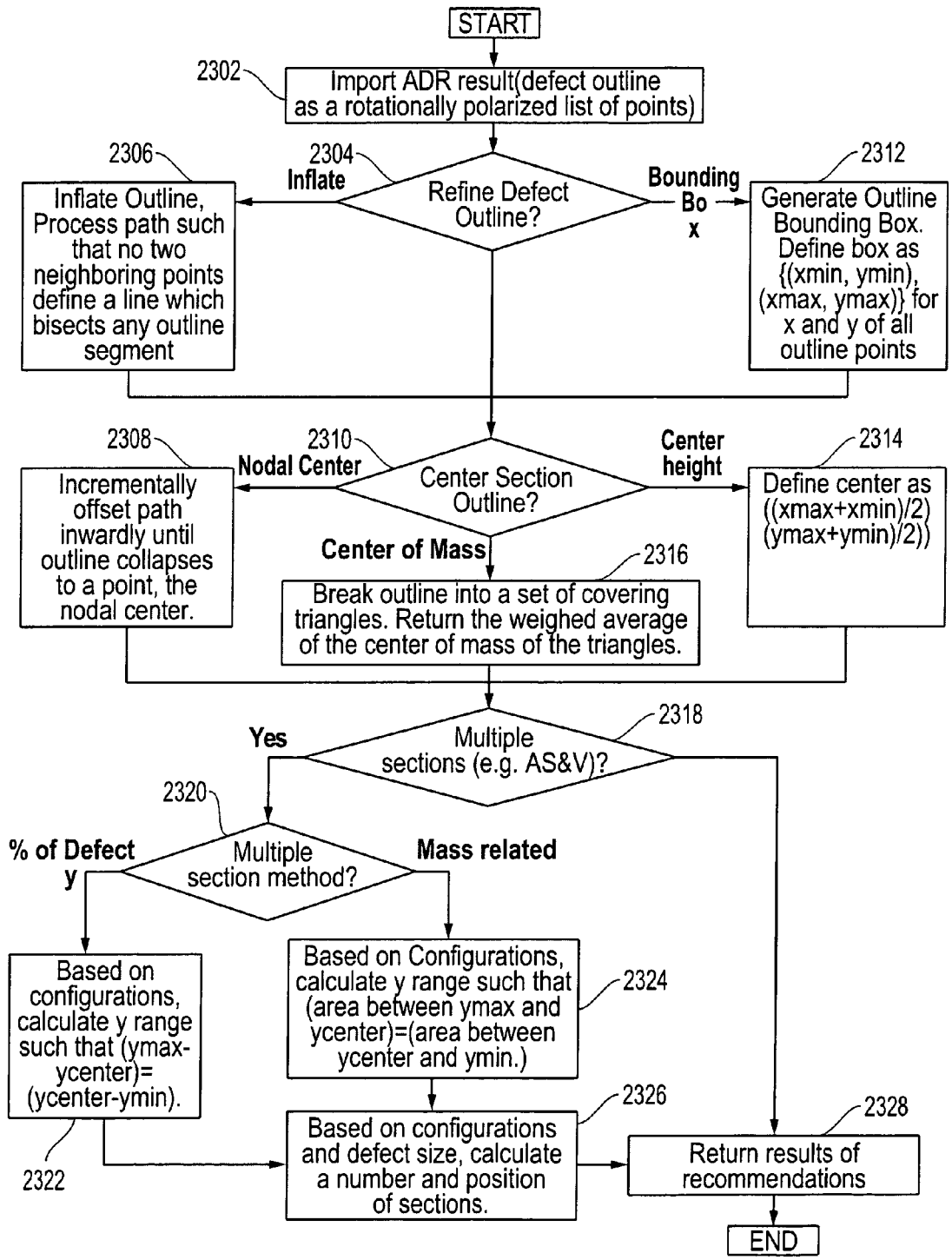
FIG. 23B is a flow diagram of one embodiment of a routine for refining an identified defect.

With reference to FIGS. 22, 23A, and 23B, an exemplary defect image identification scheme will now be described. FIG. 22 is a process diagram showing how a defect may be identified (and/or isolated) from a collected defect image and a reference image. With this scheme, a reference image is compared with (subtracted from) the collected defect image. Initially, however, the collected reference image 2202 may be transformed ("cleaned up") using a suitable transformation such as an affine transformation into a transformed reference image 2206. Before being compared with one another, the images may be aligned, if necessary, as shown at 2208. The reference image 2206 is then subtracted from the collected defect image 2204. The remaining difference image, which includes the defect, is shown at 2210. From here, an outline image 2212 may be generated and/or refined using suitable image processing techniques.

FIG. 23A illustrates different outline refinement methods. The inflate outline technique involves minimizing edge effects and improper outlines. The bounding box method is typically the fastest, simplest method. A complex defect outline can also be maintained, with no outline refinement methods applied.

FIG. 23B shows a routine for refining the identified defect image and/or recommending an image cross-section to be taken. This feature uses the shape and size of a defect to recommend the placement of single or multiple cross sections. It may be used as an optional advisor to a user, e.g., when performing two-pass, ADR assisted, defect review (discussed later) and as an intelligent agent in an automated tool. The software for implementing subsequent image processing tasks may be part of the ADR tool or it may be provided elsewhere within the defect analyzer system. Initially, at 2302, the routine retrieves the identified defect data as obtained by the ADR tool. This data may define the defect outline as a rotationally polarized list of data points. At 2304, it determines whether or not the defect outline is to be refined and if so, what type of refinement. In the depicted embodiment, if an "inflate" method is selected, the system performs an inflate outlining algorithm at step 2306 and moves to decision step 2310 to determine what type of section centering operation is to be performed. Alternatively, if a different method such as a "bounding box" method is selected, the system performs this method at step 2312 and then proceeds to step 2310 to determine the section centering operation to be performed. If no outline refinement is to take place, the routine proceeds directly to step 2310 to determine the section centering operation that is to occur. In the depicted embodiment, either a nodal center, center of mass, or center height centering method may be used. From here, the system performs the selected method (nodal 2308, center of mass 2316, center height 2314) and proceeds to decision step 2318 and determines whether multiple sections are to be taken. If they are to be taken, the routine proceeds to decision step 2320 to determine what type of method is to be used. In the depicted embodiment, it performs either a percent-of-defect operation at 2322 and 2326 or a mass-related operation at 2324 and 2326. Finally, after this is done or if multiple sections are no to be taken, the routine proceeds to step 2328 where it returns the results of the defect image processing to a designated destination, e.g., user, updated defect file, defect analyzer component.

c) Additional ADR Resources:

A standard set of test structures can be milled onto a wafer to test the relocation accuracy of the ADR implementation. As the ADR component is revised, this wafer can be automatically rerun to provide a baseline measure of relocation accuracy. In addition, an image library may also be established. To provide a resource for testing, users can create a library of representative and worst-case images.

i) ADR Validation

While different use cases generally relating to a defect analysis system are discussed below, an ADR validation use case will now be described as a feature of ADR. One interesting use of the defect explorer is for performing automatic defect relocation ("ADR") validation. (ADR is discussed below.) ADR validation generally involves performing an automatic defect relocation operation, reviewing the results using the defect explorer, and appropriately adjusting the ADR function. This may then be followed by altering the defect data and assigning a milling recipe.

In one particular embodiment, a process for implementing ADR validation is performed with the following general tasks: (1) defect site processing using ADR, (2) site tagging, and (3) tagged site processing and data review.

With the initial step of defect site processing using ADR, wafers are initially delivered to the DA, either by hand or through factory automation. A wafer is then loaded and its designated sites are processed. Such processing typically involves (1) navigating to a defect, (2) re-detecting the defect via ADR, (3) acquiring a top-down image, (4) reporting important process events, and (5) navigating to the next site t repeat these steps until all of the sites are processed. The wafer is then typically unloaded.

The next task of site tagging may be performed either online or off-line and is done to tag defect sites to be validated. Initially, using the defect explorer, sites are tagged for cross sectioning, auto slice and view, or other processing. From here, the defect outline may optionally be resized and relocated using methods discussed below.

Finally, the tagged sites are processed, and the data is reviewed. To do this, the wafer is loaded, and the system navigates to a tagged site. The defect is re-located, and a Cross-Section (XS) or Auto Slice and View (AS&V) function are run. Image data is then acquired and important process events are reported (e.g., to the facility host). These steps are then repeated on the other tagged sites until all of the tagged sites have been so processed, and the wafer is unloaded. Finally, either online or offline, the data is reviewed in defect explorer and exported, e.g., to the Yield Manager (YM).

The ADR validation use case has several advantages. It allows for the operator to perform Automatic Defect Relocation on numerous defects without the necessity to process them. By providing an on- or off-line validation step, only defects that are known to be of interest need be processed. It also minimizes damage to wafers. Since only defects of interest are processed, unnecessary milling is avoided. It also maximizes system efficiency. Again, since only the defects of interest are processed, the system process time is optimized. This increases the amount of useful data and maximizes the value of the operator's time.

ii) Exemplary ADR Image Parameters

In one embodiment, the following specifications were used for ADR software components. The minimum size of detectable defects is 9 pixels (3×3). (Note that in a 30 mm field of view, this corresponds to an ~100 nm defect.) The maximum size of a detectable defect is nominally <35% of field of view area. With regard to reliability, it should be better than 80% success rate for e-beam visible defects. The outlining accuracy should be such that no less than 80% of the defect pixels are outlined, and no more than 20% of the outlined pixels are not defect pixels. The processing time should be less than 5 seconds, and the system should be able to identify a defect sitting against a featureless background. (The system can be used for bare wafers as well as for wafers having structures fabricated thereon.) In addition, the software should be able to return the complex (vector or equivalent representation) defect outline. The option to return center of mass, bounding box, and rotational orientation would also be available. The software would also be able to report a confidence level for outlined defects. This should provide a qualitative measure of the contrast differences between the defect pixels and the corresponding pixels in the reference image. For example, the software could return outline and confidence data of all located defects at least 9 pixels large. Moreover, a limited search region may be definable. For example it may be advantageous to not search for any defect with 25 pixels of the edge of the defect image. Rotation of the structures at arbitrary angles should also be supported. For these images, the field of view could be at least three times the major axis of the array's unit cell.

7. Training Module

In one embodiment, before the ADR may be used for locating defects on actual defective wafers, a number of wafer specific calibrations generally need to be trained when a new product is introduced into the system. The training module allows the user to teach the system how to align the wafer, that is, how to drive to an alignment point, grab an image, and recognize and find the origin of a pattern. The training module also determines the stage height (from the voltage output of the capacitive probe) at which the two beams coincide (the eucentric point), and calibrates a voltage versus height curve so that the voltage output of the capacitive sensor can be used to adjust for changes in the distance between the top surface of the work piece and the ion or electron column.

Calibrations performed by the training module can include calibrating the electron and ion beam images of the die origin at zero degrees and tilt, the alignment matrix at zero degrees and tilt, and the capacitive probe set point at zero degrees and tilt. A training module preferably allows for individual product specific calibration parameters to be trained and retrained as needed without a complete retraining of the entire product (for example, the Cap Probe set point can be calibrated without having to retrain the alignment matrix).

In typical systems, the training occurs automatically at run-time but can require mandatory set-up of all calibrations. This is straightforward for the user, but it locks a user into a complete training of a product whenever any parameter needs to be trained or retrained. Thus, in one embodiment, an interface is provided that allows the user to train or re-train individual calibration parameters at any time prior to the start of a job. This allows the database to directly associate the calibration parameters with the product type, allows a single calibration parameter to be retrained without a complete retraining, allows complex or difficult to acquire parameters to be trained as needed, and establishes a general model through which other calibration parameters could be added as the need arises. In concert with recipe and product validation, a set-up wizard can also be used to guide users through training of multiple parameters.

Figure 24:
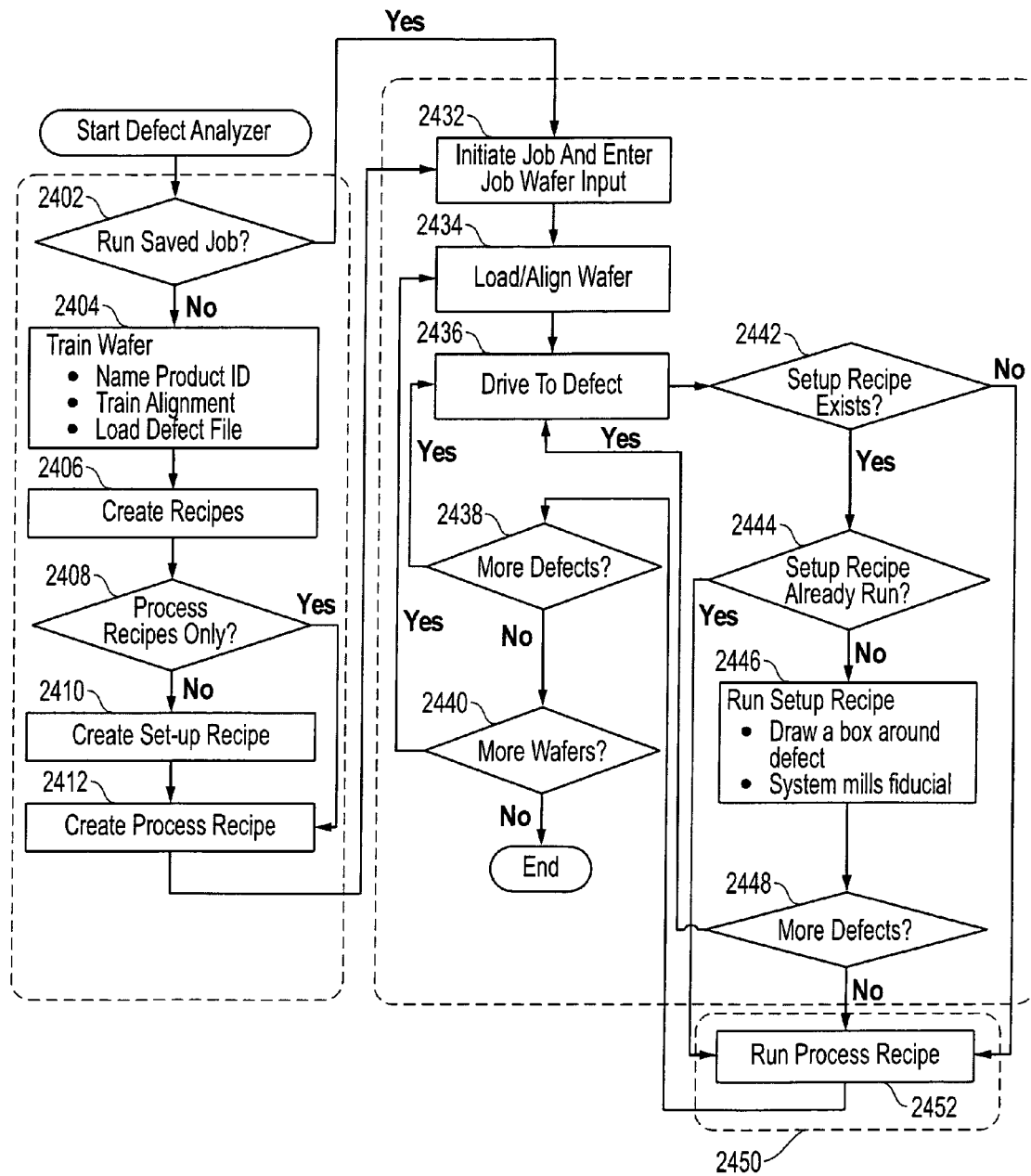
FIG. 24 shows one embodiment of a defect analysis process.

The training module runs small, simple training components—analogues of the defect analyzer. Tools may be created to guide a user through the calibration. By way of example, a Cap Probe calibration tool might simply throw a dialogue that tells the user to find the coincident height and click 'OK'. Perhaps a button could move the stage to the cap probe height in order to test the calibration, but there should not be any dependencies on other calibrations for success. FIG. 24 shows a simple interface, which provides a method to launch and store each calibration routine.

An advantage of this approach is that a "Wizard" could be easily generated to simply string the individual components together. Such a training sequence could, in turn, be easily generated by a validation step or as a default new product training. These individual components could also be accessed by daily calibration jobs that may require or recommend certain training for new or out-of-date product parameters.

C. Defect Analysis Process

FIG. 24 shows one embodiment of a defect analysis process. The workflow methodology includes three basic phases including a job set-up phase 2400, a site set-up phase 2430, and a site process phase 2450. In the job setup phase, a user defines parameters (such as specifying a defect file) and creates recipes required for performing a desired job. In the site setup phase 2430, a wafer is loaded and aligned, then defects are identified and marked with a fiducial so the defect analyzer system can automatically locate the defect in the site process phase and align the beams. In the site process phase 2450, the system generally drives to each defect in a job and runs the process recipe. This phase, as with parts or all of the other phases in certain embodiments, is automated.

This workflow is modular and can be broken into its separate phases, which can be run at separate times and by different users. For example, one user could define job parameters in the job setup phase 2400, and a different user in a different location could mark the defects in the site setup phase 2430. In the site process phase 2450, the system could be set to operate unattended, perhaps overnight.

With reference to FIG. 24, the depicted job set-up phase 2400 will now be discussed. At decision step 2402, the system determines whether a pre-existing, saved job is to be run. (This may be based on input from a user or on system parameters.) If a pre-existing job is to be run, the system proceeds to the site set-up phase 2430 at step 2432. If a new job is to be created, however, the system proceeds to step 2404 and initially trains a wafer. In the depicted embodiment, this involves naming a product identifier, training alignment, and loading (selecting) a defect file. At step 2406, a recipe is created. This is normally done interactively by a user through the job/recipe builder interface. At decision step 2408, the system determines whether only the recipe is to be run or whether a set-up recipe is to also be run. If a set-up recipe is to also be run, the system proceeds to step 2410 and creates a set-up recipe. For example, it may invoke a user to interactively create a set-up recipe. From here the system proceeds to step 2412 to create a job recipe (or process). If at decision step 2408 it was determined that no set-up recipe is to be processed, then the system directly proceeds to step 2412 to create a job process. From here, the system proceeds to step 2432 and initiates the site set-up process.

At step 2432, the system initiates a job and enters a job wafer input. As step 2434, a wafer is loaded and aligned. At step 2436, the system drives (or navigates) to a defect. [What exactly is happening when the system "drives" or "navigates" to a defect site?]

From here, the system proceeds to step 2442 and determines if a set-up recipe exists. If so, it proceeds to step 244 and determines if the set-up recipe has already been run. If, however, no set-up recipe exists, the routine proceeds directly to the site process section 2450 and runs the recipe (process) at step 2452.

Returning back to step 2444, if the set-up recipe has not already been run, then the system runs the set-up recipe at step 2446. In this set-up process execution step, a user typically identifies the defect and marks it with an appropriate fiducial. If however, it is determined that the set-up process has already been run, then again, the routine would proceed to the site process section 2450, and the system would run the recipe. Returning to step 2446, after the set-up recipe is executed (defect is appropriately marked), the routine proceeds to decision step 2448 to determine if additional defects exist to be marked. If so, then the routine returns to step 2436 and drives to the next defect. From here, it proceeds as previously described. On the other hand, if there are no additional defects to mark at decision step 2448, then the routine proceeds to the site processing section 2450 and runs the recipe at step 2452.

After step 2452 has been executed, i.e., a recipe is run, the routine proceeds to decision step 2438 to determine if there are additional defects to be processed. If not, it proceeds to decision step 2440 to determine if there are additional wafers to be processed. If not, then the routine ends. On the other hand, if there are additional defects, then the routine loops back to step 2434 to load and align the next wafer to be processed and proceeds as previously described. Returning back to decision step 2438, if there are additional defects in the loaded wafer, then the routine loops back to step 2436 to drive to the next defect.

In the depicted embodiment, the site processing section comprises the single step of running the job recipe. Reference may be made to the sequencer section for additional information regarding how the job recipe may be run.

1. Exemplary Use Cases

The defect analysis systems of the present invention can be used in various ways that incorporate parts or all of the process just described. While there are numerous ways to use the system, three exemplary use cases will be presented. (A use case is simply a way in which all or combination of parts of a defect analysis system may be used. For example, the ADR validation process described above is a use case.) The three basic use cases to be discussed herein are review, analysis, and review/analysis.

Figure 25:
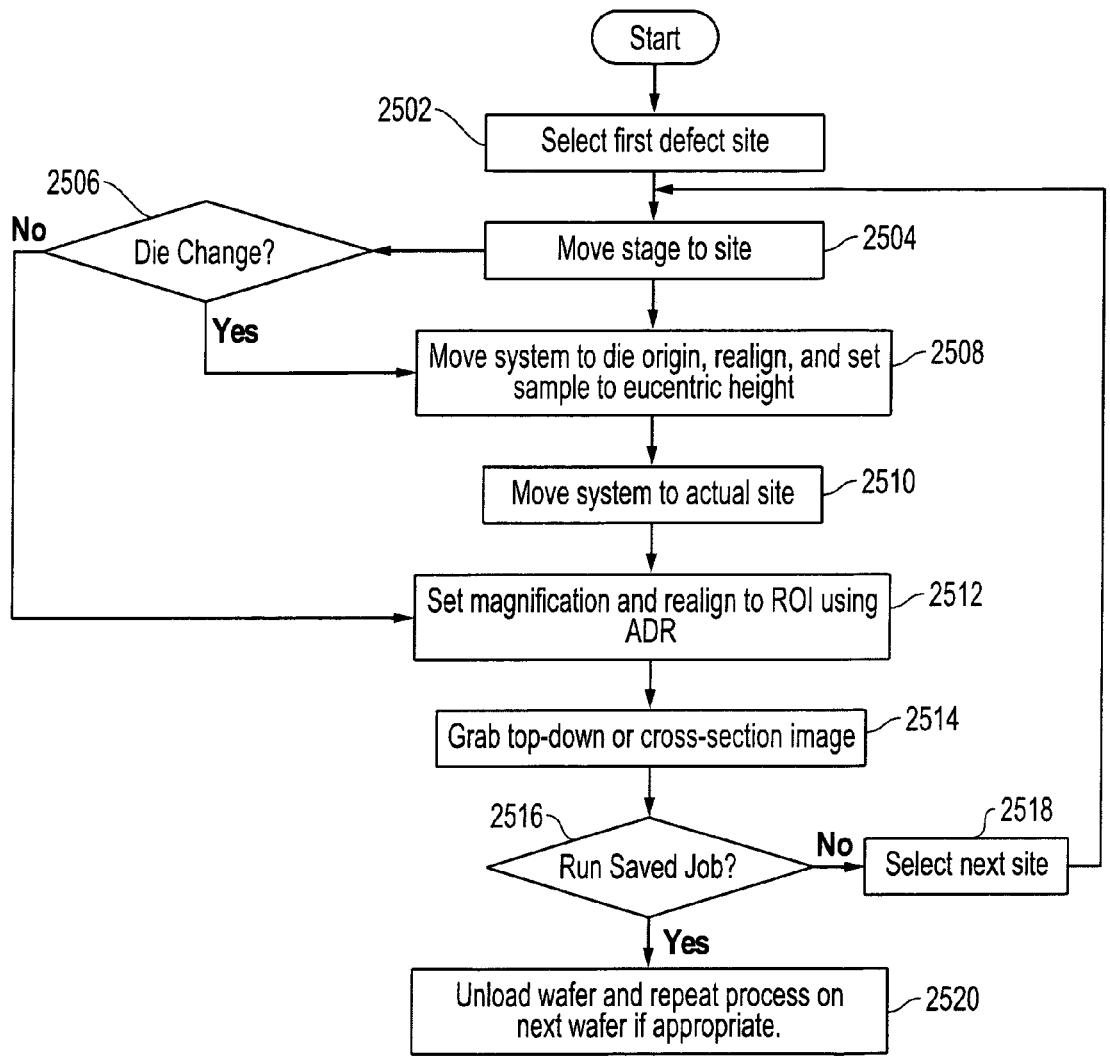
FIG. 25 shows a routine for an exemplary defect review use case.

With reference to FIG. 25, a "review" use case routine is depicted. Initially, at step 2502, the system selects the first defect site on the first wafer. At step 2504, the system moves the stage to this defect site. From here, it proceeds to decision step 2506 to determine if a die change occurred. If so, then the system proceeds to step 2508 and moves the system to the die origin, realigns, and sets a sample to the eucentric height. From here, it moves the system to the actual site at step 2510. It then proceeds to step 2512 to set magnification and realign to the region of interest ("ROI") using the ADR tool. Alternatively, if there is no die change at step 2506, then the system proceeds directly to step 2512 to so set magnification and realignment. From here, the system grabs a top-down or cross-section image at step 2514. Next, it determines if the final site has been reviewed at step 2516. If not, then it selects the next site at step 2518 and loops back to step 2504 and proceeds as previously described. Otherwise, the system proceeds to step 2520 and unloads the wafer and repeats the process on the next wafer if appropriate.

With this use case, the defect analyzer system uses one pass. Defect review is an automated process. It uses the electron beam to grab either a top-down or cross-section image. The ion beam is not used. Therefore, the system does not drive the stage to each defect site twice. The user is only needed to start the process.

Figure 26A:
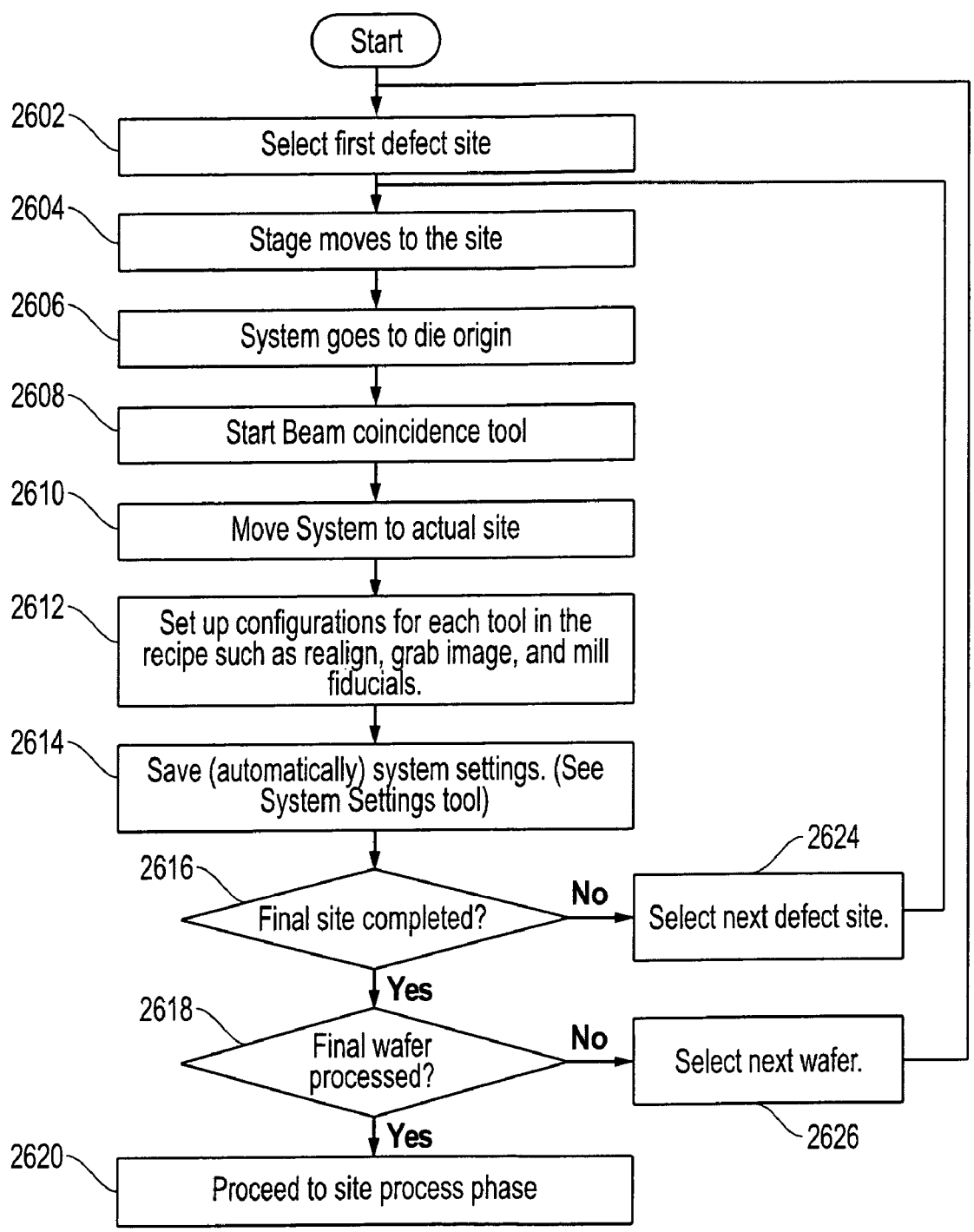
FIGS. 26A and 26B show a routine for an exemplary defect analysis use case.
Figure 26B:
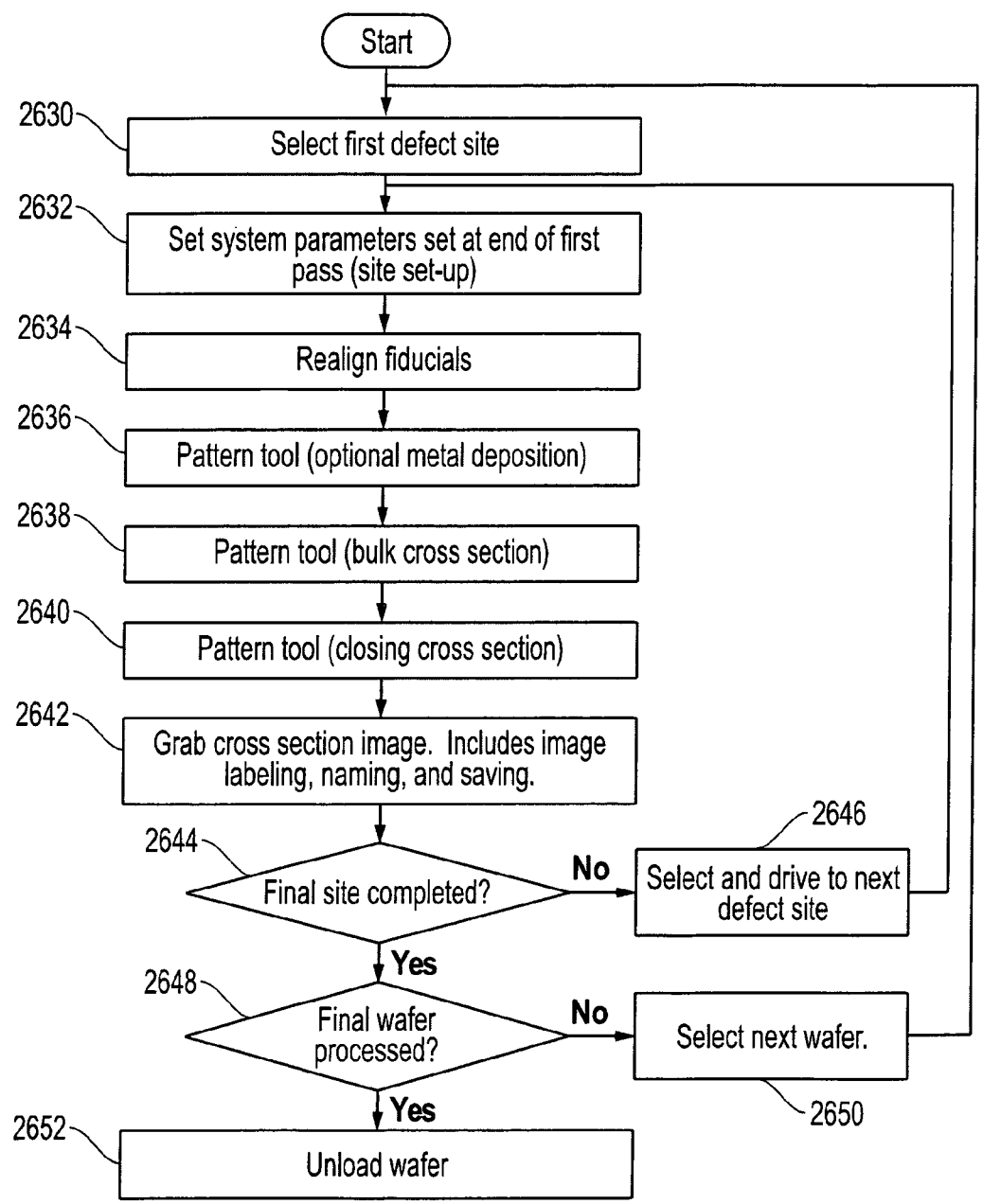

FIGS. 26A and 26B show an exemplary use case routine for analyzing defects. The process comprises the basic steps of: (1) building a job with recipe(s), (2) associating recipes with defects and running a job (e.g., with a sequencer), and (3) use the defect explorer to revisit and analyze defect sites. Site inspection can vary from site to site. Data review and tagging of sites can also be done either online or offline. For this use case, the defect analyzer has two passes: site setup and site process. A two-pass, site-inspection process allows the defect analyzer to explore defects without a user. After alignment, the first pass (site setup) starts. The second pass is a fully automated process. The user can see the process happening onscreen and also see milling on the real-time monitor.

With reference to FIG. 26A, initially at step 2602, the system selects a first defect site. At 2604, the stage is next moved to the site. The system next navigates the site origin at step 2606. At step 2608, the beam coincidence tool is initiated. Next, at step 2610, the system tool moves the system to the actual site. Next, at step 2612, the tools that are to be run in the recipe are configured. These tools may include realign, grab image, and fiducial milling tools. Next, at 2614, the system settings are saved with the system settings tools. At decision step 2616, the system determines if there is an additional site defect to setup. If so, then it proceeds to step 2624 to select the next defect site and then loops back to step 2604 and proceeds as previously described. Alternatively, if there is not an additional site left, then the routine proceeds to decision step 2618 to see if there is another wafer to process. If so, if proceeds to step 2626 to select the next wafer and loops back to step 2602 to select the first site in the new wafer. From here, the routine proceeds as previously described. If the final wafer has been processed, then the routine would go to step 2620 and proceed to the next pass (site processing).

With reference to FIG. 26B, the second pass (site processing) will now be discussed. At 2630, the first defect site is selected. Next, at step 2632, the system parameters are set as they were at the end of the first pass. At step 2634, realignment is performed based on the fiducials. Next, from steps 2636 to 2640, the pattern tool is used for metal depositioning, bulk cross sectioning, and/or fine cross sectioning. At 2642, the cross-section image(s) are grabbed. this may include image labeling, naming, and saving. At decision step 2644, the system determines if there is another site to be reviewed. If so, then the routine selects and drives t the next defect site at step 2646 and loops back to step 2632 to proceed as previously described. On the other hand, if the defect site is the last site on the wafer to be reviewed, the routine proceeds to decision step 2648 to determine if there is another wafer to be analyzed. If so, the system selects the next wafer at step 2650 and loops back to step 2630 to select the first site on the new wafer. From here, the routine proceeds as previously described. If the wafer was the last wafer at step 2648, then the wafer is unloaded, and the analysis process terminates.

Figure 27:
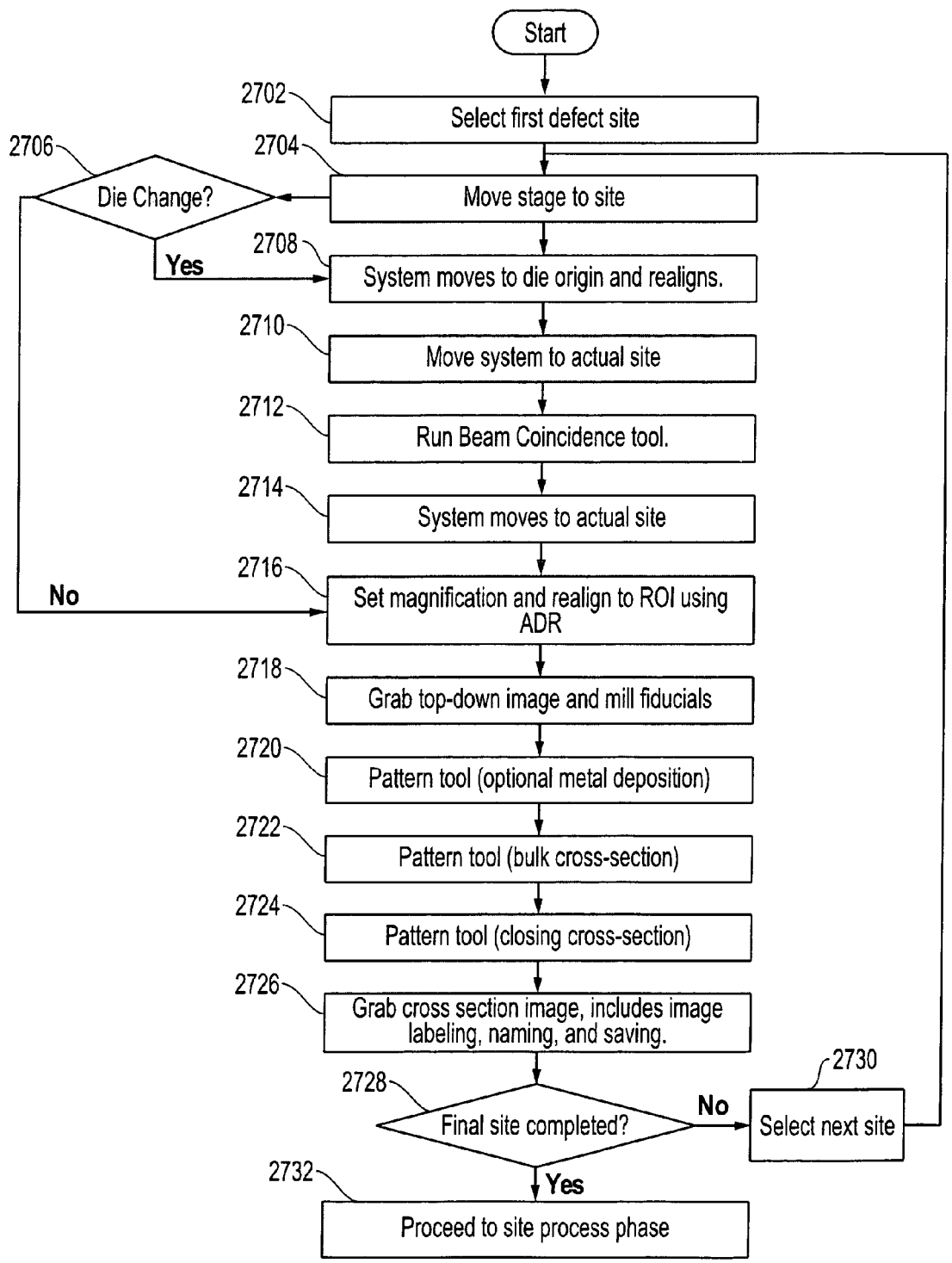
FIG. 27 shows a routine for an exemplary defect review and analysis use case.

FIG. 27 shows a flow diagram of an exemplary review and analysis use case. At step 2702, the system selects the first defect site. Next, at 2704, the stage is moved to the site's die. From here, the system proceeds to decision step 2706 to determine if there is a die change. If so, then the system moves to 2708 and realigns to die origin. From here, the system proceeds to step 2710 and moves to the actual defect site. From here, it goes to step 2712 and runs the beam coincidence tool. Next, at 2714, the system moves to the actual site. Next, it sets magnification and realign parameters to ROI using the ADR tool. Alternatively, at decision step 2706, it is determined that there is not sufficient die change, then the system proceeds directly to step 2716 and sets magnification and realignment parameters to ROI using the ADR tool. From here, the system proceeds to step 2718 and grabs a top down image and mills fiducials. Next, in steps 2720 through 2724, the system runs the pattern tool. The patterning tool may perform metal depositioning, bulk cross sectioning, and/or closing cross sectioning. Next, at step 2726, the system grabs the cross-section image. This includes image labeling, naming, and saving. At decision step 2728, it checks to see if there are additional defect sites to review/analyze. If so, it selects the next site at step 2730 and loops back to step 2704 and proceeds as previously discussed. Conversely, if there is not another site left in the present wafer, the system loads and processes the next wafer, if appropriate.

For this use case, the defect analyzer system has one pass. This single pass process allows the defect analyzer to explore defects without a user. The user can see the process happening onscreen and also see the milling on the real-time monitor.

D. Remarks

Embodiments of the defect analyzer system can provide both defect review and 3-D analysis capability. It can be a fully automated, defect analysis tool that can also be used in a semi-automated fashion for manual measurements. X-ray analysis may be a capability of a defect analysis tool. It can deliver high quality defect classification data for the sub-0.13 μm processes market including copper dual damascene, chemical mechanical polishing, and high aspect ratio structures.

The use of defect identifying fiducials provides several advantages over conventional fiducial references. For example, they provide the ability to readily located the defect with both beams for milling and imaging while minimizing damage to the defect. By combining both an ion beam and an electron beam in a single defect characterization tool, applicants can provide more information about the defect than prior art systems. For example, the image from the two beams may look different, which can provide information about the mass of the atoms in the work piece and indicate further analysis is desirable. Using the beam that is oriented approximately perpendicular to the surface can provide more accurate size information than the information from the beam that is tilted. The more accurate information is used to control the subsequent processing, such as cross sectioning.

For example, if the top down image shows a buried feature, a cross section can be milled and imaged. If the top down view shows a long defect, it can be milled at multiple points. The defect characterization can be used to determine settings for the charged particle beam columns. For example, if a large defect is detected, a large aperture can be used in the column to produce a high current. Changes in current typically necessitate realigning the beam. Such realignment can be performed easily on the fiducial. In the prior art, defect characterization was not used to control subsequent processing, so the level of detail required was much less.

The ion beam and the electron beam are preferably accurately aligned, that is, that they are imaging the same point. In the prior art, the beams were typically aligned by observing images of the defect from both beams and repositioning one beam until the images aligned. This method of aligning is undesirable because when the beams, particularly the ion beam, impinge on the defect, the defect is damaged. On the other hand, with embodiments of the invention, the beams can be physically aligned, that is, both beams impacting on the same point on the work piece without moving the work piece, or "computationally aligned," that is, the impact points of the beams differ by a known amount, and the work piece is moved by the known amount when the other beam is used. This technique allows the beam columns to be positioned closer to the work piece, which improves the beam resolution.

In a preferred embodiment, the alignment procedure begins by moving the stage so that the nearest die origin is under both beams. The die origin is typically marked with a reference mark. The nearest die origin may be on a different die than the one the defect is on. Because the electron beam axis is tilted with respect to the ion beam axis, the offset between the ion beam image and the electron beam image can be eliminated by changing the height of the stage. The stage is raised or lowered until the images are coincident. After the stage height is adjusted to make the beams coincident, the stage is moved so that the defect is in the scan pattern of the beams. Optionally, the beam coincidence can be further adjusted by observing the fiducial and making a fine height adjustment of the stage based on the offsets of the images of the fiducials. Because wafers can be warped and the height of the top surface from the beam columns can vary, a capacitive sensor can be used to maintain a constant height of the top surface of the wafer relative to the beam column as the stage is moved.

The invention has broad applicability and can provide many benefits as described and shown in the examples above. The embodiments will vary greatly depending upon the specific application, and not every embodiment will provide all of the benefits and meet all of the objectives that are achievable by the invention. For example, in one of the embodiments described, the electron beam and ion beam are aimed at the same point on the work piece. In other embodiments, the beams are aimed at different points, and the work piece is translated to the appropriate point to be under the desired beam.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of characterizing semiconductor wafer defects comprising:
   (a) inspecting a semiconductor wafer to locate defects;
   (b) storing locations corresponding to the located defects in a defect file;
   (c) automatically navigating a charged-particle beam to the area near a first defect using information from the defect file;

(d) automatically imaging the first defect area and identifying the defect;

(e) characterizing the defect using the charged particle beam imaging;

(f) automatically navigating the charged-particle beam to the area near a next defect using information from the defect file and then automatically imaging the next defect area and identifying the defect and characterizing the next defect using the charged particle beam imaging;

(g) repeating the process of automatically navigating to, imaging, and characterizing for all desired located defects;

(h) determining a recipe for further analysis of at least one defect; and (i) automatically executing the recipe to further characterize the defect.

2. The system of claim 1, wherein said recipe includes exposing one or more buried surfaces in the wafer and taking an image at the exposed surface.

3. The system of claim 1, wherein the recipe includes performing a chemical analysis at the exposed surface.

4. The system of claim 1, in which the defects are initially found by an inspection system that creates a defect file, the defect file being used to locate the defects using a high resolution imaging system also used to characterize the located defect to determine the analysis process, the analysis process being automatically carried out by the system.

5. The system of claim 4, in which the high resolution imaging system includes at least one of an ion beam imaging system, scanning electron microscope, and an optical microscope.

6. The system of claim 1, in which the recipe includes cutting multiple cross sectional portions of the wafer and examining said portions with an EDS analysis to provide three-dimension elemental information.

7. The system of claim 1 in which said recipe comprises exposing one or more cross sections of the defect and imaging the exposed cross section.

8. The system of claim 1 in which said recipe comprises taking physical measurements of the defect.

9. The system of claim 1 in which said recipe comprises performing chemical analysis on the defect.

10. The method of claim 1 further comprising:

after all desired located defects have been identified and characterized, re-locating the previously located first defect; and performing steps (h) and (i) on the re-located first defect.

11. The method of claim 10 further comprising:

after performing steps (h) and (i) on the re-located first defect, re-locating the next previously located defect;

performing steps (h) and (i) on the next re-located defect; and repeating the process of re-locating additional previously located defects and performing steps (h) and (i) for all desired located defects.

12. The method of claim 1 further comprising cutting a fiducial in the wafer surface near the defect.

13. The method of claim 12 in which executing a recipe includes locating the fiducial and locating the defect by its known displacement from the fiducial.

14. A system for analyzing a defect in an object, comprising:

components for locating and characterizing defects in the object; for automatically navigating a charged-particle beam to the area near a defect; for automatically imaging the defect area, identifying the defect, and characterizing the defect; for repeating the process of automatically navigating to, imaging, and characterizing for all desired located defects; for determining an appropriate additional analysis to be performed for a defect; for relocating a previously located defect after all desired defects on in the object have been located and characterized; and for automatically performing the determined analysis process on the defect.

15. The system of claim 14 in which said analysis process comprises exposing one or more cross sections of the defect and imaging the exposed cross section.

16. The system of claim 14 in which said analysis process comprises taking physical measurements of the defect.

17. The system of claim 14 in which said analysis process comprises performing chemical analysis on the defect.

18. The system of claim 14 in which said analysis process comprises exposing one or more buried surfaces in the object and taking an image at the exposed surface.

* * * * *